United States Patent [19]
Kimura

[11] Patent Number: 6,127,734
[45] Date of Patent: *Oct. 3, 2000

[54] SEMICONDUCTOR DEVICE COMPRISING A CONTACT HOLE OF VARYING WIDTH THRU MULTIPLE INSULATING LAYERS

[75] Inventor: Hiroshi Kimura, Hyogo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/607,034

[22] Filed: Feb. 26, 1996

[30] Foreign Application Priority Data

Aug. 25, 1995 [JP] Japan ..................... 7-217286

[51] Int. Cl.[7] .......................... H01L 21/31; H01L 21/469
[52] U.S. Cl. .......................... 257/774; 257/306; 257/750; 257/775; 438/638; 438/639
[58] Field of Search .......................... 257/306, 750, 257/774–6; 438/638, 639

[56] References Cited

U.S. PATENT DOCUMENTS

| | | | |
|---|---|---|---|
| 5,243,220 | 9/1993 | Shibata et al. ........................ | 257/748 |
| 5,246,882 | 9/1993 | Hartmann . | |
| 5,330,934 | 7/1994 | Shibata et al. . | |
| 5,332,924 | 7/1994 | Kobayashi ........................ | 257/760 |
| 5,578,524 | 11/1996 | Fukase et al. ........................ | 438/639 |
| 5,578,849 | 11/1996 | Tadaki et al. ........................ | 257/298 |
| 5,635,423 | 6/1997 | Huang et al. ........................ | 438/638 |
| 5,685,951 | 11/1997 | Torek et al. ........................ | 156/646.1 |
| 5,719,414 | 2/1998 | Sato et al. ........................ | 257/186 |

FOREIGN PATENT DOCUMENTS

| | | |
|---|---|---|
| 4-216665 | 8/1992 | Japan . |
| 5-75060 | 3/1993 | Japan . |
| 5-343636 | 12/1993 | Japan . |
| 6-53412 | 2/1994 | Japan . |
| 6-85070 | 3/1994 | Japan . |
| 6-120447 | 4/1994 | Japan . |
| 6-120451 | 4/1994 | Japan . |
| 6-260442 | 9/1994 | Japan . |

OTHER PUBLICATIONS

Wolf, S., et al., "Silicon Processing for the VLSI Era: vol. 1—Process Technology", p. 522, Jan. 1986.

Wolf et al., Silicon Processing for the VLSI Era, vol. 1: Processing Technology, p. 192, Jan. 1986.

"Proceedings of Institute of Applied Physics Conference", Spring, 1994, 29p–Zf–2.

"Semiconductor World", 1993, 10, pp. 68–75.

*Primary Examiner*—Olik Chaudhuri
*Assistant Examiner*—Howard Weiss
*Attorney, Agent, or Firm*—McDermott, Will & Emery

[57] ABSTRACT

An opening having a diameter smaller than a minimum possible dimension formable by photolithography is formed in an insulating layer on an interlayer insulating layer covering an MOS transistor. An insulating layer is formed to cover inner wall surface of the opening. Contact hole is formed from insulating layer to reach the semiconductor substrate. Contact hole has a first opening diameter smaller than the minimum possible dimension formable by photolithography at the portion of interlayer insulating layer and insulating layer, and hence a second opening diameter larger than the first opening diameter at a portion of the insulating layer. Thus, a semiconductor device suitable for higher degree of integration and a method of manufacturing the semiconductor device with small number of steps can be provided.

9 Claims, 44 Drawing Sheets

SEMICONDUCTOR DEVICE COMPRISING A CONTACT HOLE OF VARYING WIDTH THRU MULTIPLE INSULATING LAYERS

BACKGROUND OF THE INVENTION

1. Field of the Invention

The present invention relates to a semiconductor device and manufacturing method thereof. More particularly, the present invention relates to a semiconductor device having a contact hole and to a manufacturing method thereof.

2. Description of the Background Art

A conventional semiconductor device having a contact hole and manufacturing method thereof will be described.

FIG. 51 is a schematic cross section showing a structure of a semiconductor device in accordance with a first prior art example. Referring to FIG. 51, an MOS (Metal Oxide Semiconductor) transistor 10 is formed on a surface of a semiconductor substrate 1.

MOS transistor 10 includes a pair of source/drain regions 3, 3, a gate insulating layer 5, and a gate electrode layer 7. The pair of source/drain regions 3, 3 are formed spaced by a prescribed distance at the surface of semiconductor substrate 1. Gate electrode layer 7 is formed on the surface of semiconductor substrate 1 sandwiched by the pair of source/drain region 3, 3, with gate insulating layer 5 interposed.

An interlayer insulating layer 11 is formed entirely over the surface of semiconductor substrate 1 to cover MOS transistor 10. In interlayer insulating layer 11, a contact hole 525 reaching a part of the surface of source/drain region 3 is formed. A conductive layer 521 such as an electrode is formed to be electrically connected to the source/drain region 3 through contact hole 525.

The method of manufacturing a semiconductor device in accordance with the first prior art example will be described.

FIGS. 52 to 56 are schematic cross sections showing, in order, the steps of manufacturing the semiconductor device in accordance with the first prior art example. Referring to FIG. 52, on the surface of semiconductor substrate 1, gate insulating layer 5 and conductive layer 7a are formed stacked on one another. On conductive layer 7a, a resist pattern 531a is formed by photolithography. By using resist pattern 531a as a mask, conductive layer 7a and gate insulating layer 5 are etched. Thereafter, resist pattern 531a is removed.

Referring to FIG. 53, by this etching, a gate electrode layer 7 having a desired shape is formed. Thereafter, by using gate electrode layer 7 and an element isolating insulating layer (not shown) as a mask, ion implantation or the like is performed to semiconductor substrate 1. Consequently, a pair of source/drain regions 3, 3 are formed spaced by a prescribed distance from each other on the surface of semiconductor substrate 1 on both sides of a region immediately below the gate electrode layer 7. By the pair of source/drain regions 3, 3, gate insulating layer 5 and gate electrode layer 7, an MOS transistor 10 is provided.

Referring to FIG. 54, interlayer insulating layer 11 is formed to cover MOS transistor 10.

Referring to FIG. 55, on interlayer insulating layer 11, a resist pattern 531b is formed by normal photolithography technique. Resist pattern 531b has a hole pattern 531b$_1$ above the source/drain regions 3. By using resist pattern 531b as a mask, anisotropic etching is performed on interlayer insulating layer 11. Thereafter, resist pattern 531b is removed.

Referring to FIG. 56, by this etching, a contact hole 524 reaching the source/drain region 3 is formed in interlayer insulating layer 11. Conductive layer 521 is formed on interlayer insulating layer 11 to be electrically connected to source/drain region 3 through contact hole 525, and thus the semiconductor device shown in FIG. 51 is completed.

The semiconductor device in accordance with the first prior art example suffers from the following problems. Generally, when the degree of integration of the DRAM (Dynamic Random Access Memory) is increased, memory size is unavoidably reduced. As the memory size is reduced, the pitch L$_1$ between word line 7 shown in FIG. 51 is also reduced unavoidably. Accordingly, the distance L$_2$ between the word lines is also reduced. Meanwhile contact hole 525, which is formed by the conventional photolithography as shown in FIGS. 55 and 56 has an opening diameter L$_3$, which cannot be reduced to be smaller than a prescribed limit, because of restriction in photolithography.

Under the circumstances, it may be possible that the center (denoted by chain dotted line Q—Q) of hole pattern 531b$_1$ of resist pattern 531b is shifted to the left or the right in the step of FIG. 55, for example, because of registration error or dimensional error of the mask in photolithography.

FIG. 57 shows a state in which the center of the hole pattern 531b$_1$ is deviated. If the resist pattern 531b in this state is used as a mask and interlayer insulating layer 11 is etched, contact hole is formed as shown in FIG. 58. More specifically, gate electrode layer 7 is exposed at the sidewall of contact hole 525.

If the conductive layer 521 is formed in the state shown in FIG. 58, conductive layer 521 and gate electrode layer 7 would be electrically short-circuited as shown in FIG. 59.

In order to prevent this short-circuiting, the following method is possible.

FIGS. 60 and 61 are schematic cross sections showing the steps of the method of preventing short-circuit.

First, referring to FIG. 60, in order to cover the surface of the gate electrode layer 7 exposed at the sidewall of contact hole 525, an insulating layer 601a is formed. Thereafter, etching by anisotropic RIE (Reactive Ion Etching) is performed on insulating layer 601a.

Referring to FIG. 61, by this etching, sidewall insulating layer 601 is formed in self-aligned manner to cover the exposed surface of gate electrode layer 7 and the sidewall of contact hole 525.

By providing sidewall insulating layer 601 in this manner, the surface of gate electrode layer 7 can be covered, and hence short-circuit between the conductive layer and gate electrode layer 7 can be prevented.

However, control of etching of insulating layer 601a shown in FIGS. 60 and 61 is not easy. Therefore, even by this method, part of the gate electrode layer 7 (P portion) may be exposed from sidewall insulating layer 601, as shown in FIG. 62.

Further, even when the surface of gate electrode layer 7 is completely covered by sidewall insulating layer 601 as shown in FIG. 61, the thickness of the sidewall insulating layer 601 covering gate electrode layer 7 is thin. Therefore, there is a high possibility that a current flows through the conductive layer and gate electrode layer 7 through sidewall insulating layer 601, because of the potential difference between the conductive layer and gate electrode layer 7 generated during the operation.

A method has been proposed, for example, in Japanese Patent Laying-Open No. 6-260442 which solves the above described problem. This method will be described as a second prior art example.

FIGS. 63 to 69 are schematic cross sectional views showing, in order, the method of manufacturing the semiconductor device in accordance with the second prior art example. Referring to FIG. 63, on a surface of a semiconductor substrate 1 separated by element isolating insulating layer 241, an MOS transistor 10 constituted by a pair of source/drain regions 3, gate insulating layer 5 and gate electrode layer 7 is formed. On the entire surface of semiconductor substrate 1, an interlayer insulating layer 11 formed, for example, of silicon oxide film is formed to cover MOS transistor 10. On interlayer insulating layer 11, a polycrystalline silicon layer 13a having different etch property than insulating layer 11 is formed. On polycrystalline silicon layer 13a, silicon oxide film 15 having the same etch property as interlayer insulating layer 11 is formed.

Referring to FIG. 64, a resist pattern 371a is formed on silicon oxide film 13, by using resist pattern 371a as a mask, anisotropic etching is performed on silicon oxide film 15. Thus, an opening 23 is provided in silicon oxide film 15. Thereafter, resist pattern 371a is removed.

Referring to FIG. 65, a silicon oxide film 17a is formed entirely over the surface to cover inner wall surface of opening 23. Anisotropic etching is performed on the entire surface of silicon oxide film 17a.

Referring to FIG. 66, by the anisotropic etching, a sidewall insulating layer 17 which is of silicon oxide film, is left on the sidewall of opening 23. By using silicon oxide film 15 and sidewall insulating layer 17 as a mask, anisotropic etching is formed on polycrystalline silicon layer 13a.

Referring to FIG. 67, by the etching, opening 25 is formed in polycrystalline silicon layer 13a. By using polycrystalline silicon layer 13a having opening 25 as a mask, anisotropic etching is performed on interlayer insulating layer 11.

Referring to FIG. 68, by the anisotropic etching, a contact hole 727 having the same opening diameter $D_3$ as opening 25 of polycrystalline silicon layer 23a is formed in interlayer insulating layer 11.

By the anisotropic etching, silicon oxide film 15 and sidewall insulating layer 17 having the same etching property as interlayer insulating layer 11 are removed.

Referring to FIG. 69, a polycrystalline silicon layer 13b is formed on polycrystalline silicon layer 13a to fill contact hole 727 and to be electrically connected to source/drain regions 3. Thereafter, by common photolithography and etching, polycrystalline silicon layers 13b and 13a are etched successively, and thus a conductive layer 13 having a desired shape is provided.

According to the method described above, in the step shown in FIG. 66, a sidewall insulating layer 17 is formed on the sidewall of opening 23. Then, using silicon oxide film 15 and sidewall insulating film 17 as a mask, etching is performed on polycrystalline silicon layer 13. Therefore, the opening diameter of opening 25 shown in FIG. 67 can be made smaller than the minimum processing dimension of photolithography. Accordingly, the opening diameter $D_3$ of contact hole 727 in interlayer insulating layer 11 which is etched using the polycrystalline silicon layer 13a having opening 25 as a mask can be made smaller than the minimum possible processing dimension of photolithography.

Therefore, even when the space between gate electrode layers 7 is reduced due to increased degree of integration, short-circuit between conductive layer 13 and gate electrode layer 7 can be prevented.

However, in the second prior art example, conductive layer 13 shown in FIG. 69 is a bit line, and there is a problem that manufacturing becomes complicated when a storage node is to be formed on bit line 13. This problem will be described in detail in the following.

FIGS. 70 to 74 are schematic cross sections showing the steps for forming a storage node on the bit line in the second prior art example. Referring to FIG. 70, as in the step shown in FIG. 63, interlayer insulating layer 711 formed of silicon oxide film, polycrystalline silicon layer 713a and silicon oxide film 715 are formed successively to cover bit line 13.

Then, referring to FIG. 71, as in the step shown in FIG. 64, resist pattern 771a is formed on silicon oxide film 715, and using resist pattern 771a as a mask, silicon oxide film 715 is etched. Thus opening 723 is formed in silicon oxide film 715. Thereafter, resist pattern 771 is removed.

Referring to FIG. 72, as in the step shown in FIG. 65, silicon oxide film 717a is formed on the entire surface to cover inner wall surface of opening 723. Anisotropic etching is performed on the entire surface of silicon oxide film 717a.

Referring to FIG. 73, as described in the step shown in FIG. 66, by this etching, sidewall insulating layer 717 is formed on the sidewall of opening 723. By using silicon oxide film 715 and sidewall insulating layer 717 as a mask, anisotropic etching is performed on polycrystalline silicon film 713a.

Referring to FIG. 74, as described in the step shown in FIGS. 67 and 68, by the anisotropic etching, an opening is formed in polycrystalline silicon film 713a. By using polycrystalline silicon film 713a as a mask, anisotropic etching is performed on insulating layers 711 and 11. Thus a contact hole 727a for a storage node is formed in insulating layers 711 and 11.

Silicon oxide film 715 and sidewall insulating layer 717 shown in FIG. 73 are removed when insulating layers 711 and 11 are etched.

Thereafter, a storage node is formed to be electrically connected to source/drain region 3 of MOS transistor 10 through contact hole 727a.

By repeating the steps of forming contact hole 727 for the bit lines, contact hole 727a for the storage node can be formed with its opening diameter made smaller than the minimum possible processing dimension of photography.

However, when contact holes 727a for the storage nodes are to be formed by this method, it is necessary to repeat the steps of forming contact hole 727 for the bit line, and hence the number of steps of manufacturing becomes unavoidably large.

SUMMARY OF THE INVENTION

An object of the present invention is to provide a method of manufacturing a semiconductor device suitable for higher degree of integration which includes small number of steps.

Another object of the present invention is to provide a structure of a semiconductor device suitable for higher degree of integration.

The method of manufacturing a semiconductor device in accordance with one aspect of the present invention includes the following steps.

First, a conductive region is formed at a main surface of a semiconductor substrate. Then, a first insulating layer is formed on the main surface of the semiconductor substrate. On the first insulating layer, a second insulating layer formed of a material having different etch rate from the first insulating layer is formed. A third insulating layer having a first opening above the conductive region and formed of a material having approximately the same etch rate as the first insulating layer is formed on the second insulating layer. On a sidewall of the first opening of the third insulating layer, a sidewall insulating layer formed of a material having approximately the same etch rate as the first insulating layer is formed. By using the sidewall insulating layer and the third insulating layer as a mask, the second insulating layer is removed by etching until the first insulating layer is exposed, and a second opening is formed in the second insulating layer. A fourth insulating layer is formed on the third insulating layer and on the sidewall insulating layer to fill the second opening. Then, a resist having a hole pattern of which opening diameter is larger than that of the second opening is formed above the second opening. By using the resist as a mask, the first, second, third and fourth insulating layers and the sidewall insulating layer are etched under such etching condition that promotes etching of first, third and fourth insulating layers, having suppresses etching of the second insulating layer, so that a hole reaching the conductive region through the first, second, third and fourth insulating layers, having approximately the same diameter as the second opening in the first and second insulating layer portions and having an opening diameter approximately the same as the opening diameter of the hole pattern in the fourth insulating layer portion is formed. Then a conductive layer extending over the fourth insulating layer and electrically connected to the conductive regions through the hole is formed.

In the method of manufacturing a semiconductor device in accordance with an aspect of the present invention, a second opening having an opening diameter smaller than the minimum possible processing dimension of photography is formed in the second insulating layer. As the second opening, an opening for forming a bit line contact on one of the source/drain regions and an opening for forming a storage node contact on the other of the source/drain regions may be formed. After these openings are formed and before the contact holes for the bit line and the storage node are formed, a fourth insulating layer is formed to once fill the openings. Thereafter, by using a resist pattern formed by the common photolithography technique as a mask, anisotropic etching is performed to form contact holes from above the holes for the bit line or the storage node. In this etching, the second insulating layer is hardly etched, since it is formed of a material having etching property different from that of the fourth insulating layer. Therefore, when the contact hole reaches the second insulating layer, only the first insulating layer immediately below the opening for the bit line or the storage node is continuously etched. More specifically, in the first insulating layer, a contact hole having the same opening diameter as that of the opening for the bit line or the storage node, that is, the opening diameter smaller than the minimum possible processing dimension of photolithography is formed. Since the contact hole can be formed in the first insulating layer covering the gate electrode layer such that the hole has smaller opening diameter than the minimum possible processing dimension of photolithography, short-circuit between the bit line or the storage node and the gate electrode layer can be prevented.

In the above described aspect, preferably, the fourth insulating layer is formed to have a planarized upper surface.

Since the fourth insulating layer is planarized, the step of photolithography above the fourth insulating layer can be carried out precisely.

In the above described aspect, preferably, the sidewall insulating layer is formed of a material having an etch rate different from that of the first insulating layer.

Since the sidewall insulating layer is formed of a material having an etch rate different from that of the first insulating layer, when the hole is formed, the sidewall insulating layer serves to prevent enlargement of the opening diameter of the second insulating layer. Thus enlargement of the diameter of the first opening can be prevented.

The method of manufacturing a semiconductor device in accordance with another aspect of the present invention includes the following steps.

First, first and second conductive regions are formed spaced by a prescribed distance from each other at a main surface of a semiconductor substrate. A first insulating layer is formed on the main surface of the semiconductor substrate. A second insulating layer formed of a material having an etch rate different from that of the first insulating layer is formed on the first insulating layer. Then, a third insulating layer formed of a material having approximately the same etch rate as the first insulating layer and having first and second openings above the first and second conductive regions is formed on the second insulating layer. On each of the sidewalls of the first and second openings, first and second sidewall insulating layers are formed. By using the first and second sidewall insulating layers and the third insulating layer as a mask, the second insulating layer is removed by etching until the surface of the first insulating layer is exposed, and thus third and fourth openings are formed in the second insulating layer. On the third insulating layer and on the first and second sidewall insulating layers, a fourth insulating layer is formed to fill the third and fourth openings. A first resist having a hole pattern of which opening diameter is larger than the opening diameter of the third opening is formed above the third opening. The first, second, third and fourth insulating layers and the sidewall insulating layer are etched by using the first resist as a mask under such a condition that promotes etching of the first, third and fourth insulating layers and suppresses etching of the second insulating layer, so that a first hole reaching the first conductive region through the first, second, third and fourth insulating layers, having approximately the same diameter as the diameter of the third opening in the first and second insulating layer portion and having approximately the same opening diameter as the hole pattern of the first resist at the fourth insulating layer portion is formed. A first conductive layer electrically connected to the first conductive regions through the first hole and extending over the fourth insulating layer is formed. A fifth insulating layer formed of a material having approximately the same etch rate as the first insulating layer is formed on the fourth insulating layer to cover the first conductive layer. On the fifth insulating layer, a second resist having a hole pattern of which hole diameter is larger than the opening diameter of the fourth opening is formed above the fourth opening. The first, second, third, fourth and fifth insulating layers and the second sidewall insulating layer are etched using the second resist as a mask under such condition that promotes etching of the first, third, fourth and fifth insulating layers but suppresses etching of the second insulating layer, so that a second hole reaching the second conductive region through the first, second, third, fourth and fifth insulating layers, having approximately the same diameter as the opening diameter of the fourth opening at the first and second insulating layer portion and having approximately the same opening diameter as the opening diameter of the hole pattern of the second resist in the fifth and fourth insulating layer portion is formed. Then, a second conductive layer electrically connected to the conductive regions through the second hole and extending over the fourth insulating layer is formed.

In the method of manufacturing a semiconductor device in accordance with a still another aspect of the present invention, third and fourth openings having such opening diameter which are smaller than the minimum possible opening diameter by photolithography are formed in the second insulating layer. For example, as the third opening, an opening for forming a bit line contact may be formed in one of the source/drain regions, and as the fourth opening, an opening for a storage node contact may be formed on the other one of the source/drain regions. After the third and fourth openings are formed and before formation of the contact holes for the bit line and the storage node, a fourth insulating layer is formed once to fill these openings. Thereafter, by using a resist pattern formed by the common photolithography technique as a mask, anisotropic etching is performed for forming the contact holes from above the respective openings for the bit line and the storage node. During this etching, the second insulating layer is hardly etched, since the second insulating layer is formed of a material having different etch rate than the fourth insulating layer. Therefore, when the contact hole reaches the second insulating layer, only the first insulating layer immediately below the opening for the bit line or the storage node is continuously etched. Namely, in the first insulating layer, a contact hole having the same opening diameter as that of the opening for the bit line or the storage node, that is, the opening diameters smaller than the minimum possible dimension formed by photolithography, can be formed. In this manner, since the contact hole can be formed with the diameter smaller than the minimum possible dimension formed by photolithography can be formed in the first insulating layer covering the gate electrode layer, short-circuit between the bit line or the storage node and the gate electrode layer can be prevented. Further, when a storage node (second conductive layer) is to be formed upper than the bit line (first conductive layer), if an opening for the bit line is formed on the second insulating layer as described above and the opening for the storage node is formed, then it is possible to form a contact hole which has smaller opening diameter than the minimum possible dimension formed by photolithography can be formed in the first insulating layer by performing etching from above the opening for the storage node. Therefore it is not necessary to repeat troublesome steps as in the prior art, and thus a storage node contact can be formed through simple steps.

In the aforementioned aspect, preferably, a sixth insulating layer formed of a material having an etch rate different from that of the first insulating layer is formed on the first conductive layer. A third sidewall insulating layer formed of a material having an etch rate different from that of the first insulating layer is formed to cover the sidewall of the first conductive layer. The fifth insulating layer is formed on the sixth insulating layer and on the sidewall insulating layer.

Since the first conductive layer has its surface protected by the sixth insulating layer and the third sidewall insulating layer formed of a material having different etch rate than the first insulating layer, when the second hole is formed, exposure of the first conductive layer through the sidewalls of the second hole can be prevented. Thus short-circuit between the first and second conductive layers can be prevented.

The semiconductor device in accordance with one aspect of the present invention includes a semiconductor substrate, a conductive region, first to fourth insulating layers and a conductive layer. The semiconductor substrate has a main surface. The conductive region is formed at a main surface of the semiconductor substrate. The first insulating layer is formed on the main surface of the semiconductor substrate. The second insulating layer is formed of a material having an etch rate different from that of the first insulating layer, and it is formed on the first insulating layer. The third insulating layer is formed of a material having approximately the same etch rate as the first insulating layer, and is formed on the second insulating layer. The fourth insulating layer is formed of a material having approximately the same etch rate as the first insulating layer, and is formed on the third insulating layer. In the first, second, third and fourth insulating layers, a hole reaching the conductive region formed at the main surface of the semiconductor substrate is formed, piercing through these insulating layers. The hole has a first opening diameter smaller than minimum possible dimension formed by the conventional photolithography in the portion formed in the first and second insulating layers, and has a second opening diameter larger than the first opening diameter in the portion formed in the fourth insulating layer. The conductive layer is electrically connected to the conductive regions through this hole and extends over the fourth insulating layer.

In the semiconductor device in accordance with one aspect of the present invention, the first opening diameter of the hole is smaller than the minimum possible dimension formed by the conventional photolithography. Therefore, even when the space between gate electrodes is made smaller as the degree of integration increases, exposure of the gate electrode layer from the sidewall of the hole can be prevented. Therefore, even when highly integrated, short-circuit between conductive layers can be prevented, and hence a semiconductor device which ensures stable operation can be obtained.

In the above described aspect, the fourth insulating layer has a planarized surface.

Since the fourth insulating layer has a planarized surface, a contact hole can be formed at a desired position.

In the above described aspect, preferably a sidewall insulating layer is further provided on the sidewall of the third insulating layer to define the second opening diameter.

Since such a sidewall insulating layer is provided, the opening diameter of the hole can be made smaller than the minimum possible dimension formed by the photolithography.

In the above described aspect, preferably, the sidewall insulating layer is formed of a material having an etch rate different from that of the first insulating layer.

Since the sidewall insulating layer is formed of a material having different etch rate from the first insulating layer, enlargement of the first opening diameter of the hole during the formation of the hole can be prevented.

In the above described aspect, preferably, a fifth insulating layer formed to cover the upper surface of the conductive layer and a second sidewall insulating layer formed on the sidewall of the conductive layer are further provided. The fifth insulating layer and the sidewall insulating layer are formed of a material having an etch rate different from that of the first insulating layer.

The fifth insulating layer and the sidewall insulating layer formed of a material having different etch rate than the first insulating layer are formed to cover the surface of the conductive layer. More specifically, the surface of the conductive layer is protected by the fifth insulating layer and the sidewall insulating layer. Therefore, exposure of the surface of the conductive layer from the sidewall of the hole can be prevented. Therefore, electrical short-circuit between the conductive layer and another conductive layer filled in the hole can be prevented.

In the above described aspect, preferably, a memory cell of a DRAM is formed in the semiconductor substrate. The conductive region is the source/drain region of the MOS transistor. The conductive layer is either the bit line or the storage node of the capacitor.

In this manner, in a DRAM memory cell, short-circuit between the gate electrode layer of the MOS transistor and the bit line or the storage node of the capacitor can be prevented, and hence a memory cell structure for a DRAM which ensures stable operation can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
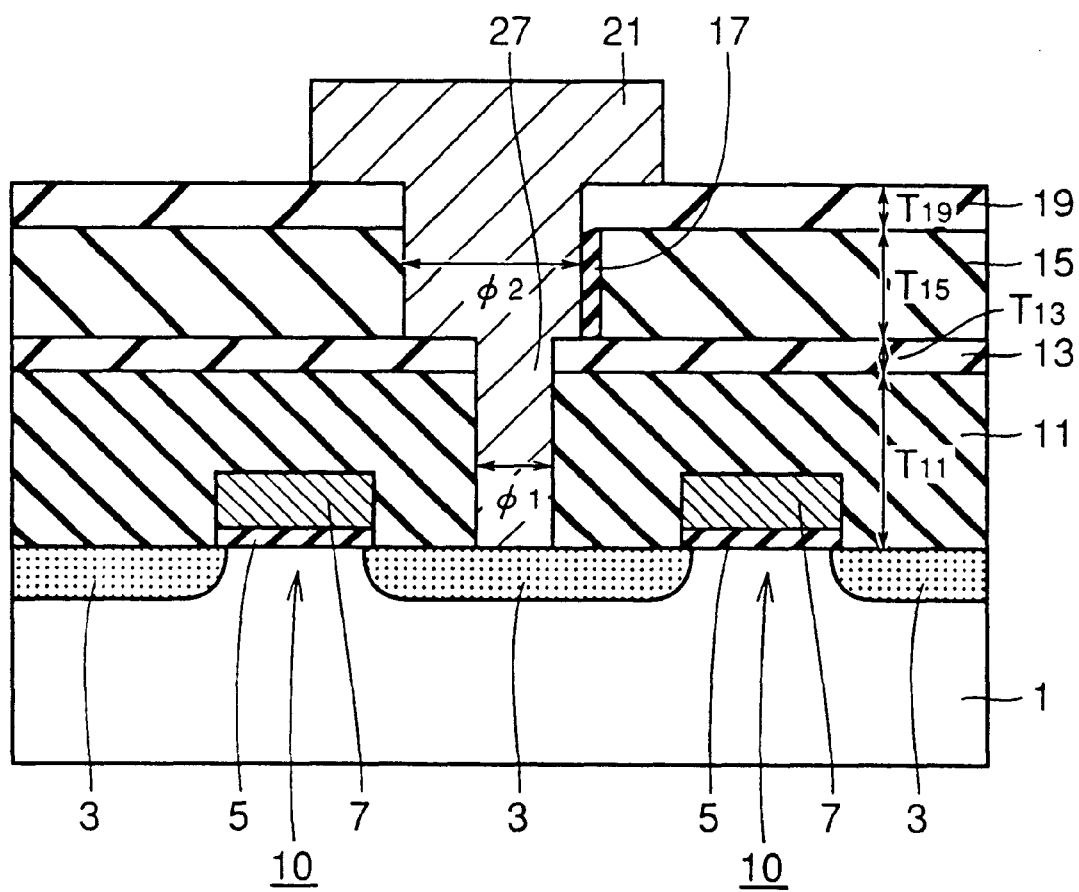
FIG. 1 is a cross sectional view schematically showing a structure of a semiconductor device in accordance with a first embodiment of the present invention.

Referring to FIG. 1, at a surface of a semiconductor substrate 1, an MOS transistor 10 is formed.

MOS transistor 10 includes a pair of source/drain regions 3, 3, a gate insulating layer 5 and a gate electrode layer 7. The pair of source/drain regions 3, 3 are formed at the surface of semiconductor substrate 1 spaced by a prescribed distance from each other. The gate electrode layer 7 is formed on the surface of semiconductor substrate 1 sandwiched between the pair of source/drain regions 3, 3, with gate insulating layer 5 interposed.

An interlayer insulating layer 11 is formed, for example, of $SiO_2$ (silicon oxide) to cover MOS transistor 10. On the interlayer insulating layer 11, an insulating layer 13 of $Si_3N_4$ (silicon nitride) or SiON (silicon oxide nitride), for example, is formed. The material of the insulating layer 13 is not limited to $Si_3N_4$ or the like and it may be formed of any material which has different etch rate from interlayer insulating layer 11.

An interlayer insulating layer 15 of, for example, $SiO_2$ is formed on insulating layer 13. On interlayer insulating layer 15, an insulating layer 19 of, for example, $SiO_2$ is formed. Interlayer insulating layer 15 and insulating layer 19 may be formed of any material other than $SiO_2$ provided that the material has the same etch rate as interlayer insulating layer 11.

Through interlayer insulating layer 11, insulating layer 13, interlayer insulating layer 15 and insulating layer 19, a contact hole 27 reaching a portion of the surface of source/drain regions 3 through this insulating layers is formed. Contact hole 27 has a first opening diameter $\phi 1$ which is smaller than the minimum dimension which can be formed by photolithography, at the portion of interlayer insulating layer 11 and insulating layer 13, and has a second opening diameter $\phi 2$ which is larger than the first opening diameter $\phi 1$ in interlayer insulating layer 15 and insulating layer 19.

The first opening diameter $\phi 1$ is 0.05 to 0.20 $\mu$m, and the second opening diameter $\phi 2$ is 0.25 to 0.40 $\mu$m.

On the sidewall of contact hole 27 in interlayer insulating layer 15, a sidewall insulating layer 17 of $SiO_2$, for example, is left to define the shape of the second opening diameter $\phi 2$.

A conductive layer 21 which will be the bit line or the storage node of a capacitor, for example, is formed to be electrically connected to the source/drain region 3 through contact hole 27. Conductive layer 21 is formed of impurity doped polycrystalline silicon, metal such as tungsten, or an alloy thereof.

The thickness $T_{11}$ of interlayer insulating layer 11 is about 2000 to about 3000 Å, the thickness $T_{13}$ of insulating layer 13 is about 100 to about 1000 Å, thickness $T_{15}$ of interlayer insulating layer 15 is about 1000 to about 2000 Å and the thickness $T_{19}$ of insulating layer 19 is about 500 to about 1000 Å. These film thicknesses are based on the 0.25 $\mu$m rule device level, for example.

The method of manufacturing a semiconductor device in accordance with the first embodiment will be described.

Figure 2:
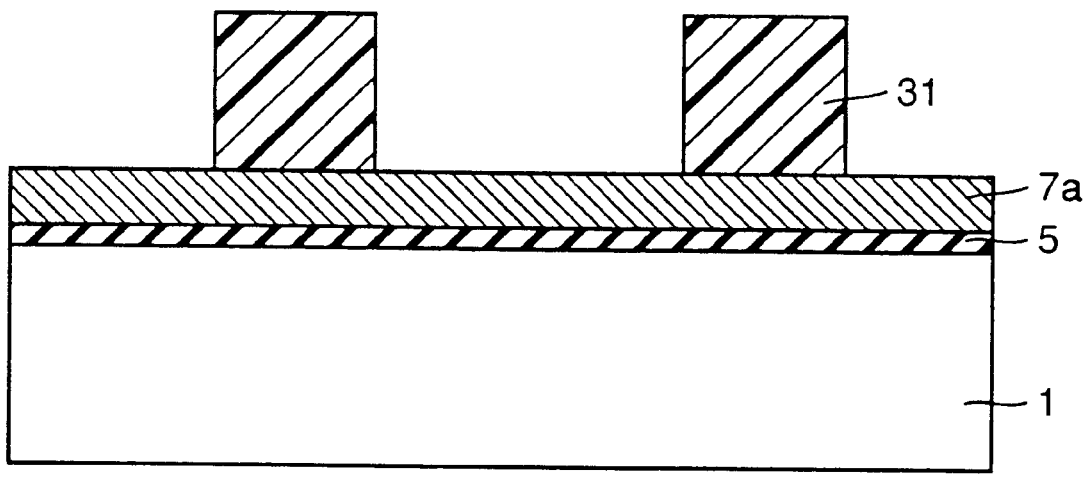
FIGS. 2 to 12 are schematic cross sectional views showing, in order, the steps of manufacturing the semiconductor device in accordance with the first embodiment of the present invention.

First, referring to FIG. 2, on the surface of semiconductor substrate 1, a gate insulating layer 5 of, for example, silicon oxide film is formed by thermal oxidation, for example. On gate insulating layer 5, a polycrystalline silicon layer 7a doped with an impurity such as phosphorus is formed. On polycrystalline silicon layer 7a, a resist pattern 31 is formed selectively. By using resist pattern 31 as a mask, polycrystalline silicon layer 7a and gate insulating layer 5 are anisotropically etched. Thereafter, resist pattern 31 is removed.

Figure 3:
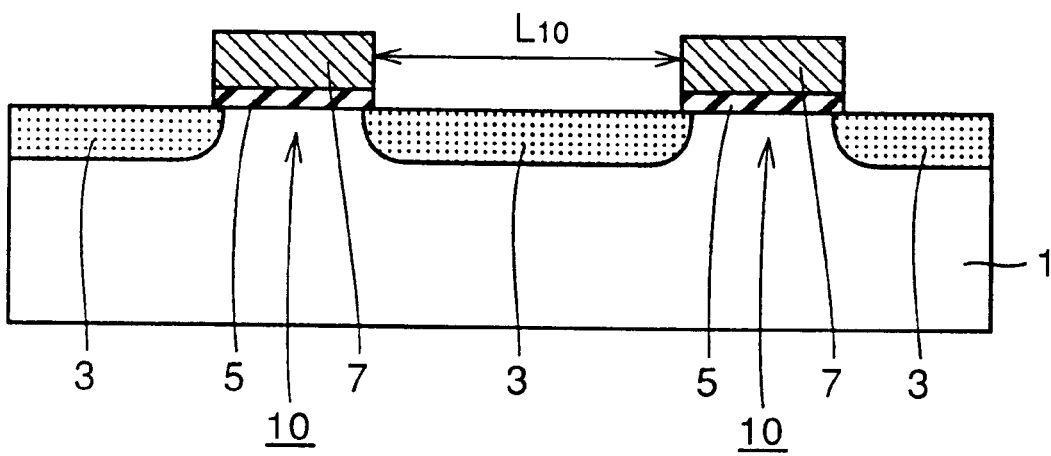

Referring to FIG. 3, by the above described etching, gate electrode layer 7 is formed from polycrystalline silicon layer. The distance $L_{10}$ between the juxtaposed gate electrode layers 7, 7 is set to be 0.25 to 0.40 μm, for example. Thereafter, ion implantation is performed, so that a pair of source/drain regions 3, 3 are formed spaced by a prescribed distance from each other at the surface of semiconductor substrate 1. The pair of source/drain region 3, 3, gate insulating layer 5 and gate electrode layer 7 constitute MOS transistor 10.

Figure 4:
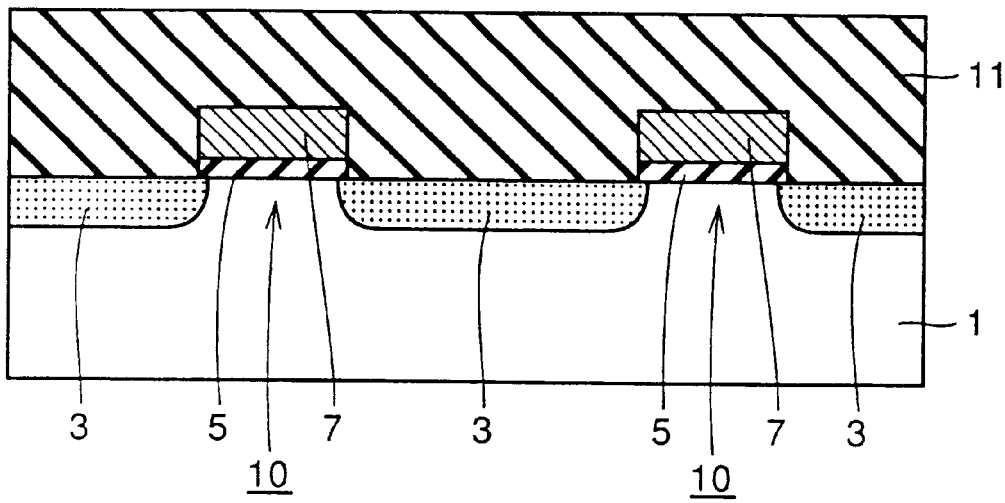

Referring to FIG. 4, insulating layer 11 formed, for example of, $SiO_2$ is deposited to cover MOS transistor 10 by, for example, reduced pressure CVD (Chemical Vapor Deposition) or normal pressure CVD. Thereafter, insulating layer 11 is planarized by CMP (Chemical Mechanical Polishing) method, etch back or by reflow.

Figure 5:
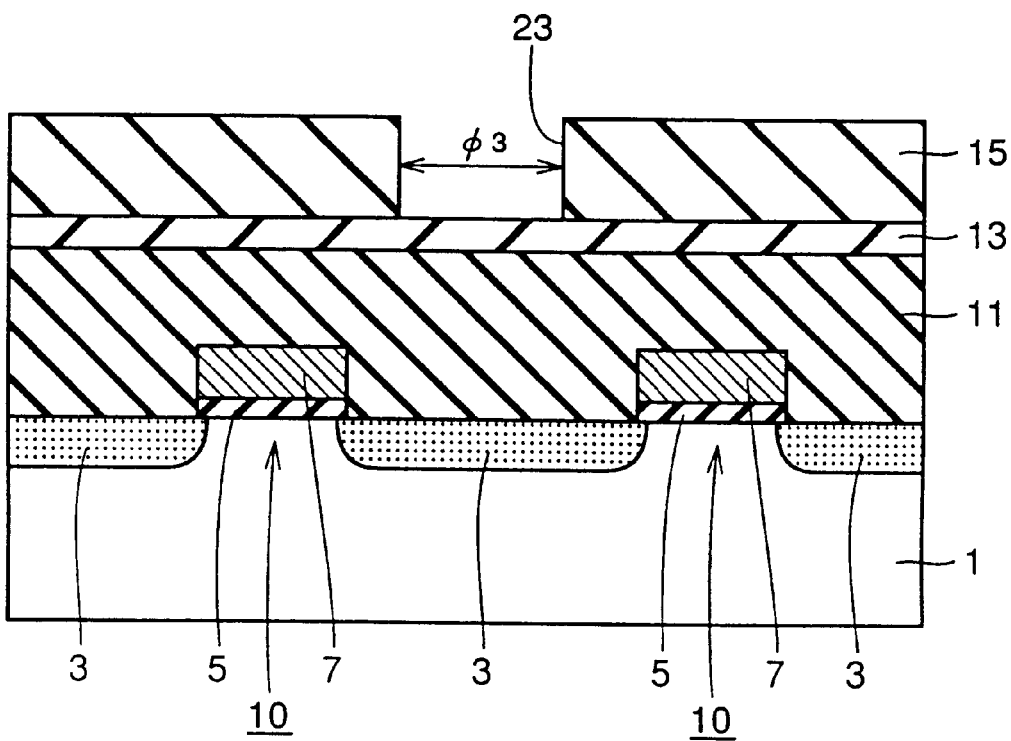

Referring to FIG. 5, on insulating layer 11, an insulating layer 13 of $Si_3N_4$ is deposited to the thickness of 100 to 1000 Å by, for example, reduced pressure CVD method or plasma CVD method. On insulating layer 13, interlayer insulating layer 15 of $SiO_2$ is deposited to the thickness of 1000 to 2000 Å by, for example, reduced pressure CVD method or normal pressure CVD method. Thereafter, by common photolithography and etching, an opening 23 is formed in interlayer insulating layer 15.

Figure 6:
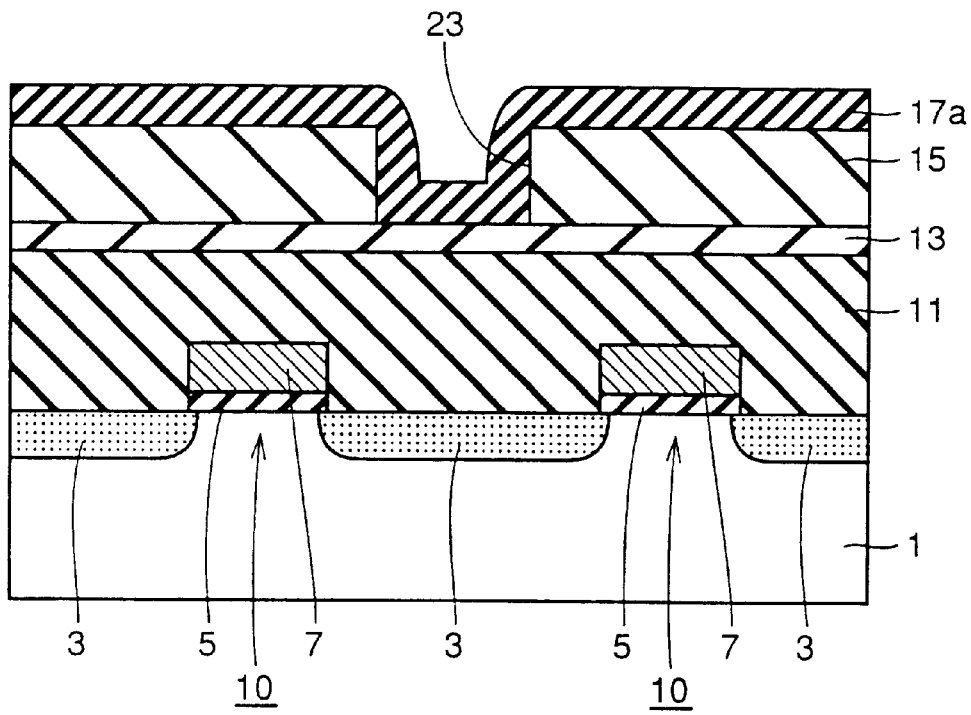

Referring to FIG. 6, on interlayer insulating layer 15, a coating layer 17a of $SiO_2$ is formed by, for example, reduced pressure CVD method, to cover the inner wall surface of opening 23. On the entire surface of coating layer 17a, anisotropic dry etching is performed by RIE method, for example, in a gas atmosphere of $CF_4$, $CF_4$-$H_2$, $C_3F_8$ or the like.

Figure 7:
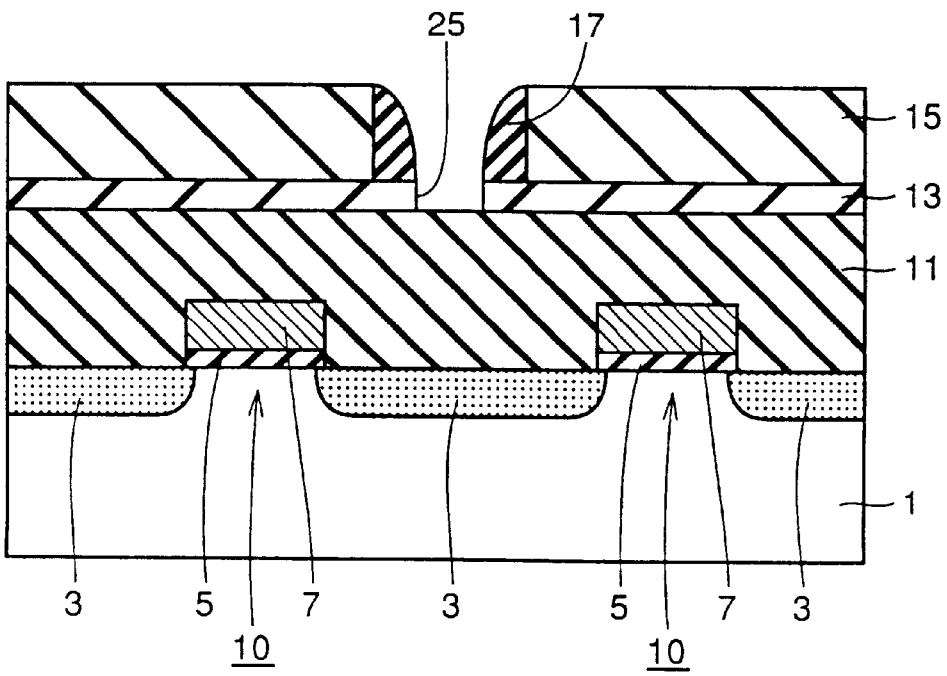

Referring to FIG. 7, by the anisotropic dry etching, sidewall insulating layer 17 is formed, left on the sidewall of the opening in interlayer insulating layer 15. By using sidewall insulating layer 17 and interlayer insulating layer 15 as a mask, anisotropic dry etching by RIE is performed on insulating layer 13 in a gas atmosphere of $CF_4$, $CF_4$—$H_2$—$N_2$, $SiF_4$ or the like. Consequently, an opening 25 is formed in insulating layer 13, which hole has an opening diameter smaller than the minimum possible dimension formable by photolithography.

Figure 8:
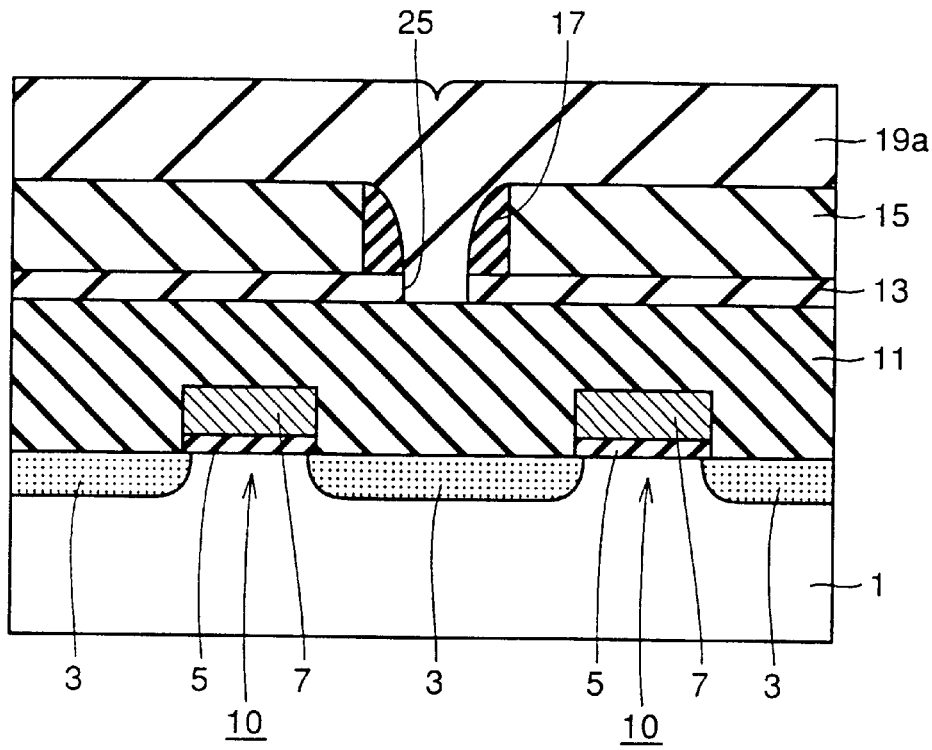

Referring to FIG. 8, insulating layer 19a of $SiO_2$ is formed to the thickness of 2000 to 3000 Å by, for example, reduced pressure CVD method or normal pressure CVD method, to fill the opening 25. Insulating layer 19a is entirely etched back by dry or wet etching, thus the upper surface is planarized. The planarization may be performed by CMP method.

Figure 9:
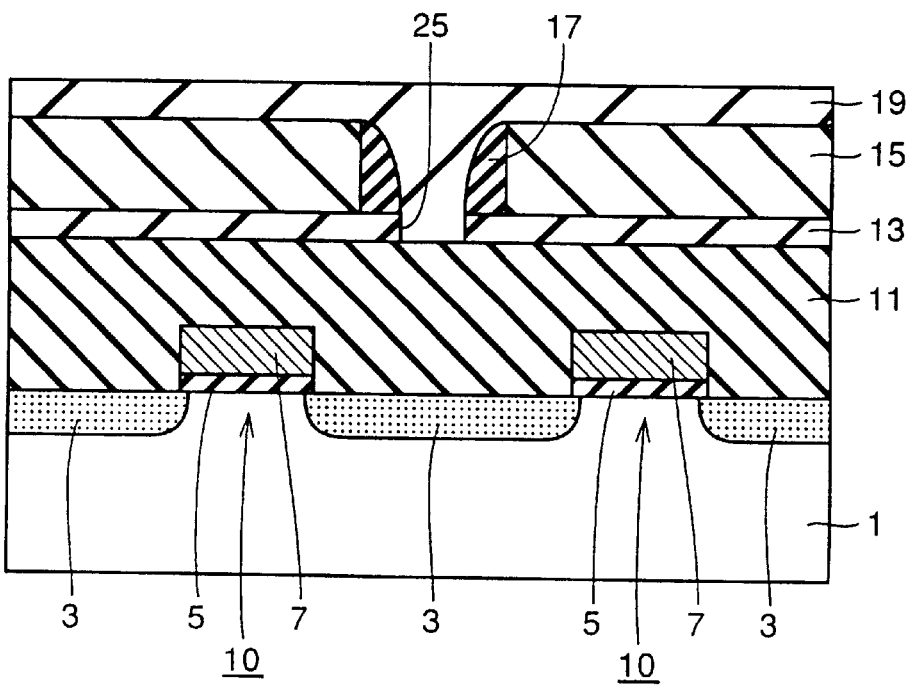

Referring to FIG. 9, by the above described planarization, insulating layer 19 having its upper surface planarized is obtained.

Figure 10:
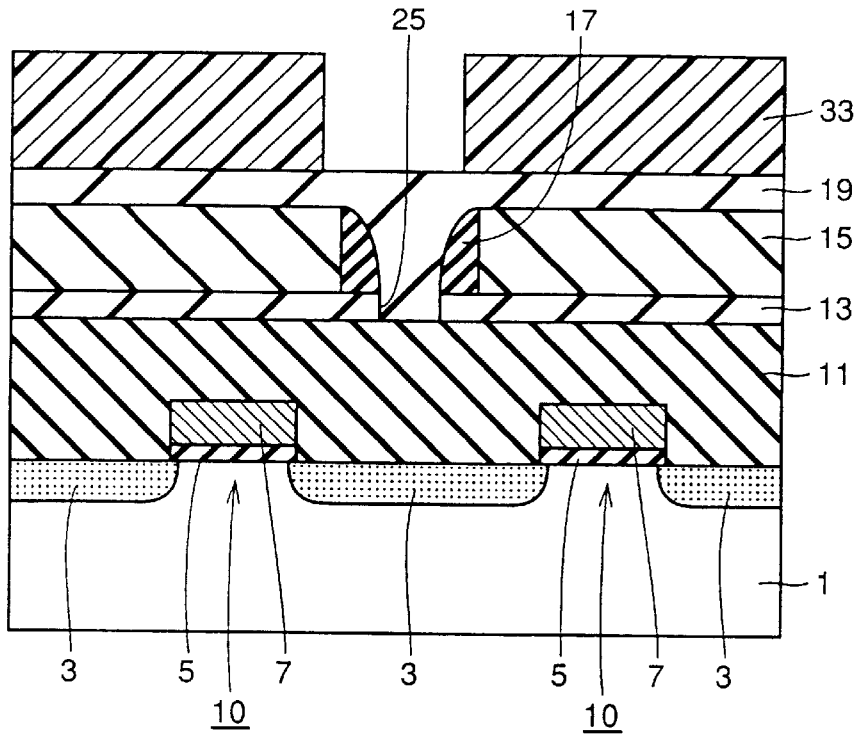

Referring to FIG. 10, by common photolithography, a resist pattern 33 having a hole pattern above opening 25 is formed on insulating layer 19. By using resist pattern 33 as a mask, etching is performed. The etching is performed under such $SiO_2$ etching condition having high selectivity to $SiN_4$ such as disclosed in *Proceedings of Institute of Applied Physics Conference,* Spring, 1994 29p-ZF-2 or disclosed in monthly magazine, *Semiconductor World* 1993. 10, pp. 68–75.

Figure 11:
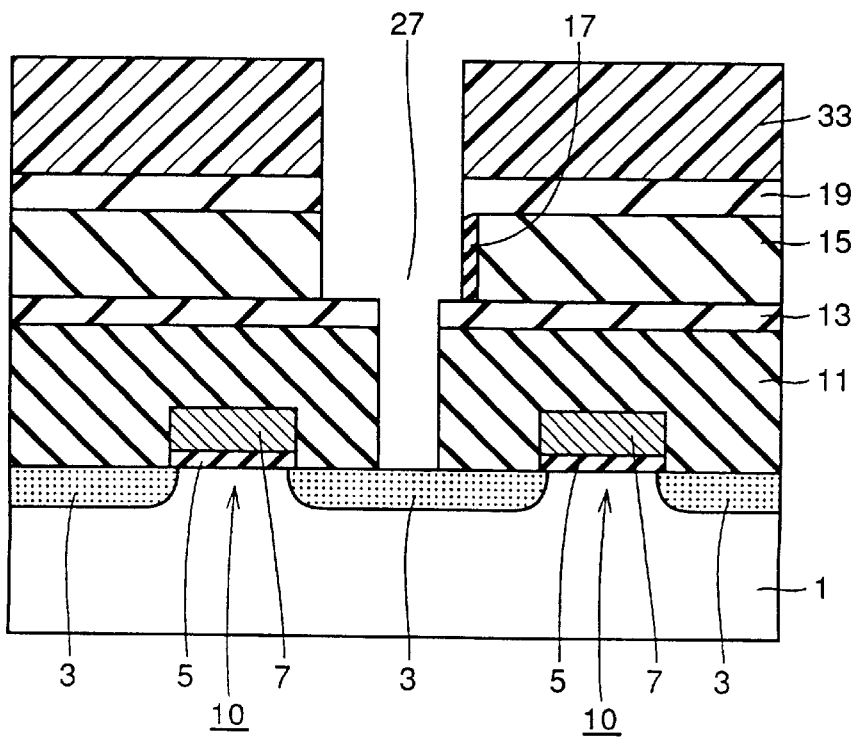

Referring to FIG. 11, in the interlayer insulating layer 11 below insulating layer 13, contact hole 27 is formed while the opening diameter approximately the same as that of opening 25 in insulating layer 13 is maintained. More specifically, contact hole 27 has a first opening diameter which is smaller than the minimum possible dimension formable by photolithography in the portion of the entire insulating layer 11 and insulating layer 13, and has a second opening diameter which can be formed by the common photolithography, in interlayer insulating layer 15, sidewall insulating layer 17 and insulating layer 19. Thereafter, resist pattern 33 is removed.

Figure 12:
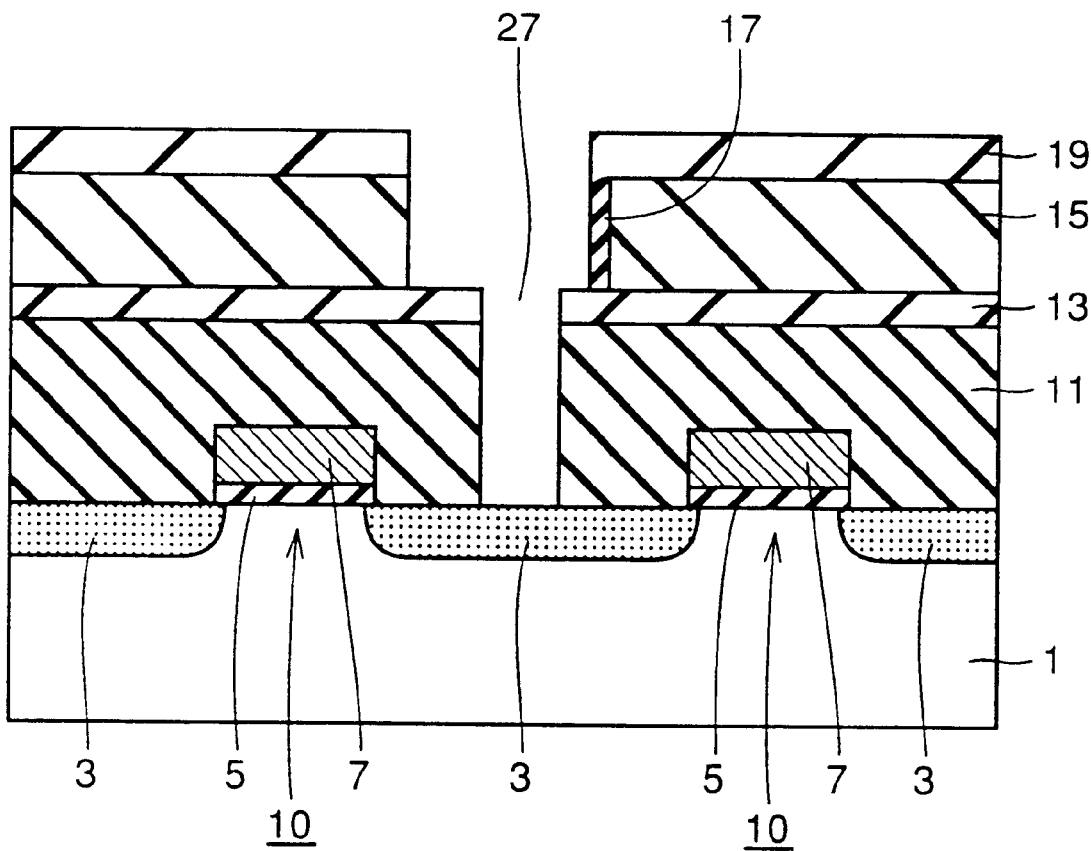

Referring to FIG. 12, as the resist pattern is removed, upper surface of insulating layer 19 is exposed.

Thereafter, conductive layer 21 is formed on insulating layer 19 to be electrically connected to source/drain region 3 through contact hole 27, and thus the semiconductor device shown in FIG. 1 is completed.

In the present embodiment, in the step shown in FIG. 7, sidewall insulating layer 17 is provided on the sidewall of opening 23, and using this as a mask, insulating layer 13 is etched. Therefore, opening 25 having smaller diameter than minimum possible dimension formable by photolithography can be formed in insulating layer 13. In the step shown in FIG. 11, interlayer insulating layer 11 can be etched by using insulating layer 13 having opening 25 as a mask. Therefore, the opening diameter of contact hole 27 in interlayer insulating layer 11 can be made smaller than the minimum possible processing dimension. Therefore, exposure of gate electrode layer 7 through contact hole 27 can be prevented.

In the semiconductor device formed in this manner, short-circuit between conductive layers can be prevented even when the degree of integration is increased, and hence stable operation is ensured.

In the present embodiment, conductive layer 21 shown in FIG. 1 is, for example, a bit line and when storage node is formed on bit line 21, the process of manufacturing can be simplified as compared with the second prior art example. This will be described in detail with respect to the third embodiment.

Second Embodiment

Figure 13:
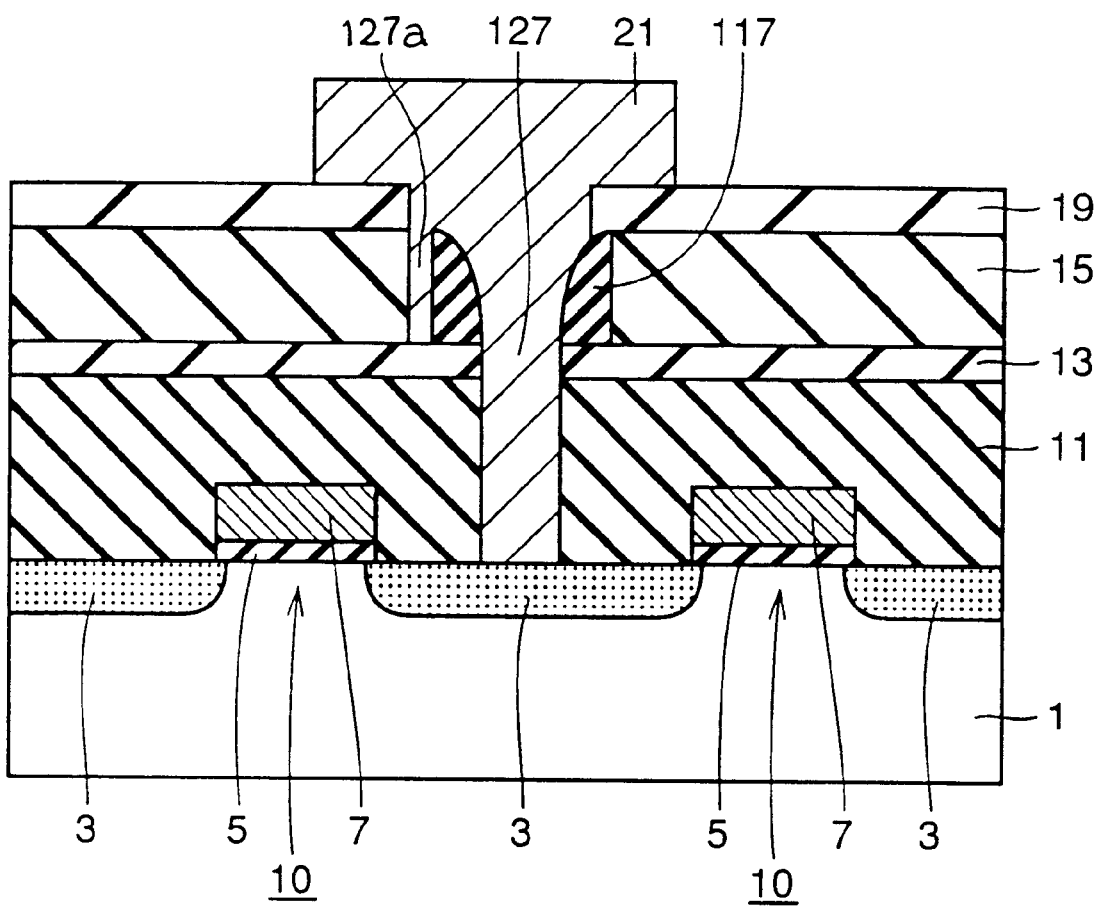
FIG. 13 is a cross sectional view schematically showing a structure of a semiconductor device in accordance with a second embodiment of the present invention.

In the present embodiment, sidewall insulating layer 17 formed in the step shown in FIG. 7 is formed of $Si_3N_4$ or SiON, which is the same material as insulating layer 13, for example. Therefore, in the steps of etching shown in FIGS. 10 and 11, sidewall insulating layer 17 is hardly etched but left as shown in FIG. 13. In the present embodiment, sidewall insulating layer 17 may be formed of any material other than the aforementioned material, provided that the material has different etch rate than interlayer insulating layer 15.

In this case, it may be possible that there is a gap 127a generated between sidewall insulating layer 117 and interlayer insulating layer 15 because of registration error and dimensional error. There may or may not be such a gap, since it derives from error.

In the first embodiment, at the time of etching interlayer insulating layer 15 and sidewall insulating layer 17 of FIG. 11, insulating layer 13 keeps high selectivity chemically. However, it may be possible that opening end of insulating layer 13 is physically etched (for example, by sputtering caused by ion impingement) and that opening diameter φ1 shown in FIG. 1 is enlarged to be larger than the prescribed value.

In the present embodiment, sidewall insulating layer 117 having high selectivity to interlayer insulating layer 15 is formed at an upper portion of opening end of insulating layer 13. Therefore, if there is some physical etching, enlargement of diameter φ1 to be larger than the possible dimension formable by photolithography can be prevented, as shown in FIG. 13.

Third Embodiment

Figure 14:
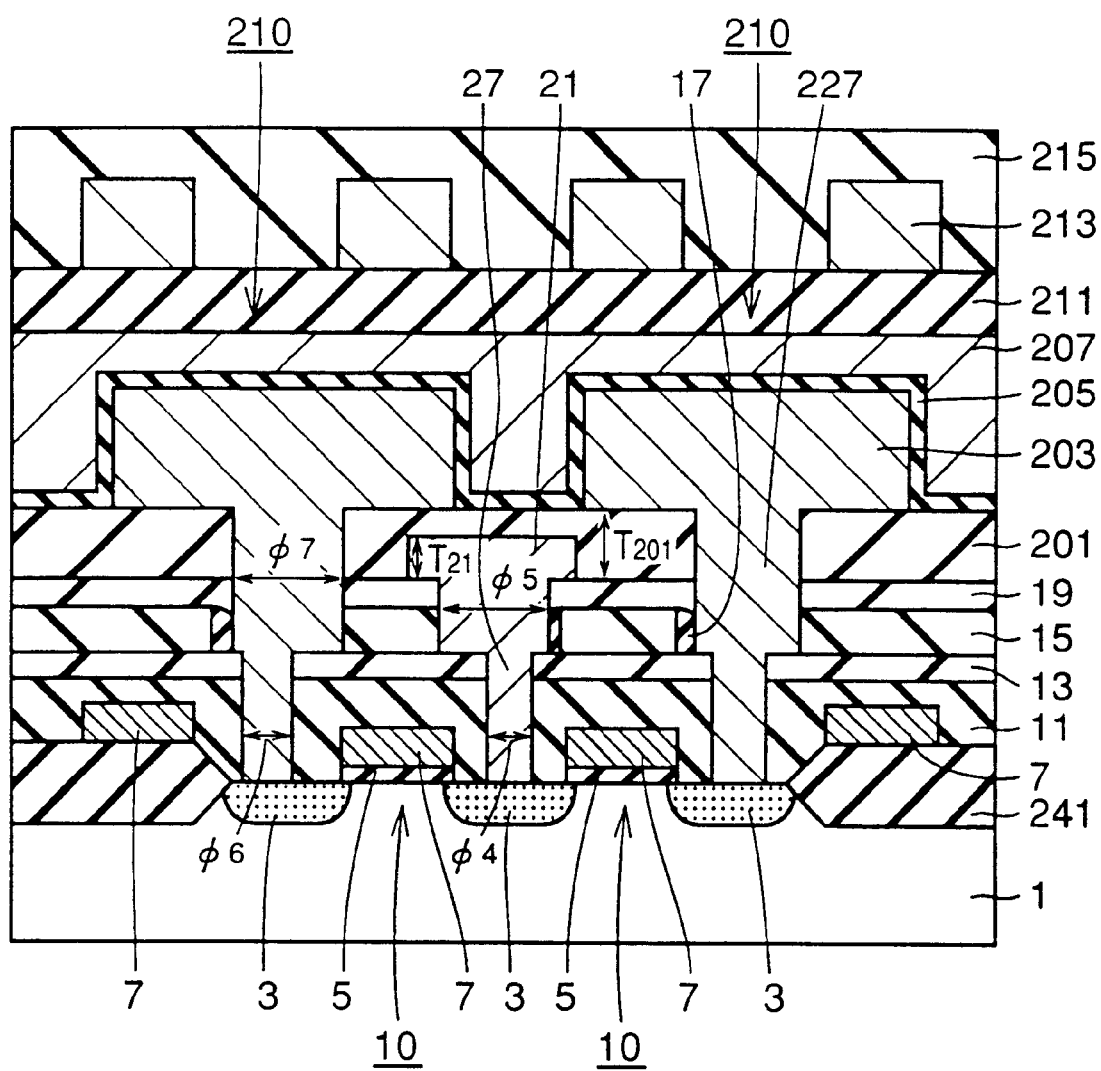
FIG. 14 is a cross sectional view schematically showing a structure of a semiconductor device in accordance with a third embodiment of the present invention.

Referring to FIG. 14, in a region separated by element isolating insulating layer 241 of semiconductor substrate 1, a memory cell of a DRAM is formed. The memory cell has a one transistor one capacitor structure, and it has COB (Capacitor On Bit line) structure.

MOS transistor 10 constituting the memory cell includes a pair of source/drain regions 3, 3, gate insulating layer 5 and gate electrode layer 7. The pair of source/drain regions 3, 3 are formed at the surface of semiconductor substrate 1 spaced by a prescribed distance from each other. Gate electrode layer 7 is formed on the surface of semiconductor substrate 1 sandwiched by the pair of source/drain regions 3, 3 with gate insulating layer 5 interposed.

Interlayer insulating layer 11 of, for example, $SiO_2$ is formed to cover MOS transistor 10. On interlayer insulating layer 11, insulating layer 13 formed, for example, of $Si_3N_4$ or SION is formed. On insulating layer 13, interlayer insulating layer 15 and insulating layer 19 are formed stacked in this order. Interlayer insulating layer 15 is formed, for example, of $SiO_2$, and it has the thickness of 1000 to 2000 Å. Insulating layer 19 is formed, for example, of $SiO_2$, and it has the thickness of 500 to 1000 Å.

Through interlayer insulating layers 11, 15 and insulating layers 13 and 19, a contact hole 27 for a bit line reaching a portion of the surface of source/drain region 3 is formed.

In the portion of interlayer insulating layer 11 and insulating layer 13, contact hole 27 has a first opening diameter φ4 which is smaller than minimum possible dimension formable by photolithography, and it has a second opening diameter φ5 which is larger than the first opening diameter φ4 in the portion of sidewall insulating layer 17 and insulating layer 19. The first opening diameter φ4 is, for example, 0.05 to 0.20 μm, and the second opening diameter 100 5 is, for example, 0.25 to 0.40 μm.

On the sidewall of interlayer insulating layer 15, sidewall insulating layer 17 is formed, for example, by $SiO_2$ to define the shape of the second opening diameter φ5 of contact hole 27.

A bit line 21 is formed on insulating layer 19 to be electrically connected to source/drain region 3 through contact hole 27. Bit line 21 is formed of polycrystalline silicon doped with impurity, metal such as tungsten or an alloy thereof. The film thickness $T_{21}$ of bit line 21 is 1000 to 2000 Å. Interlayer insulating layer 201 is formed, for example, by $SiO_2$ to cover bit line 21. The film thickness $T_{201}$ of interlayer insulating layer 201 is 3000 to 4000 Å.

Through interlayer insulating layers 11, 15, 201 and insulating layers 13 and 19, contact hole 227 for a storage node is formed, reaching a portion at the surface of source/drain region 3 through these insulating layers. Contact hole 227 has a first opening diameter φ6 which is smaller than the minimum possible dimension formable by photolithography in the portion of interlayer insulating layer 11 and insulating layer 13, and has a second opening diameter φ7 larger than the first opening φ6 at the portion of interlayer insulating layers 15, 201, sidewall insulating layer 17 and insulating layer 19. The first opening diameter φ6 of contact hole 227 is, for example, 0.05 to 0.20 μm, and the second opening diameter φ7 is 0.25 to 0.40 μm.

On the sidewall of contact hole 227 of interlayer insulating layer 15, sidewall insulating layer 17 of, for example, $SiO_2$ is left to define the shape of the second opening diameter φ7.

In this manner, on interlayer insulating layer 201, capacitor 210 is formed to be electrically connected to source/drain region 3 through contact hole 227.

Capacitor 210 has storage node (lower electrode layer) 203, capacitor insulating layer 205 and cell plate (upper electrode layer) 207. Storage node 203 is formed on interlayer insulating layer 201 to be electrically connected to source/drain region 3 through contact hole 227. Cell plate 207 is formed to cover storage node 203 with capacitor insulating layer 205 interposed.

Capacitor insulating layer is formed, for example, of $SiO_2$ or $Si_3N_4$ or multi-layered film thereof, and it has the thickness of 10 to 100 Å. Capacitor insulating layer 205 is formed of $TaO_5$, PZT (alloy of P, Zn and Ti), BST (alloy of Ba, Sr, Ti) or BSTO (alloy of Ba, Sr, Ti and O), and the film thickness thereof may be not larger than 1 Å.

Insulating layer 211 is formed to cover capacitor 210. An aluminum interconnection layer 213 is formed on insulating layer 211. A passivation film 215, for example, is formed to cover aluminum interconnection layer 213.

The method of manufacturing the semiconductor device in accordance with the present embodiment will be described.

Figure 15:
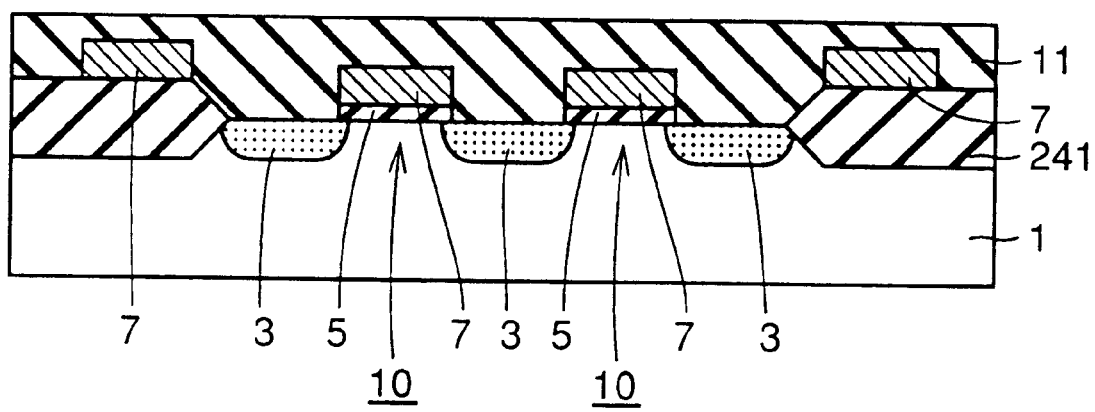
FIGS. 15 to 35 are schematic cross sectional views showing, in order, the steps of manufacturing the semiconductor device in accordance with the third embodiment of the present invention.

First, referring to FIG. 15, in a region isolated by element isolating insulating layer 241 of semiconductor substrate 1, MOS transistor 10 is formed in the similar manner as described in the first embodiment above. An interlayer insulating layer 11 of $SiO_2$ is formed by, for example, reduced pressure CVD method or normal pressure CVD method to cover MOS transistor 10. Planarization by CMP, etch back or reflow is performed on interlayer insulating layer 11.

Figure 16:
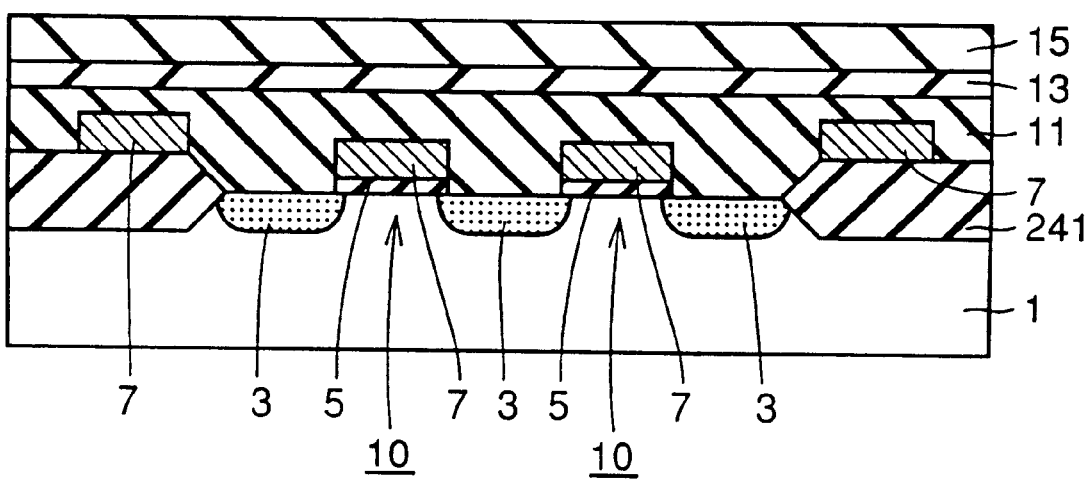

Referring to FIG. 16, on the upper surface of planarized interlayer insulating layer 11, insulating layer 13 of $Si_3N_4$ is formed to the thickness of 100 to 1000 Å by, for example, reduced pressure CVD method or plasma CVD method. On insulating layer 13, interlayer insulating layer 15 of $SiO_2$ is formed by reduced pressure CVD method or normal pressure CVD method.

Figure 17:
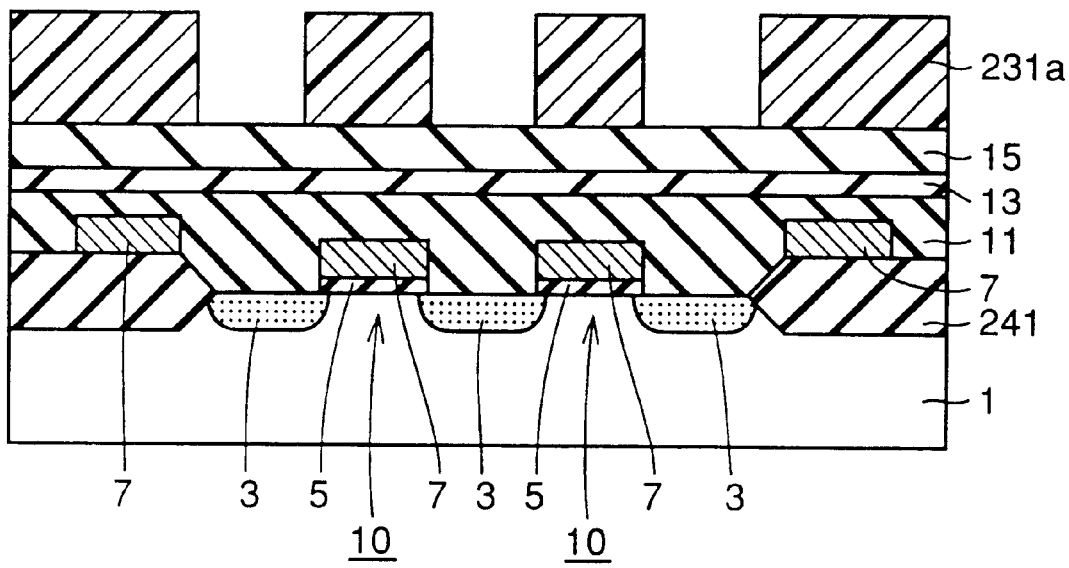

Referring to FIG. 17, on interlayer insulating layer 15, resist pattern 231a having a desired shape is formed by normal photolithography. By using resist pattern 231a as a mask, anisotropic etching is performed on interlayer insulating layer 15.

Figure 18:
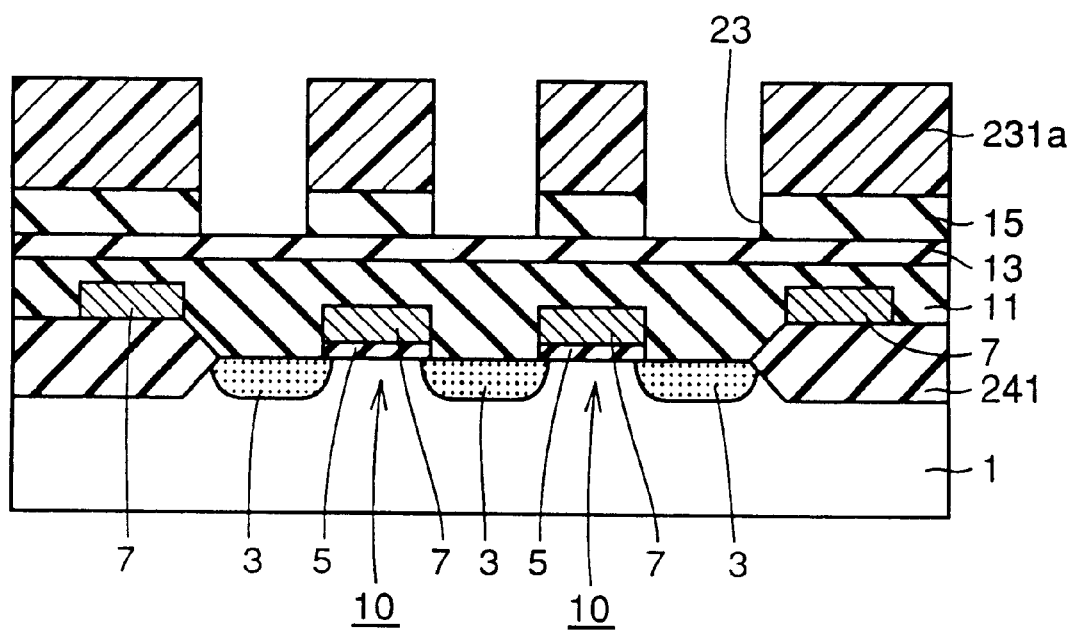

Referring to FIG. 18, by this etching, opening 23 is formed in interlayer insulating layer 15. Thereafter, resist pattern 231a is removed.

Figure 19:
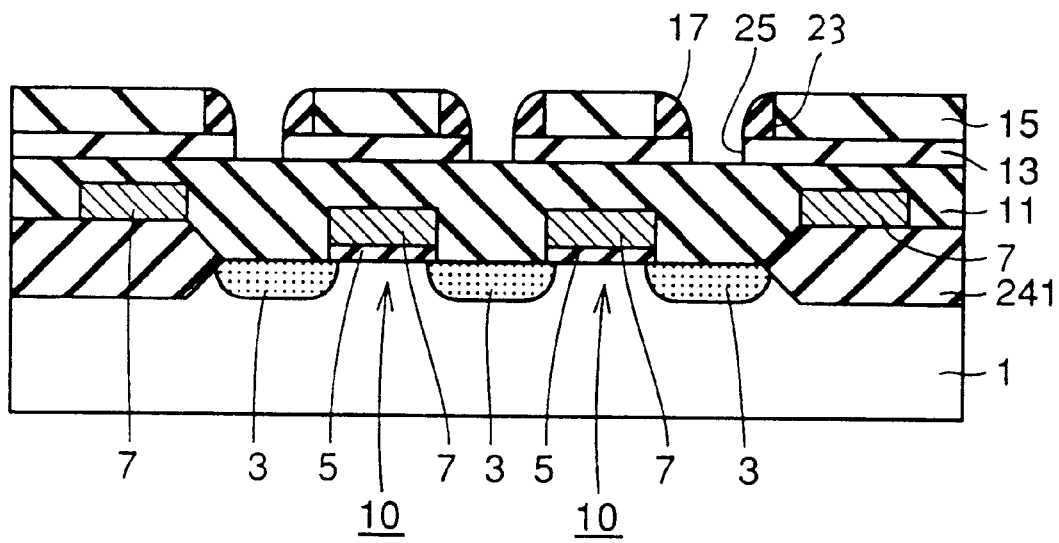

Referring to FIG. 19, on the sidewall of opening 23 in interlayer insulating layer 15, sidewall insulating layer 17 of $SiO_2$ is formed in the similar manner as in the first embodiment. By using sidewall insulating layer 17 and interlayer insulating layer 15 as a mask, insulating layer 13 is anisotropically etched. The etching is anisotropic dry etching in accordance with RIE, for example, and it is performed in a gas atmosphere of $CF_4$, $CF_4$—$H_2$—$N_2$, $SiF_4$ or the like. By this etching, opening 25 is formed in insulating layer 13.

Figure 20:
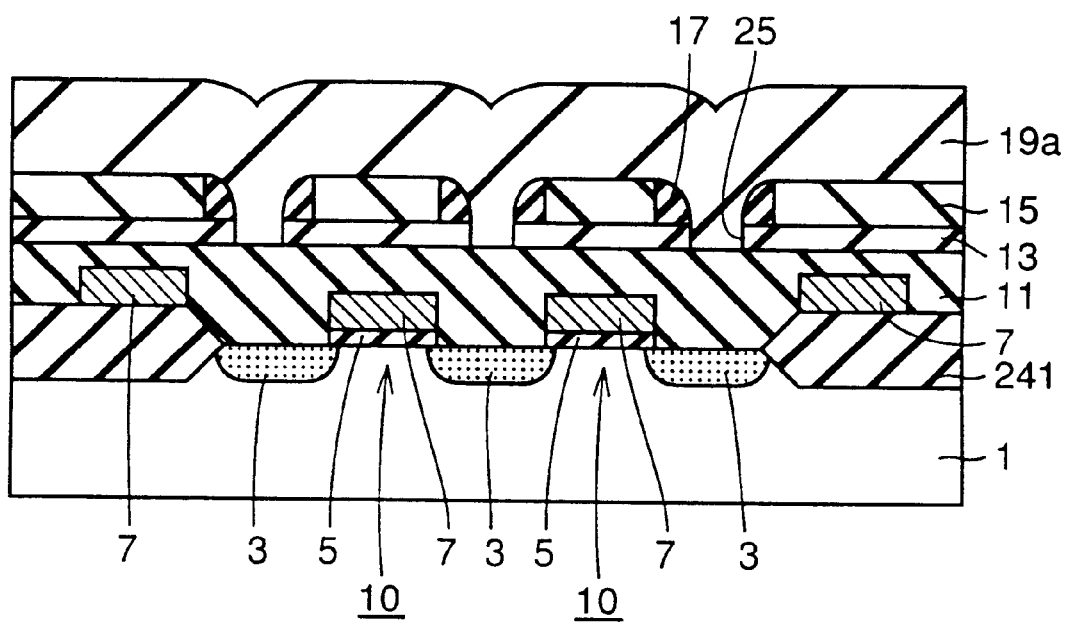

Referring to FIG. 20, insulating layer 19a of $SiO_2$ is formed, for example, by reduced pressure CVD method or normal pressure CVD method to the thickness of 2000 to 3000 Å, to fill the opening 25. The insulating layer 19a is entirely etched back by dry or wet etching. This planarization may be performed by CMP, for example.

Figure 21:
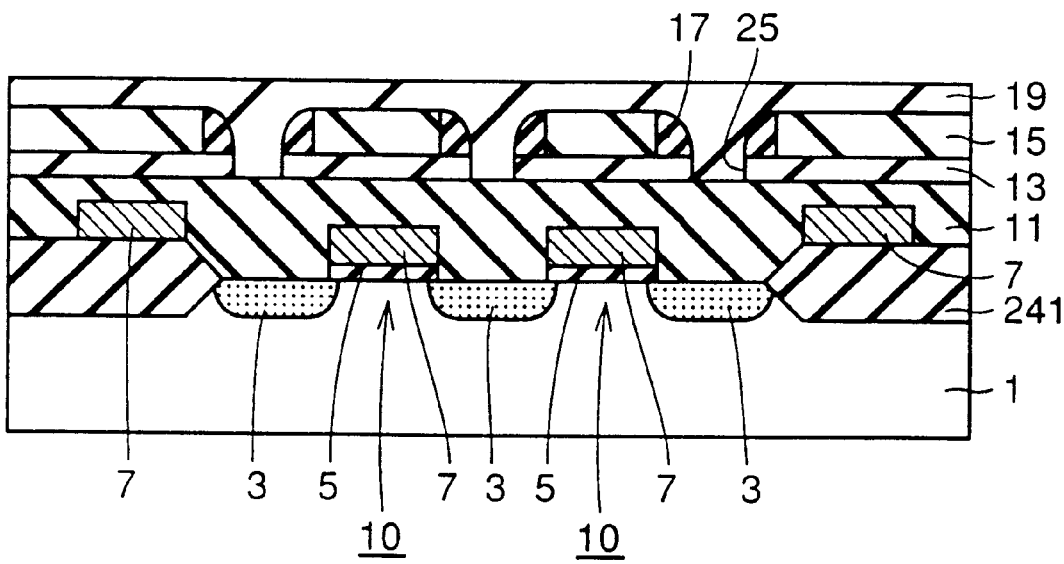

Referring to FIG. 21, by this planarization, insulating layer 19 with planarized upper surface is formed.

Figure 22:
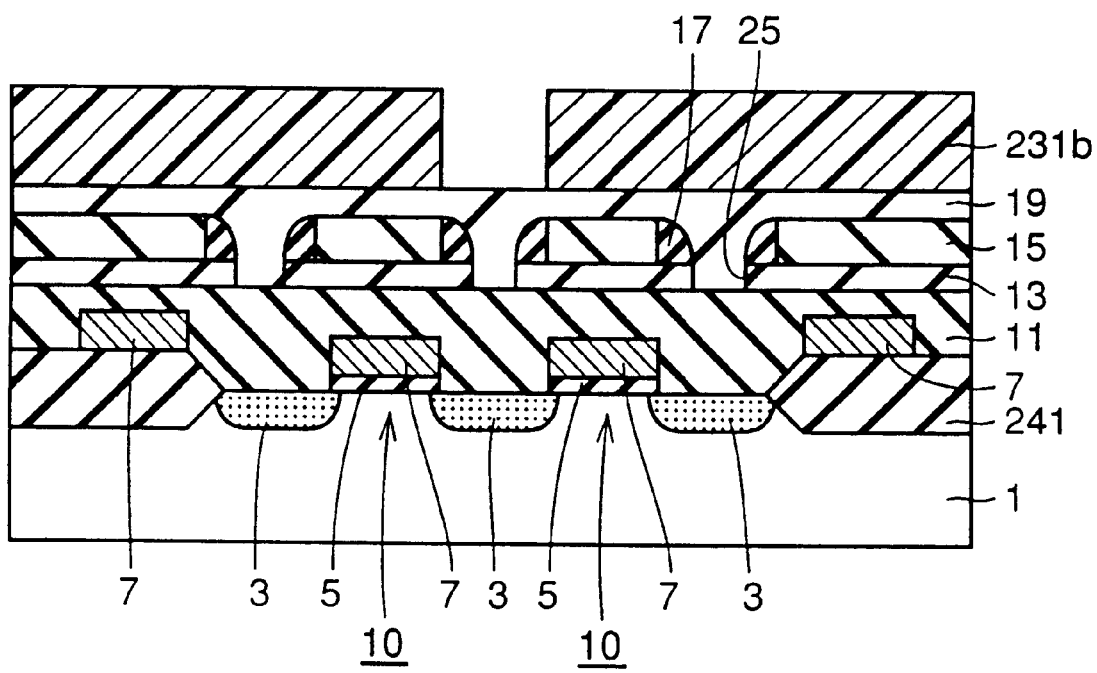

Referring to FIG. 22, on insulating layer 19, resist pattern 231b is formed such that hole pattern is positioned immediately above opening 25, by common photolithography. By using resist pattern 231b as a mask, the lower layer is anisotropically etched. The anisotropic etching is performed under the similar condition as in the first embodiment shown in FIGS. 10 and 11.

Figure 23:
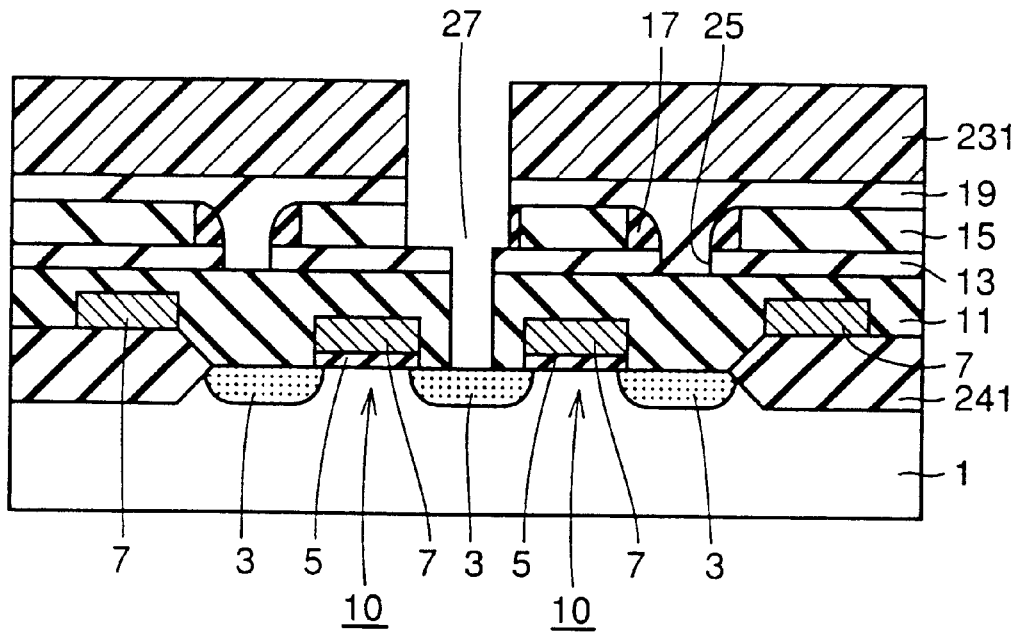

Referring to FIG. 23, by this etching, contact hole 27 reaching source/drain region 3 through interlayer insulating layers 11, 15, insulating layers 13, 19 and sidewall insulating layer 17 is formed. Contact hole 27 has a first opening diameter which is smaller than the minimum possible dimension formable by photolithography in the portion of interlayer insulating layer 11 and insulating layer 13, and has a second opening diameter larger than the first opening diameter in the portion of interlayer insulating layer 15, sidewall insulating layer 17 and insulating layer 19. Thereafter, resist pattern 231 is removed.

Figure 24:
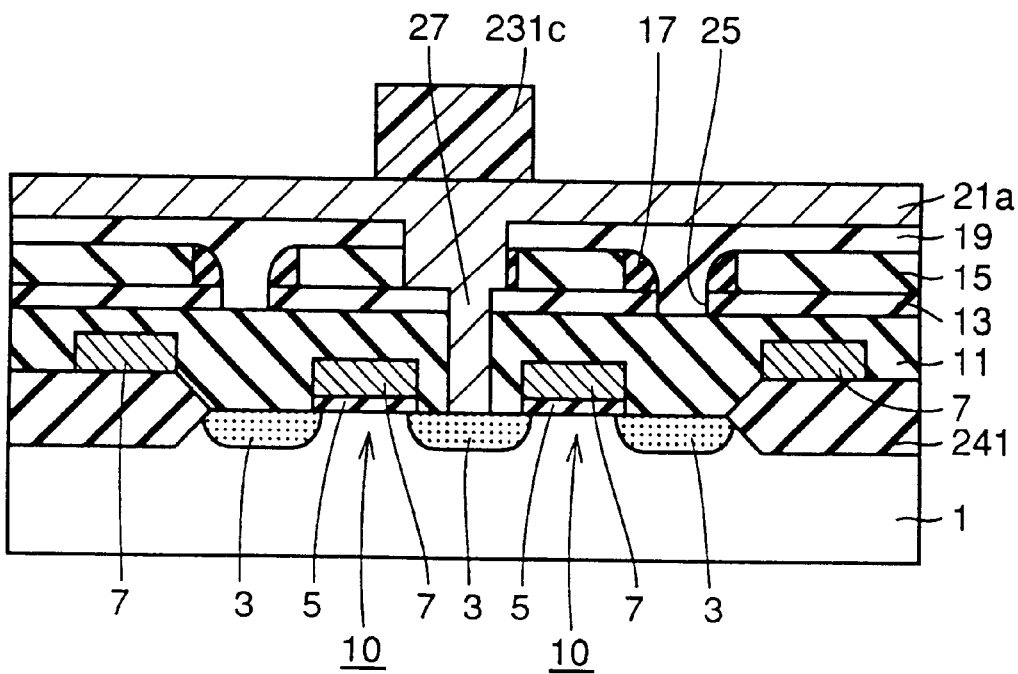

Referring to FIG. 24, conductive layer 21a formed of polycrystalline silicon doped with an impurity such as phosphorus is formed on insulating layer 19 to be electrically connected to source/drain region 3 through contact hole 27. At a desired position of conductive layer 21a, resist pattern 231c is formed. By using resist pattern 231c as a mask, anisotropic etching is performed on conductive layer 21a.

Figure 25:
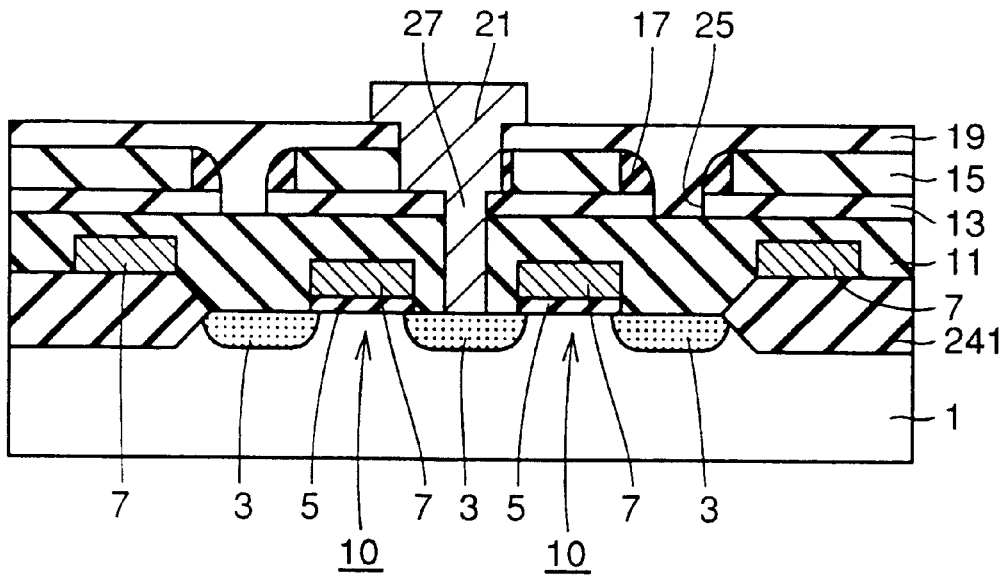

Referring to FIG. 25, by this etching, a bit line 21 electrically connected to source/drain region 3 through contact hole 27 is formed.

Figure 26:
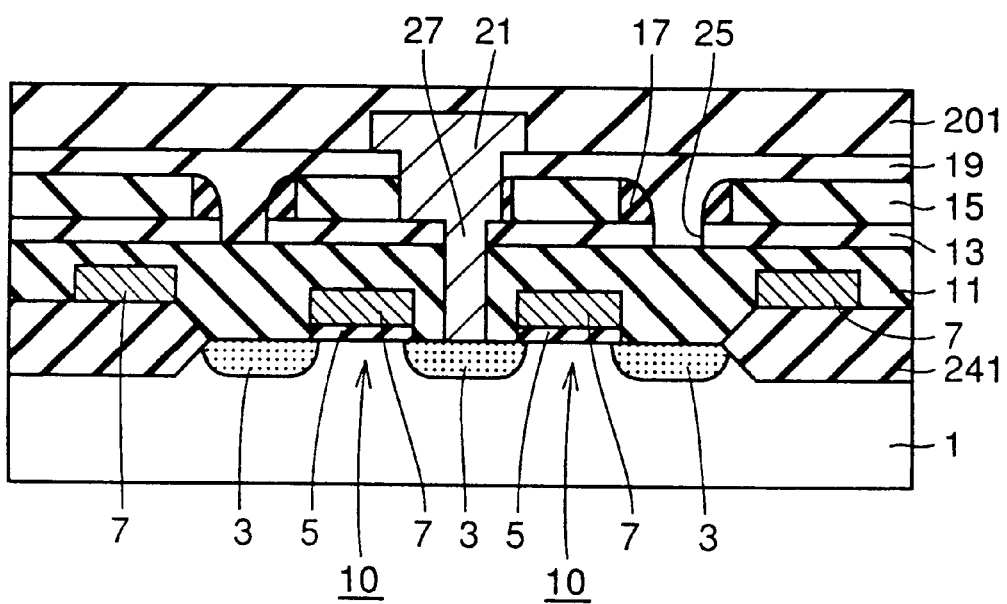

Referring to FIG. 26, interlayer insulating layer 201 of $SiO_2$ is formed by, for example, reduced pressure CVD method or normal pressure CVD method, to cover bit line 21. Interlayer insulating layer 201 has its upper surface planarized by, for example, reflow, etch back or CMP method.

Figure 27:
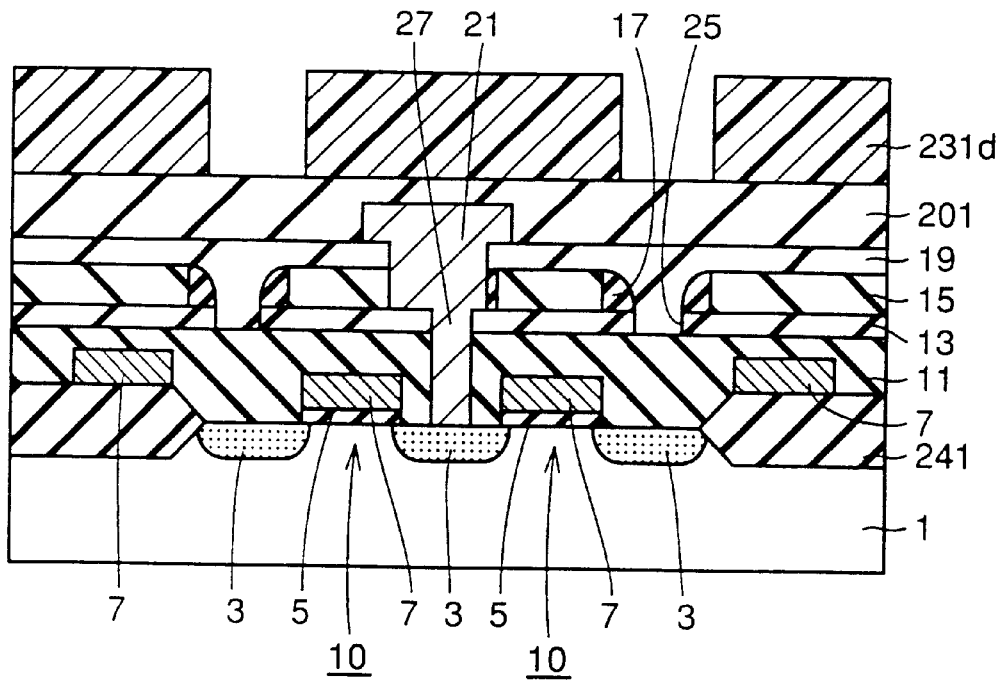

Referring to FIG. 27, on interlayer insulating layer 201, resist pattern 231d having a hole pattern immediately above opening 25 is formed by common photolithography. By using resist pattern 231d as a mask, the lower layer is anisotropically etched. The anisotropic etching is performed under the same condition as in the first embodiment shown in FIGS. 10 and 11.

Figure 28:
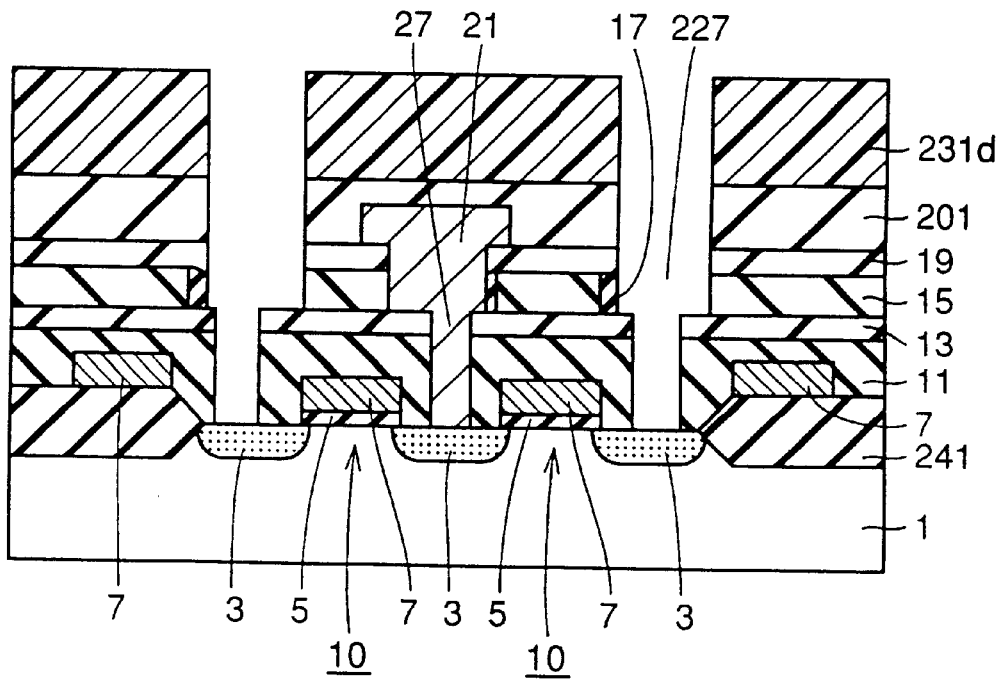

Referring to FIG. 28, by this etching, contact hole 227 reaching source/drain region 3 through interlayer insulating layers 11, 15, 201, insulating layers 13, 19 and sidewall insulating layer 17 is formed. Contact hole 227 has a first opening diameter smaller than the minimum possible dimension formable by photolithography in the portion of interlayer insulating layer 11 and insulating layer 13, and has a second opening diameter larger than the first opening diameter in the portion of interlayer insulating layers 15 and 201, sidewall insulating layer 17 and insulating layer 19. Thereafter, resist pattern 231d is removed.

Figure 29:
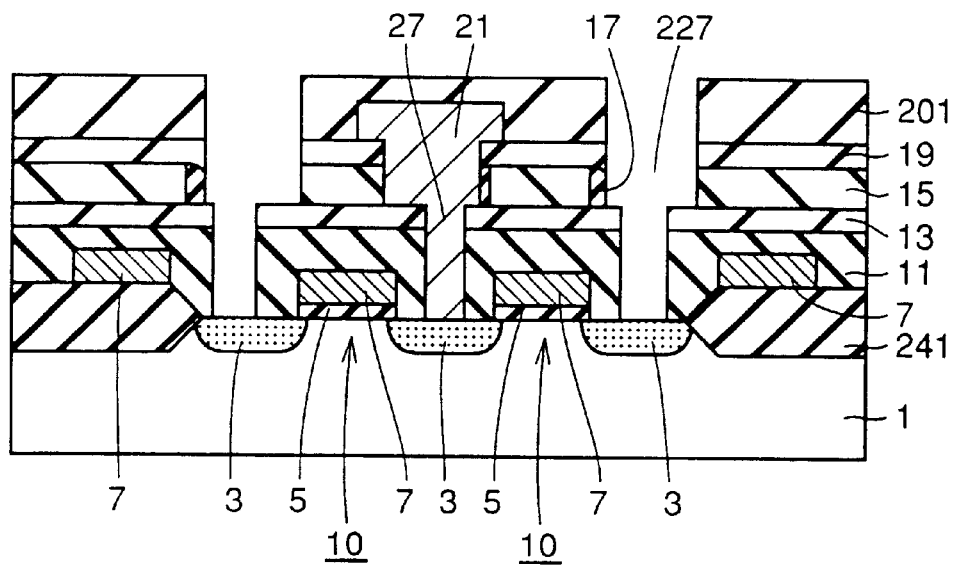

Referring to FIG. 29, as the resist pattern is removed, upper surface of interlayer insulating layer 201 is exposed.

Figure 30:
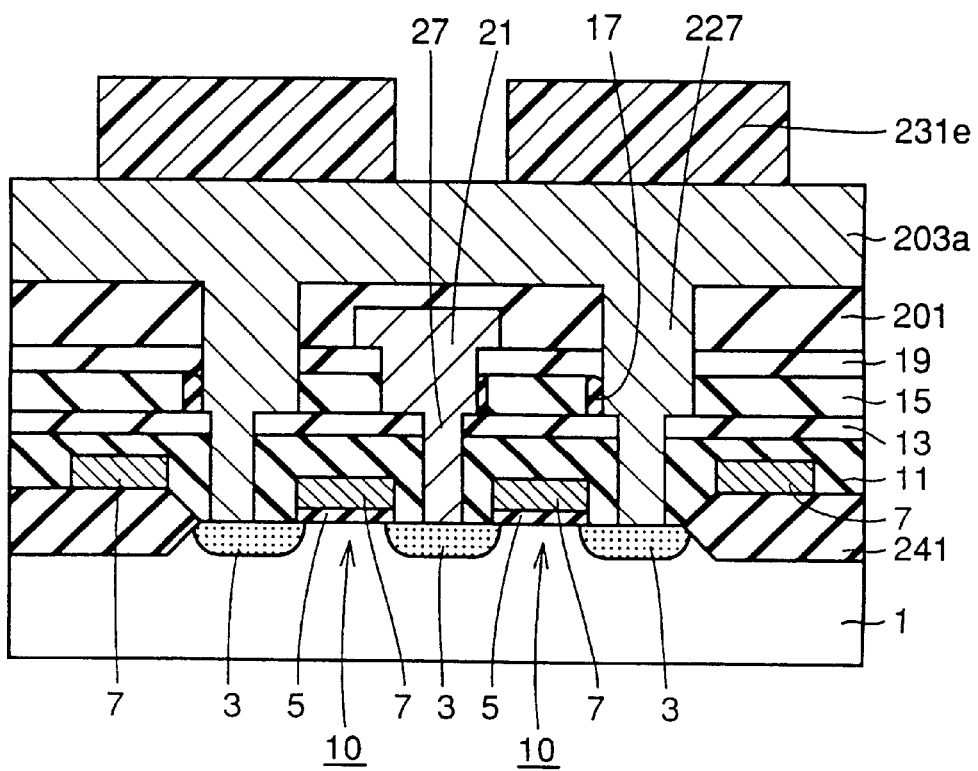

Referring to FIG. 30, conductive layer 203a of polycrystalline silicon doped with an impurity such as phosphorus is formed on interlayer insulating layer 201 to be electrically connected to source/drain 3 through contact hole 227. Conductive layer 203a may be formed of a metal such as tungsten or an alloy thereof. On conductive layer 203a, a resist pattern 231e having a desired shape is formed. By using resist pattern 231e as a mask, conductive layer 203a is anisotropically etched. Thereafter, resist pattern 231e is removed.

Figure 31:
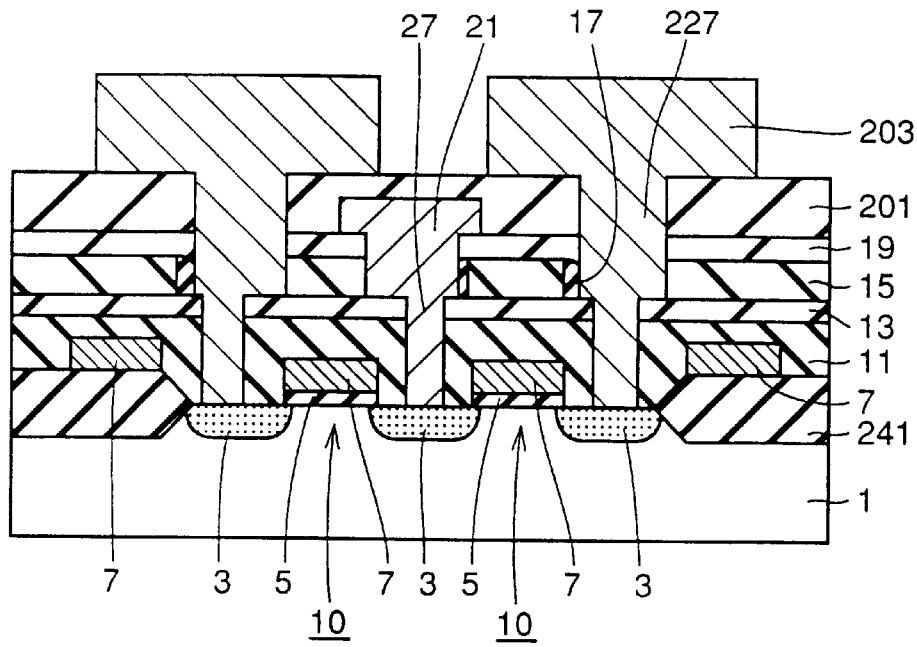

Referring to FIG. 31, by the above described etching, storage node 203 is formed on interlayer insulating layer 201 to be electrically connected to source/drain region 3 through contact hole 227.

Figure 32:
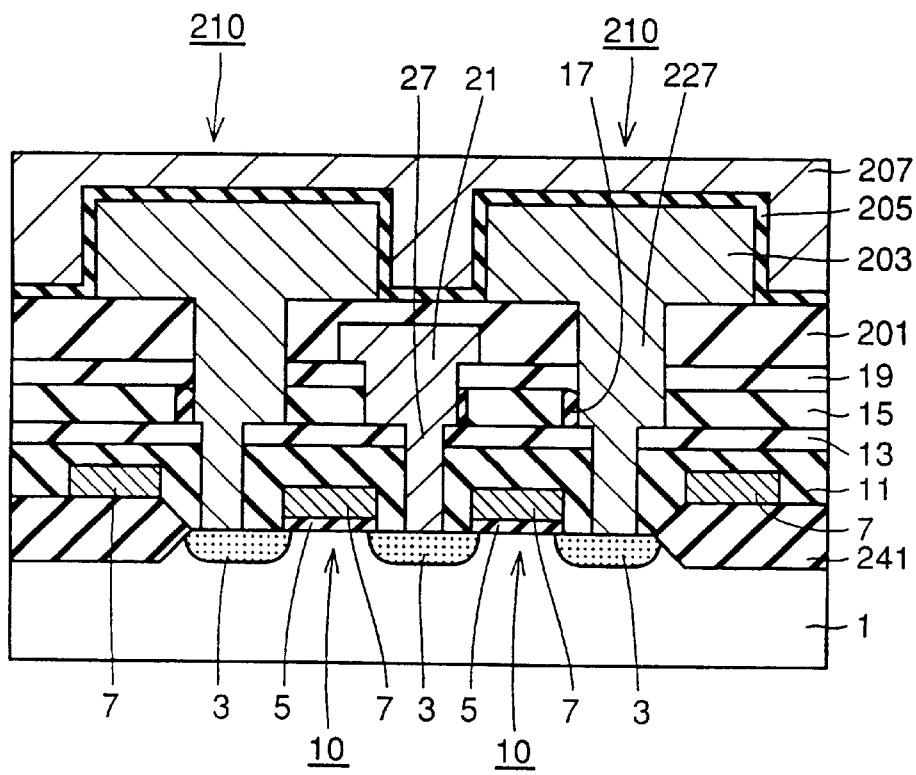

Referring to FIG. 32, capacitor insulating layer 205 is formed to cover storage node 203. A cell plate 207 of, for example, polycrystalline silicon is formed to cover storage node 203 with capacitor insulating layer 205 interposed. Storage node 203, capacitor insulating layer 205 and cell plate 207 constitute capacitor 210.

Figure 33:
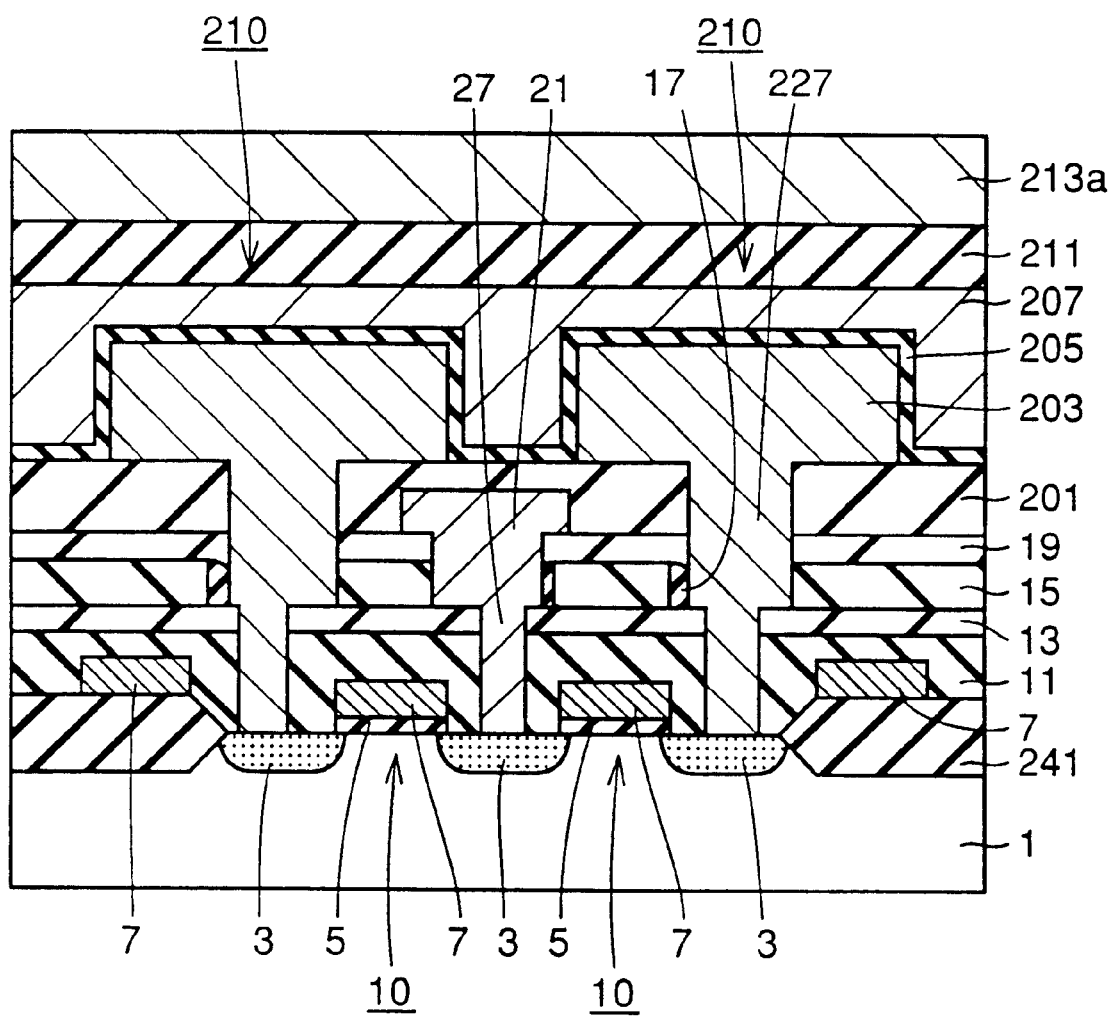

Referring to FIG. 33, insulating layer 211 is formed to cover cell plate 207, and aluminum layer 213a is formed on insulating layer 211.

Figure 34:
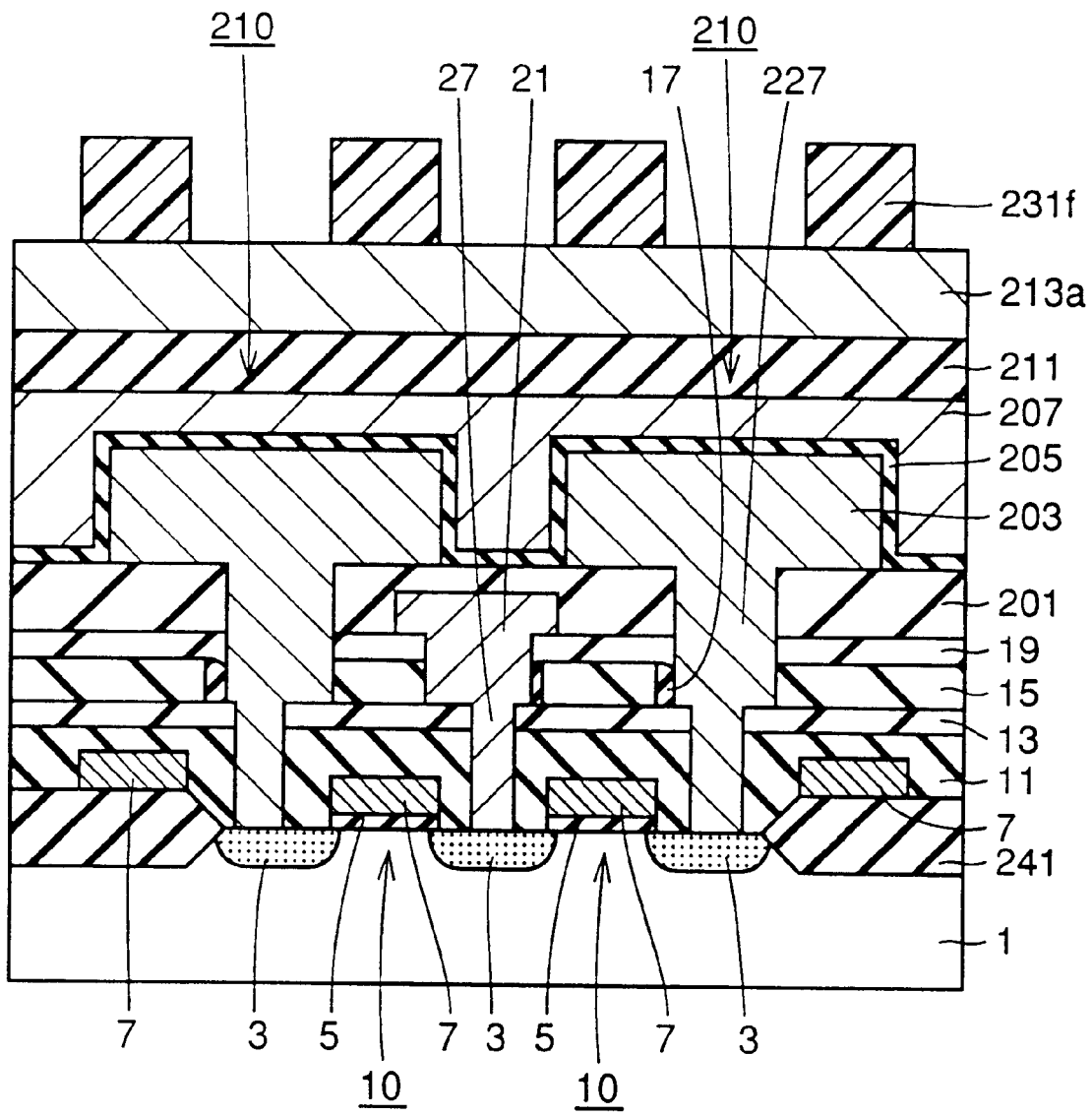

Referring to FIG. 34, resist pattern 231f is formed on aluminum layer 213a. By using resist pattern 231f as a mask, aluminum layer 213a is anisotropically etched. Thereafter, resist pattern 231f is removed.

Figure 35:
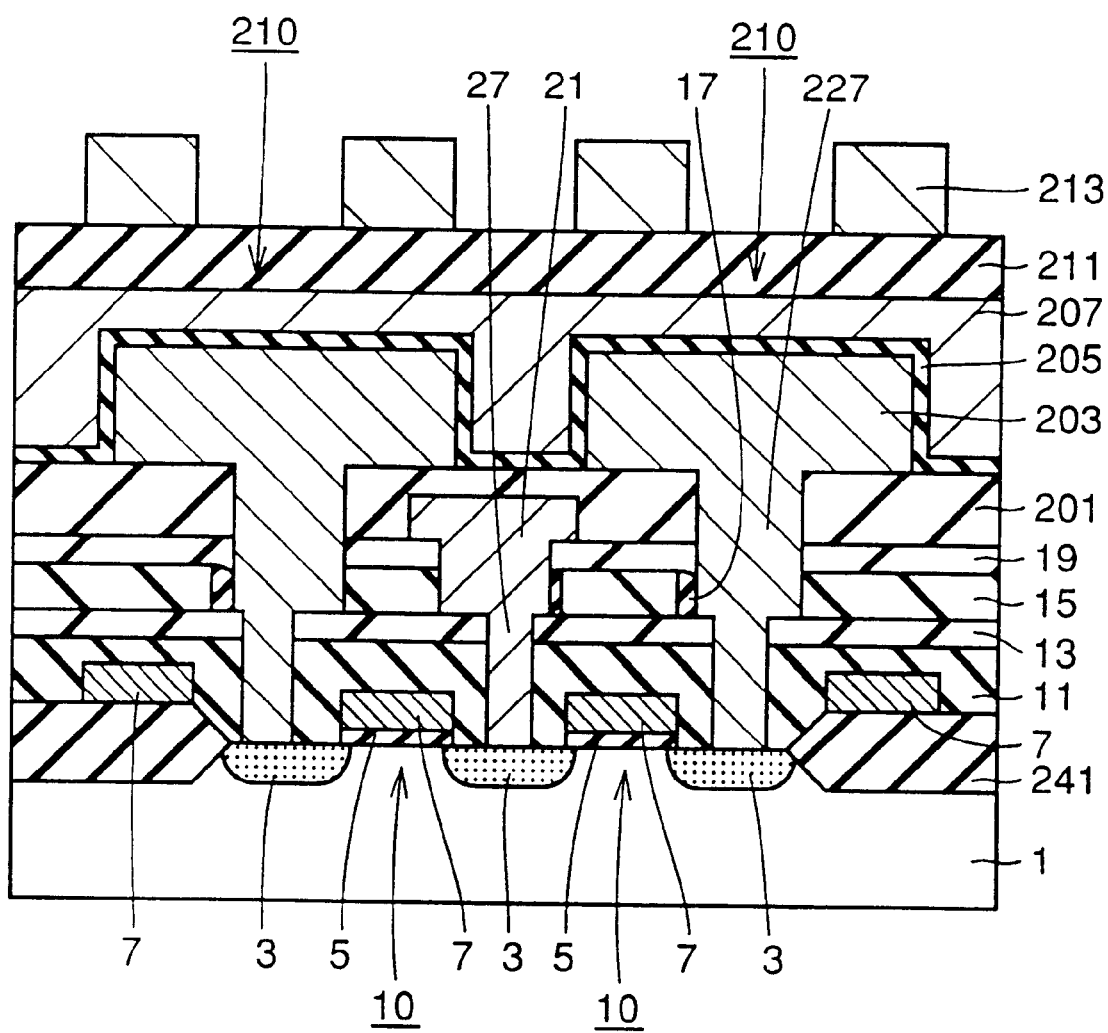

Referring to FIG. 35, by the above described etching, aluminum interconnection layer 213 having a desired shape is formed. Thereafter, a passivation film 211 is formed to cover aluminum interconnection layer 213, and thus the semiconductor device shown in FIG. 14 is completed.

In the present embodiment, in the step shown in FIG. 19, openings 25 for the bit line and the storage node are formed simultaneously. Therefore, when contact hole 227 for the storage node is to be formed as shown in FIGS. 27 and 28, what is necessary is only to form resist pattern 231d having a hole pattern immediately above opening 25 and to etch the underlying insulating layer using resist pattern 231d as a mask.

Opening 25 has a diameter smaller than the minimum possible dimension formable by photolithography. Therefore, the opening diameter of contact hole 227 in interlayer insulating layer 11 formed by etching using insulating layer 13 can be smaller than the minimum possible dimension formable by photolithography.

In this manner, by once forming an opening in an insulating layer having different etch rate from the underlying insulating layer, it becomes possible to form contact hole 227 having small diameter in the interlayer insulating layer 11 without the necessity of repeating troublesome steps required in the prior art.

Further, opening diameter of contact hole formed in a region sandwiched by gate electrode layers 7, 7 can be made smaller than the minimum possible dimension formable by photolithography. Therefore, exposure of gate electrode layer through contact holes 27 and 227 can be prevented. Therefore, a semiconductor device including DRAMs which are suitable for higher degree of integration can be provided.

The contact hole for the storage node may be formed by repeating the steps shown in FIGS. 18 to 24 after bit line 21 is formed. The structure of the semiconductor device in this case is as shown in FIG. 36.

Figure 36:
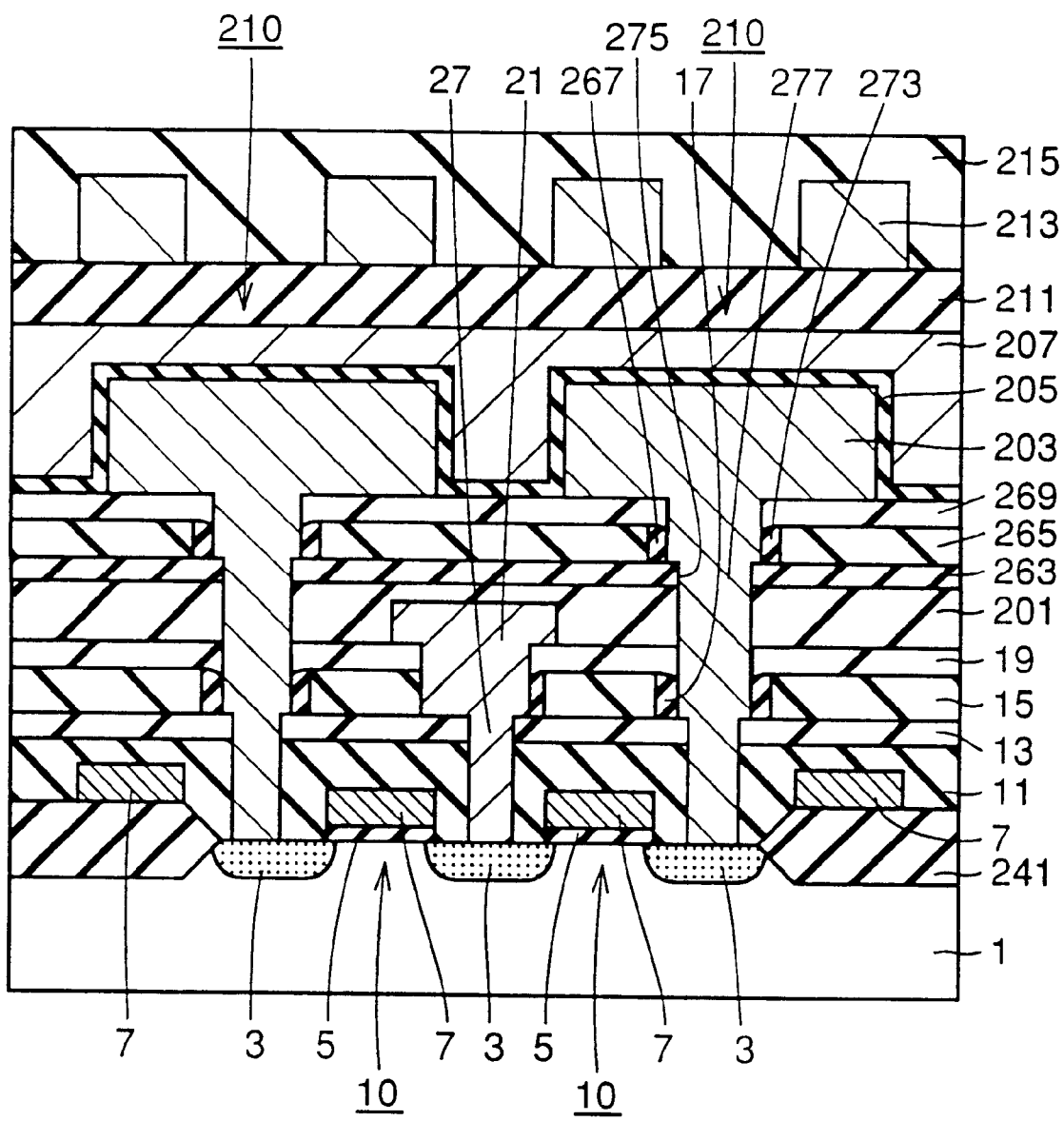
FIG. 36 is a cross sectional view schematically showing the structure of a semiconductor device in accordance with a modification of the third embodiment of the present invention.

Referring to FIG. 36, an interlayer insulating layer 201 of, for example, $SiO_2$ is formed to cover bit line 21. On interlayer insulating layer 201, insulating layer 263 of, for example, $Si_3N_4$ is formed. On insulating layer 263, interlayer insulating layer 265 of, for example, $SiO_2$ is formed. On interlayer insulating layer 265, insulating layer 269 of, for example, $SiO_2$ is formed.

Contact hole 277 reaching the surface of semiconductor substrate 1 from insulating layer 269 is formed. Contact hole 277 has a first opening diameter smaller than minimum possible dimension formable by photolithography in the portion of interlayer insulating layer 11 and insulating layer 13, a second opening diameter larger than the first opening diameter in a portion of interlayer insulating layers 15, 201, insulating layers 19, 263 and sidewall insulating layer 17, and has a third opening diameter larger than the second opening diameter at a portion of interlayer insulating layer 265, insulating layer 269 and sidewall insulating layer 273. Storage node 203 is formed to be electrically connected to source/drain region 3 through contact hole 277.

In the step shown in FIGS. 18 to 24, interlayer insulating layer 11 corresponds to interlayer insulating layer 201 of the present embodiment, insulating layer 13 corresponds to insulating layer 263, interlayer insulating layer 15 corresponds to interlayer insulating layer 265, sidewall insulating layer 17 corresponds to sidewall insulating layer 273 and insulating layer 19 corresponds to insulating layer 269 of the present embodiment.

Fourth Embodiment

Figure 37:
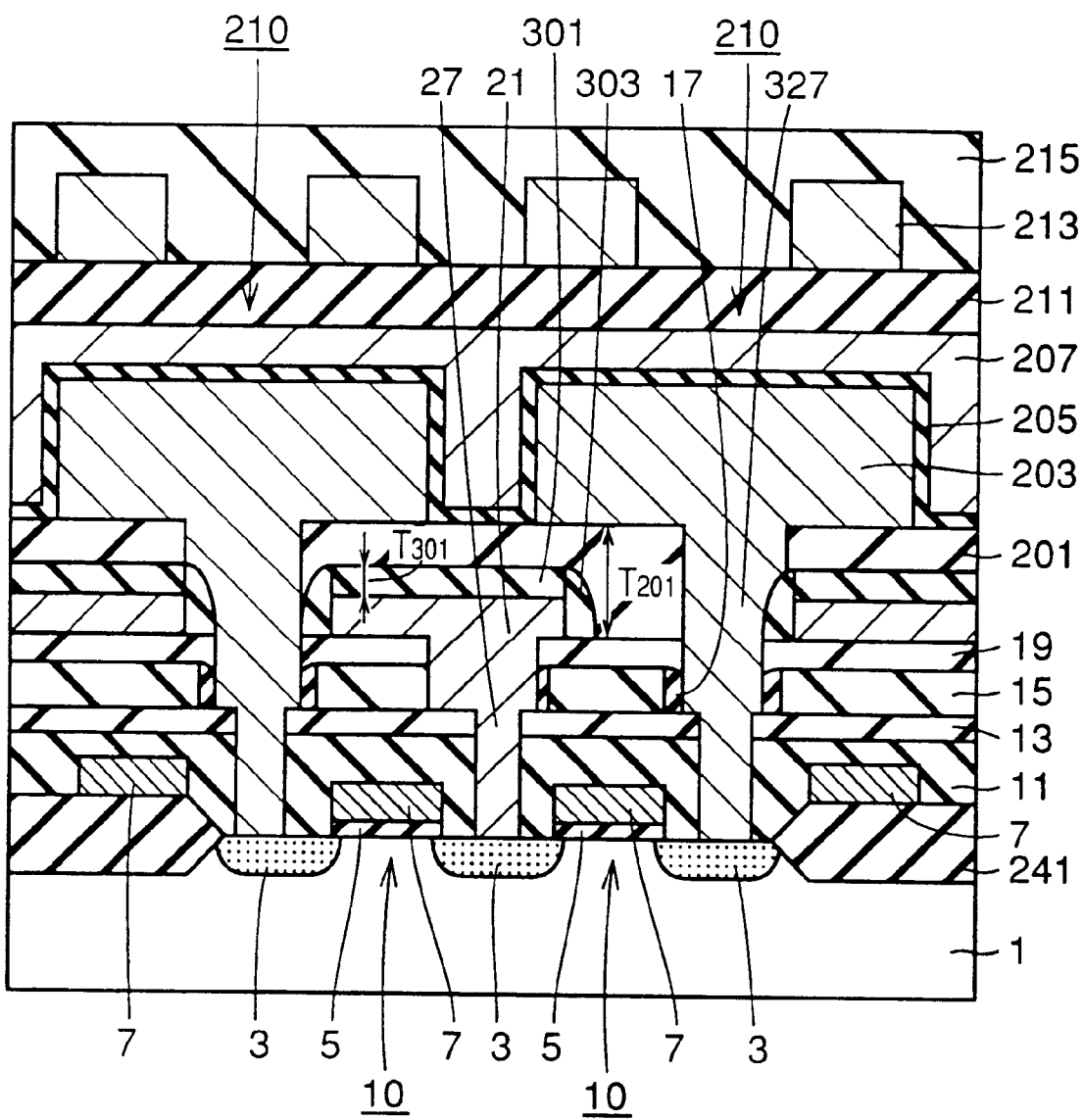
FIG. 37 is a cross sectional view schematically showing a structure of a semiconductor device in accordance with a fourth embodiment of the present invention.

Referring to FIG. 37, in a region isolated by element isolating insulating layer 241 of semiconductor substrate 1, a memory cell of a DRAM having COB structure is formed.

The structure of the semiconductor device in accordance with the present embodiment differs from the third embodiment in that the upper surface of bit line 21 is covered by an insulating layer 301 formed, for example, of $Si_3N_4$, and that sidewalls of bit line 21 is covered by a sidewall insulating layer 303 of $Si_3N_4$.

The thickness of insulating layer 301 is 500 to 1000 Å, and thickness $T_{201}$ of interlayer insulating layer 201 in this case is 3500 to 5000 Å.

Except these points, the structure is the same as that of the third embodiment, and therefore corresponding portions are denoted by the corresponding reference characters and description thereof is not repeated.

A method of manufacturing the semiconductor device in accordance with the present embodiment will be described.

Figure 38:
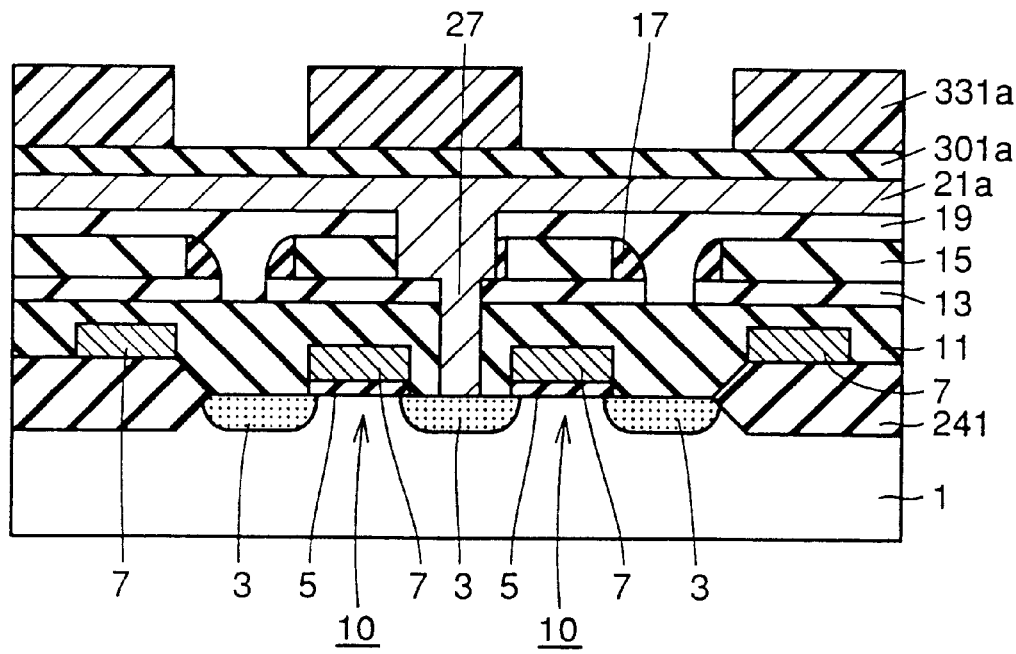
FIGS. 38 to 50 are schematic cross sectional views showing, in order, the steps of manufacturing the semiconductor device in accordance with the fourth embodiment of the present invention.

The method of manufacturing in accordance with the present embodiment includes the same steps as the third embodiment shown in FIGS. 15 to 23. Thereafter, resist pattern 231 is removed. Then, referring to FIG. 38, conductive layer 21a of polycrystalline silicon is formed on interlayer insulating layer 19 to be electrically connected to source/drain region 3 through contact hole 27. On conductive layer 21a, insulating layer 301a of, for example, $Si_3N_4$ is formed to the thickness of, for example 500 to 1000 Å. On insulating layer 301a, resist pattern 331a having a desired shape is formed. By using resist pattern 331a as a mask, insulating layer 301a and conductive layer 21a are etched successively. Etching of insulating layer 301a is anisotropic dry etching in accordance with RIE, performed in a gas atmosphere of $CF_4$, $CF_4$—$H_2$, $C_3F_8$, $CF_4$—$H_2$—$N_2$, $SiF_4$ or the like. Etching of conductive layer 21a is anisotropic dry etching in accordance with RIE, and performed in a gas atmosphere of $CF_4$, $CC_{12}F_2$, $CC_{14}$, $SF_6$, $CF_4$—H or the like.

Figure 39:
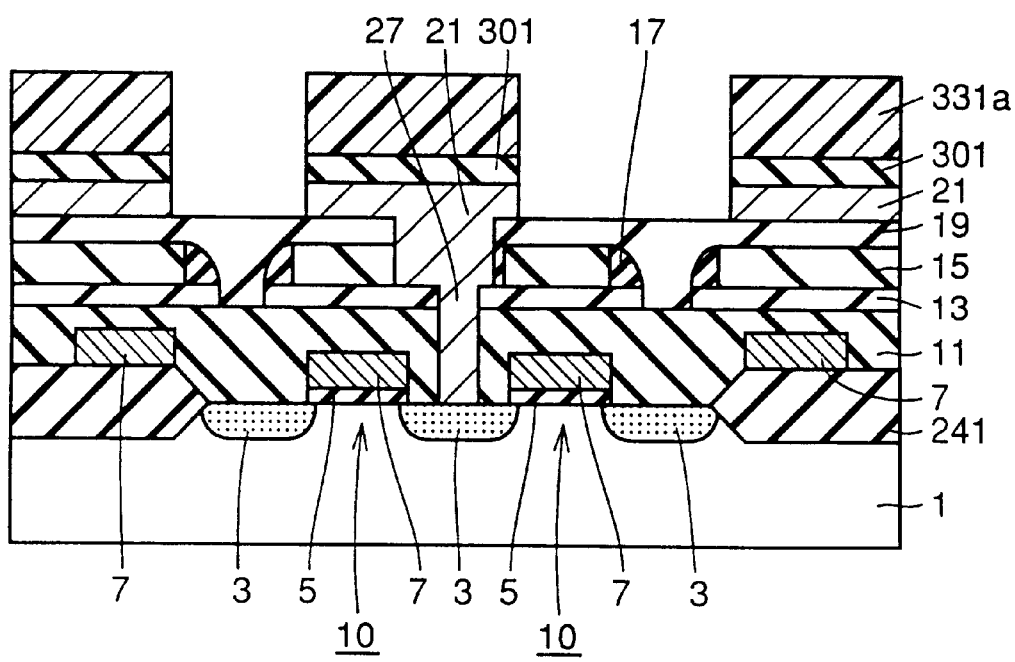

Referring to FIG. 39, by this etching, bit line 21 is formed to have a desired shape. Insulating layer 301 is left only on the upper surface of bit line 21. Thereafter, resist pattern 331a is removed.

Figure 40:
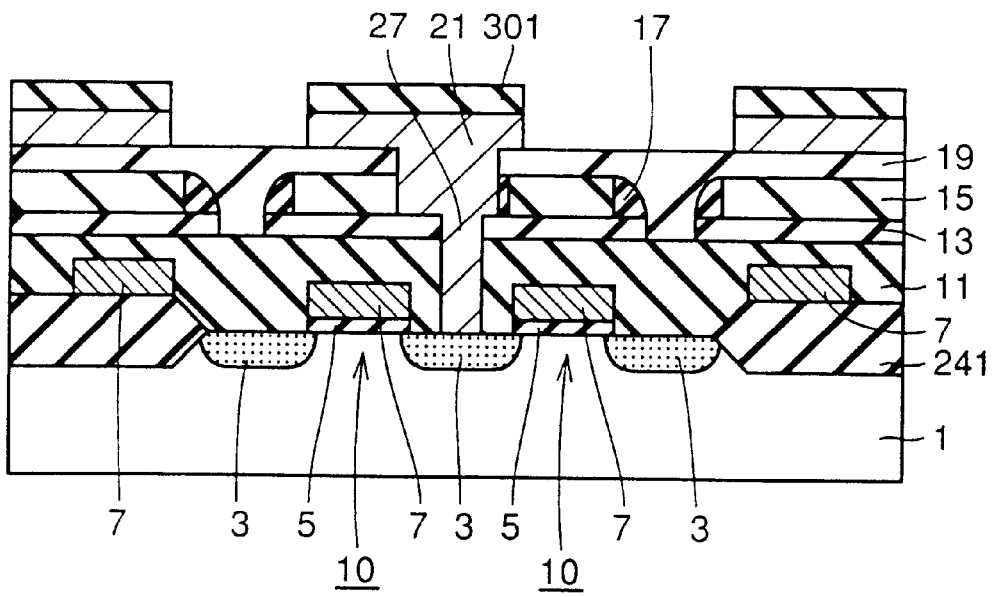

Referring to FIG. 40, as the resist pattern is removed, upper surface of insulating layer 301 is exposed.

Figure 41:
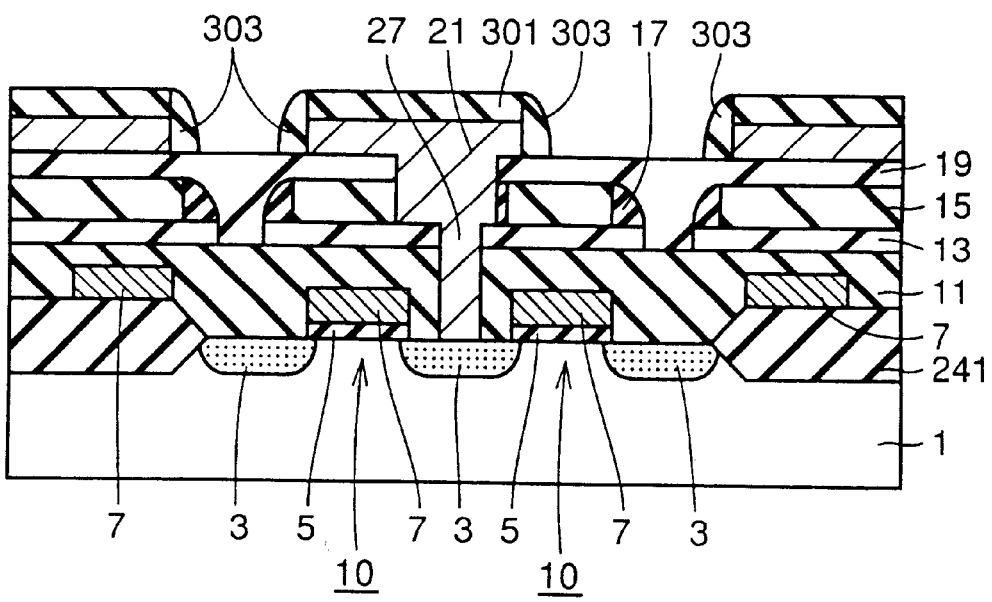

Referring to FIG. 41, on the entire surface, insulating layer 303 of, for example, $Si_3N_4$ is formed. The insulating layer 303 is subjected to anisotropic dry etching in accordance with, for example, RIE, in a gas atmosphere of $CF_4$, $CF_4$—$H_2$, $C_3F_8$, $CF_4$—$H_2$—$N_2$, $SiF_4$ or the like. Consequently, sidewall insulating layer 303 is formed by $Si_3N_4$ to cover bit line 21 and sidewalls of insulating layer 301.

Figure 42:
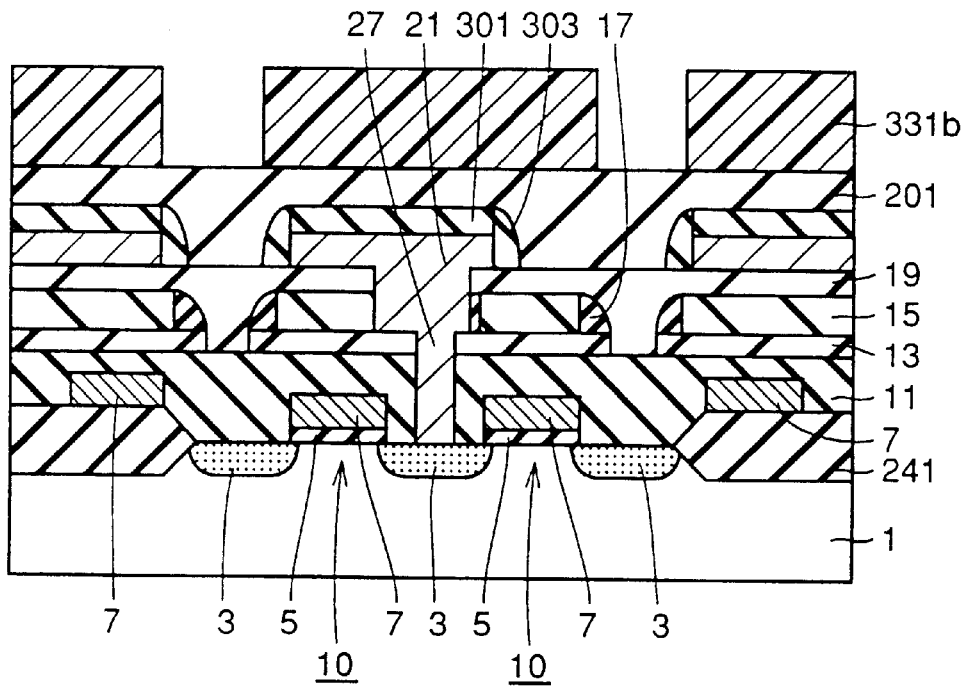

Referring to FIG. 42, interlayer insulating layer 201 of $SiO_2$ is formed by, for example, reduced pressure CVD method or normal pressure CVD method, to cover bit line 21. Interlayer insulating layer 201 is planarized by reflow, etch back or CMP method. By this planarization, interlayer insulating layer 201 having planarized upper surface is obtained. A resist pattern 331b having a desired shape is formed on interlayer insulating layer 201.

Figure 43:
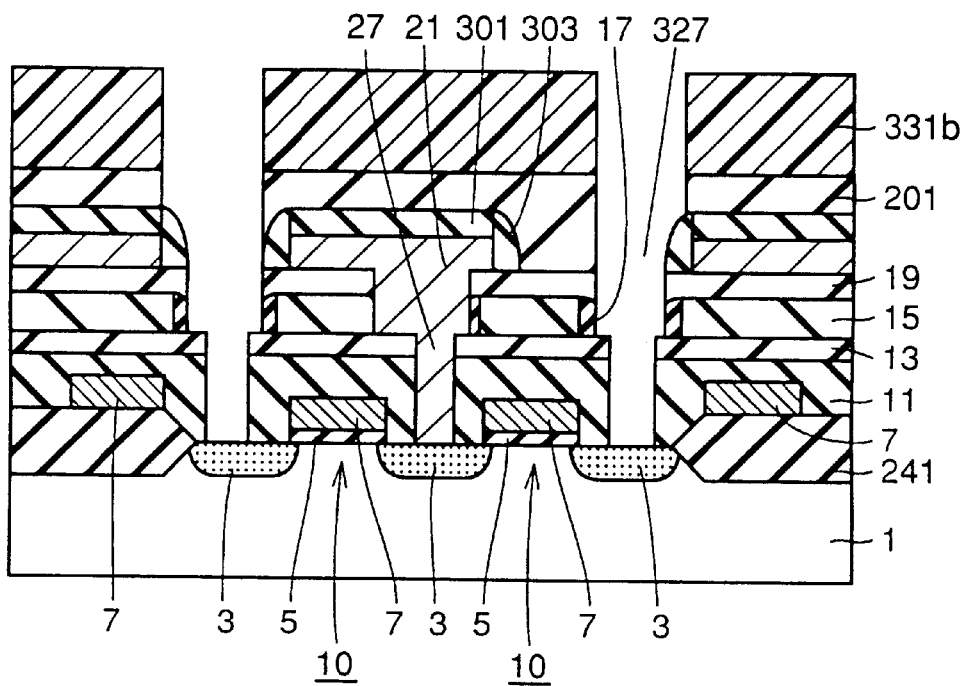

Referring to FIG. 43, by using resist pattern 331b as a mask, underlying insulating layer is etched. This etching is performed under the same condition as in the first embodiment described with reference to FIGS. 10 and 11. Consequently, a contact hole 327 reaching the semiconductor substrate 1 from interlayer insulating layer 201 is formed. Contact hole 327 has a first opening diameter which is smaller than minimum possible dimension formable by photolithography in the portion of interlayer insulating layer 11 and insulating layer 13, a second opening diameter larger than the first opening diameter in the portion of interlayer insulating layer 15 and insulating layer 19, and has a third opening diameter larger than the second opening diameter in the portion of interlayer insulating layer 201. Thereafter, resist pattern 331b is removed.

Figure 44:
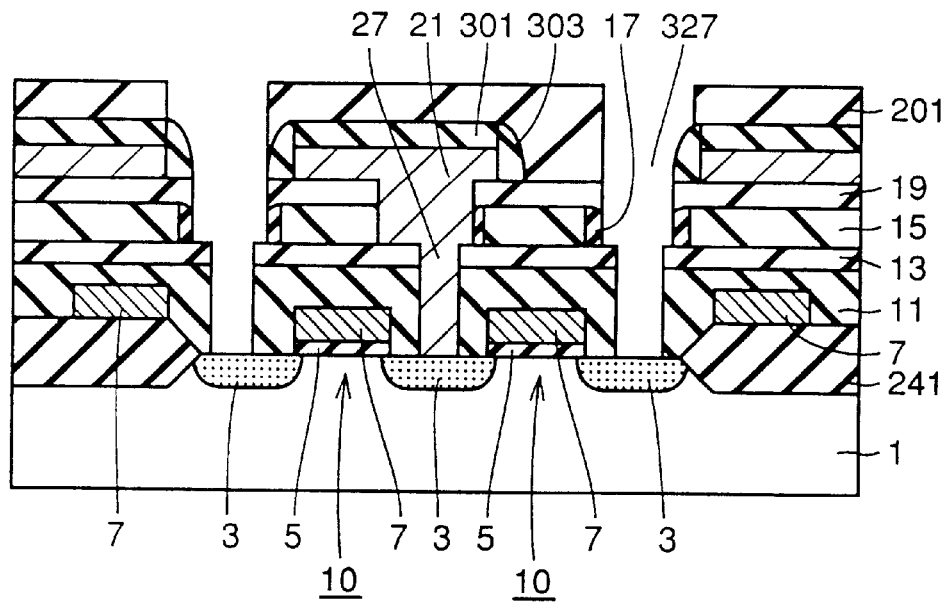

Referring to FIG. 44, as the resist pattern is removed, upper surface of interlayer insulating layer 201 is exposed.

Figure 45:
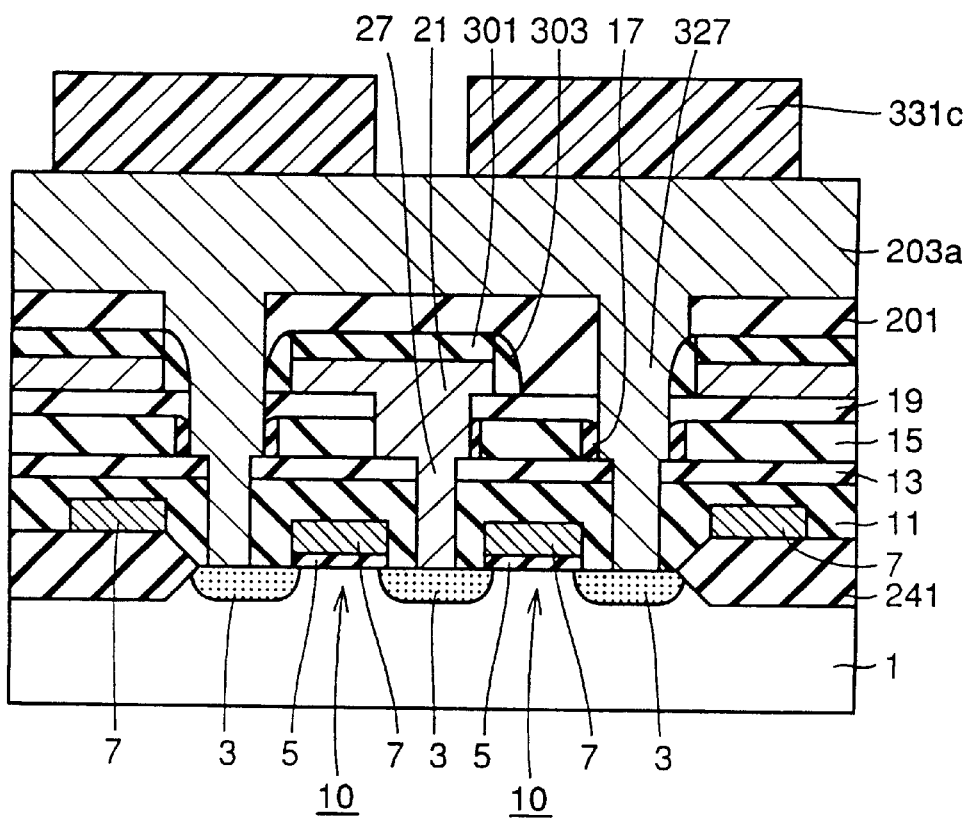

Referring to FIG. 45, conductive layer 203a of polycrystalline silicon doped with an impurity such as phosphorus is formed on interlayer insulating layer 201 to be electrically connected to source/drain region 3 through contact hole 327. The conductive layer 203a may be formed of a metal such as tungsten or an alloy thereof. A resist pattern 331c having a desired shape is formed on conductive layer 203a. Conductive layer 203a is etched using resist pattern 331c as a mask.

Figure 46:
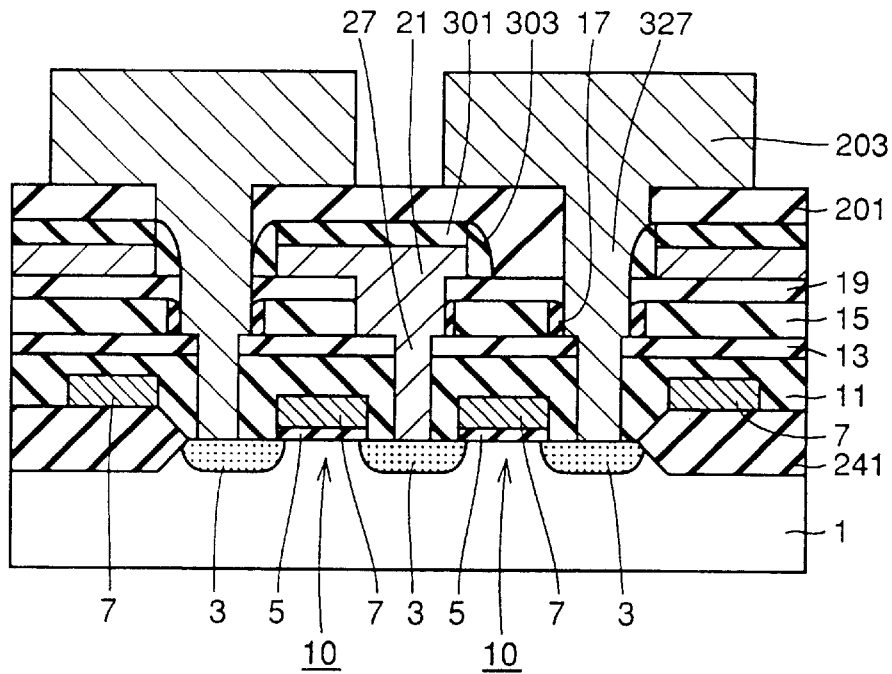

Referring to FIG. 46, by this etching, storage node 203 having a desired shape is formed.

Figure 47:
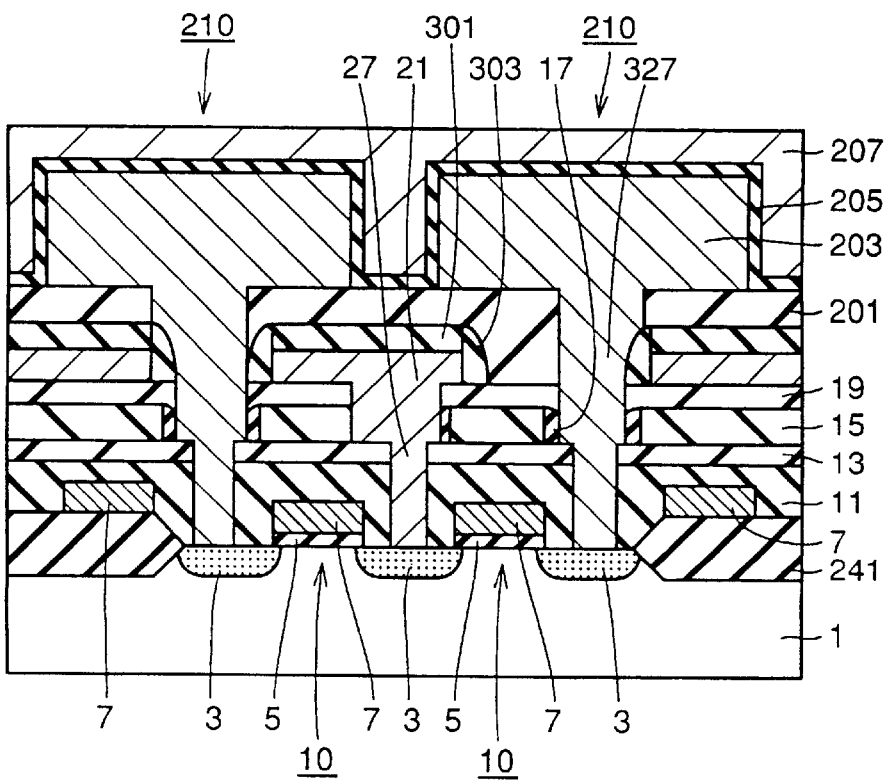

Referring to FIG. 47, capacitor insulating layer 205 is formed to cover storage node 203. A cell plate 207 formed, for example, of polycrystalline silicon doped with an impurity is formed to cover storage node 203 with capacitor insulating layer 205 interposed.

Figure 48:
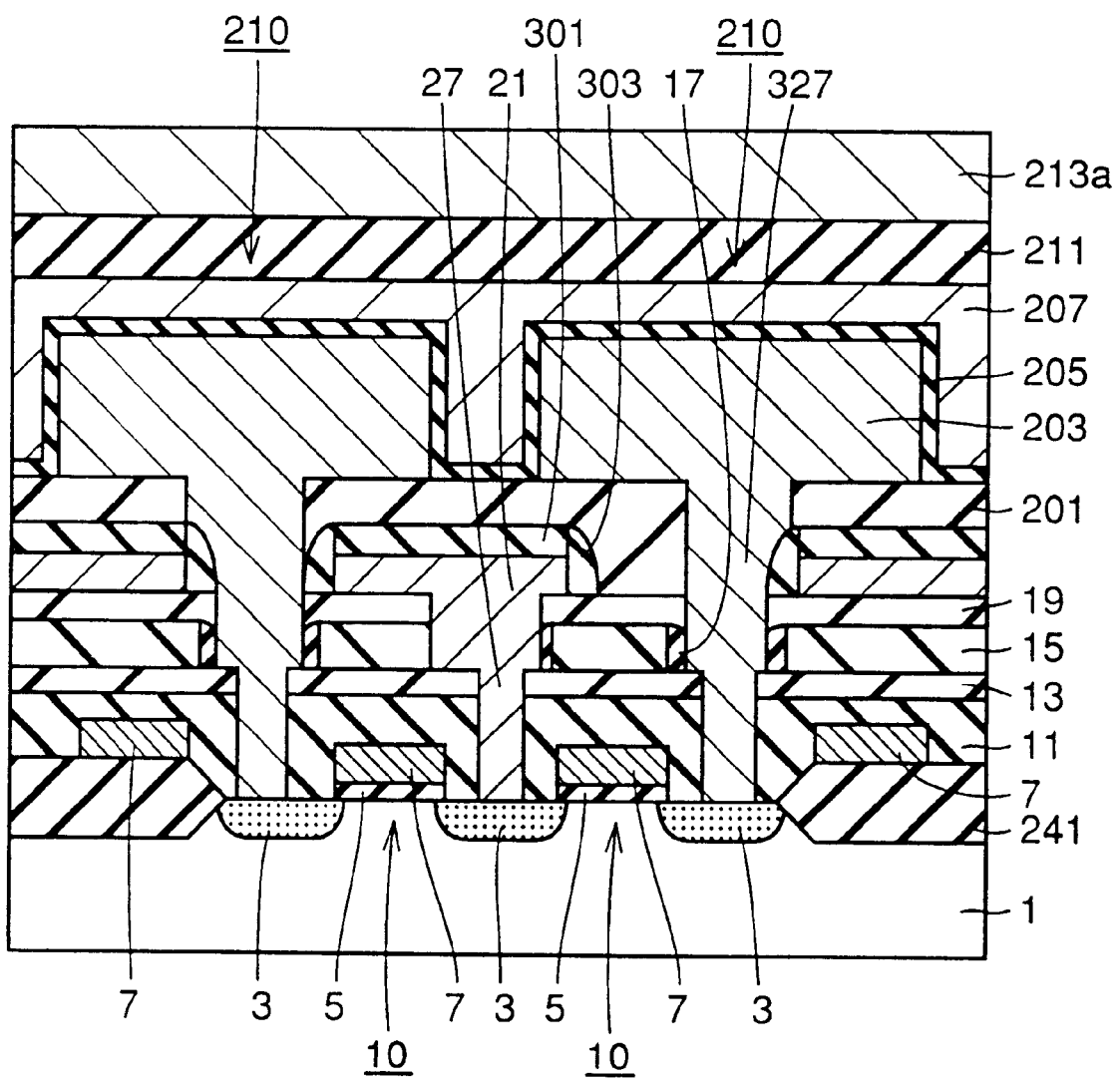

Referring to FIG. 48, insulating layer 211 is formed on cell plate 207, and on insulating layer 211, an aluminum layer 213a is formed.

Figure 49:
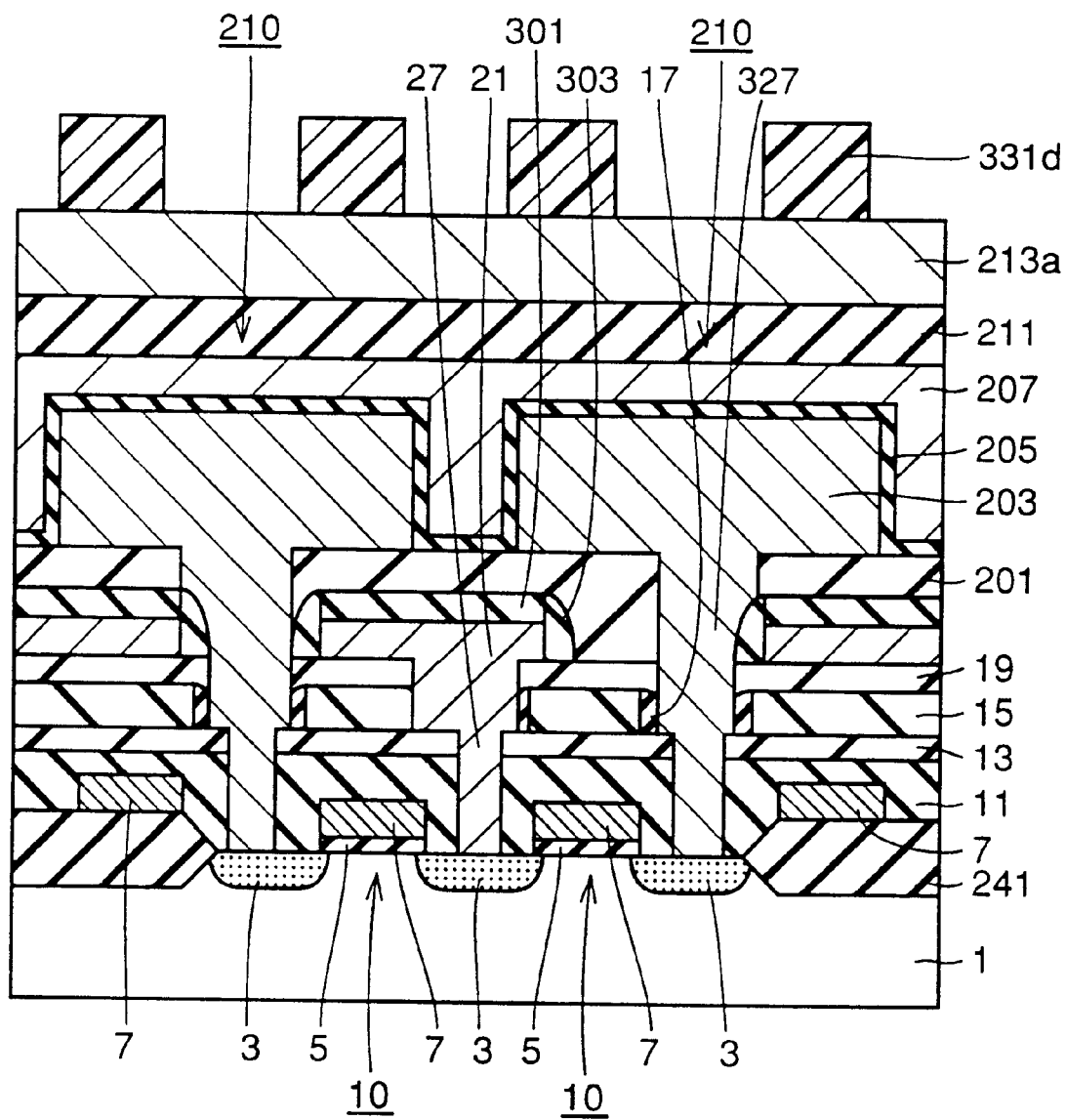

Referring to FIG. 49, a resist pattern 331d having a desired shape is formed on aluminum layer 213a. By using resist pattern 331d as a mask, aluminum layer 213a is etched. Thereafter, resist pattern 331d is removed.

Figure 50:
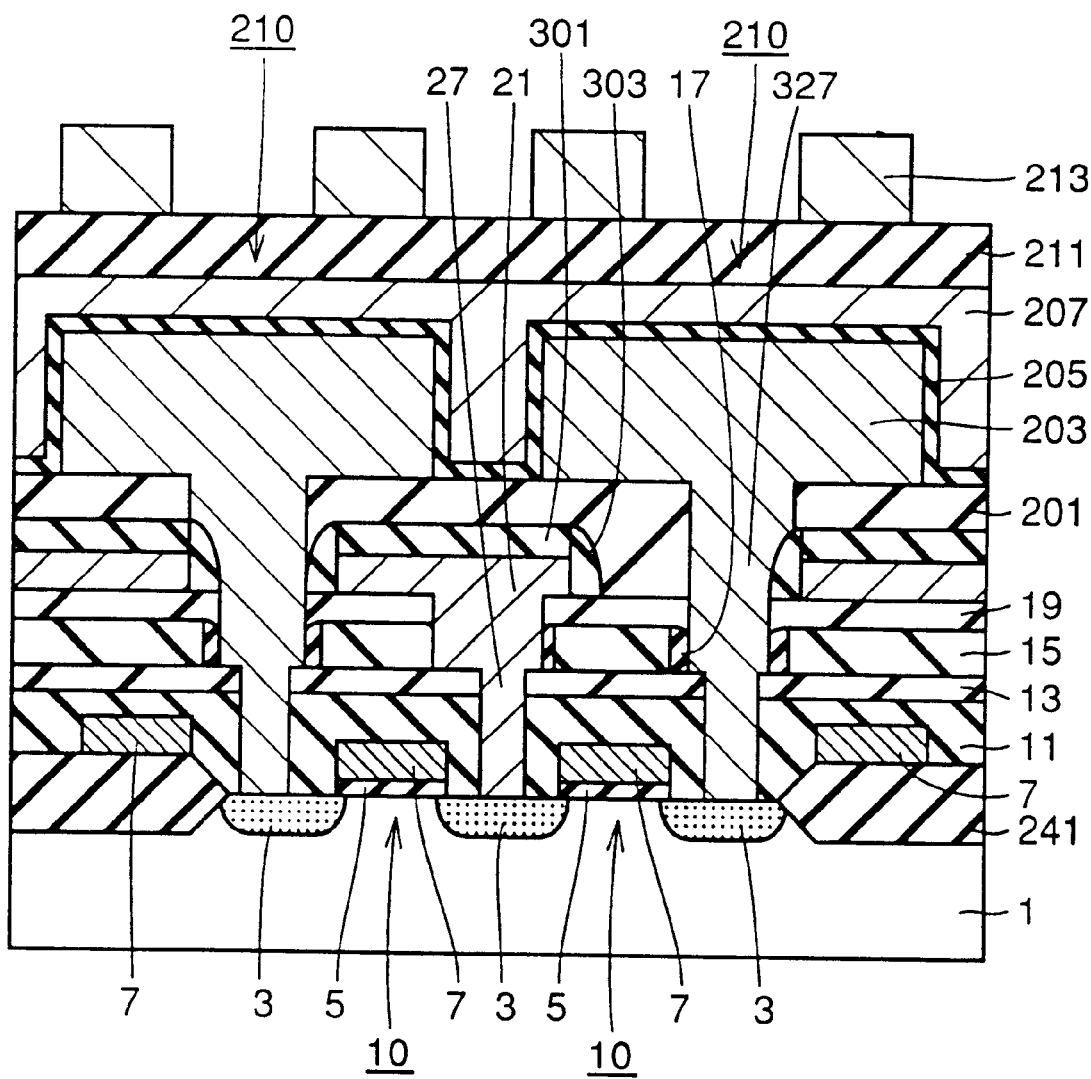
Figure 51:
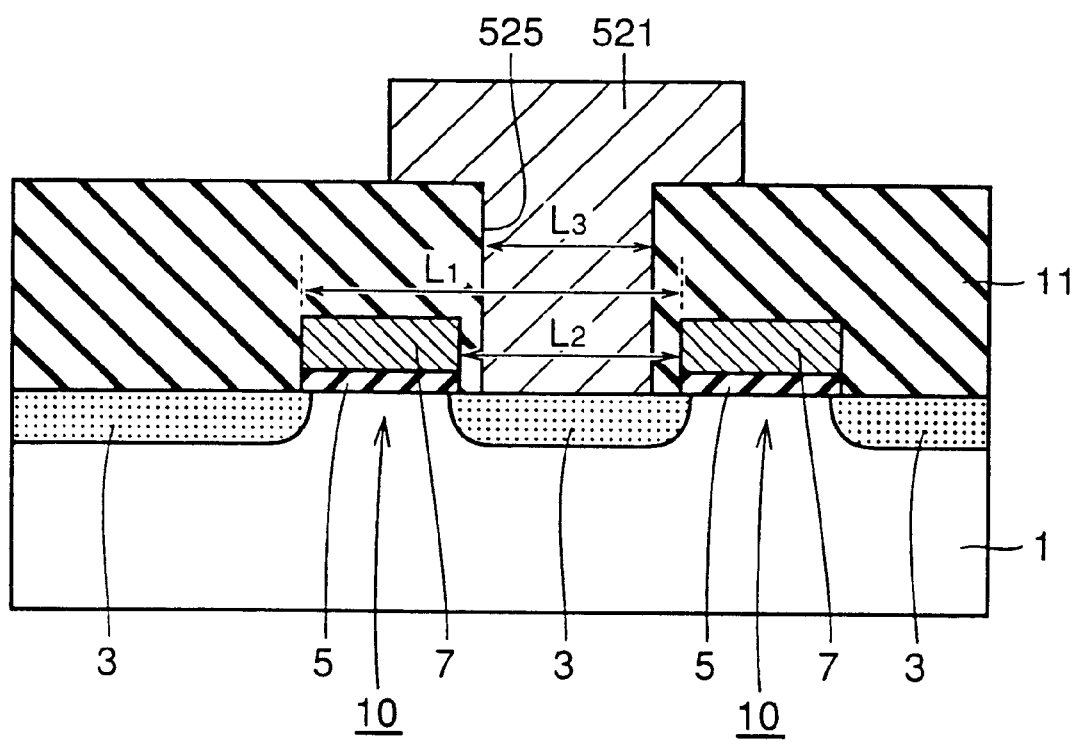
FIG. 51 is a cross sectional view schematically showing a structure of a semiconductor device in accordance with a first prior art example.
Figure 52:
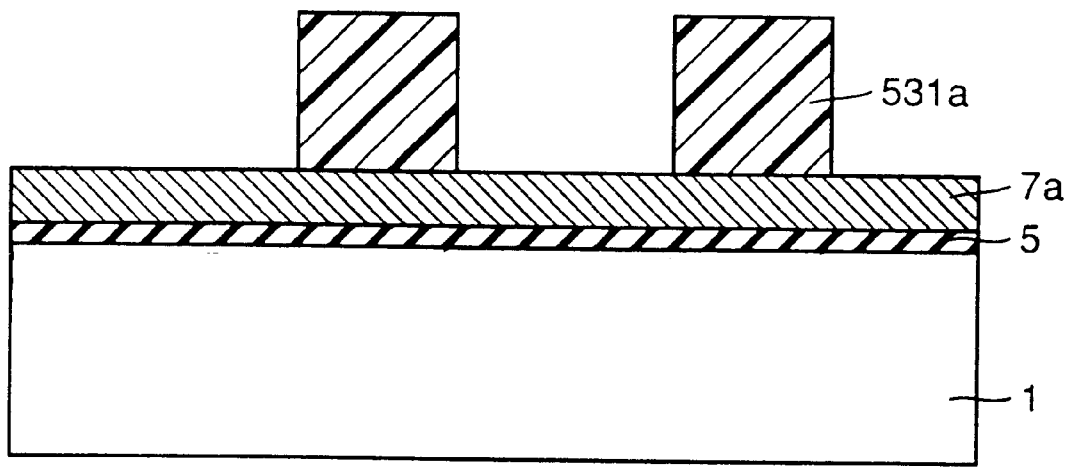
FIGS. 52 to 56 are schematic cross sectional views showing, in order, the steps of manufacturing the semiconductor device in accordance with the first prior art example.
Figure 53:
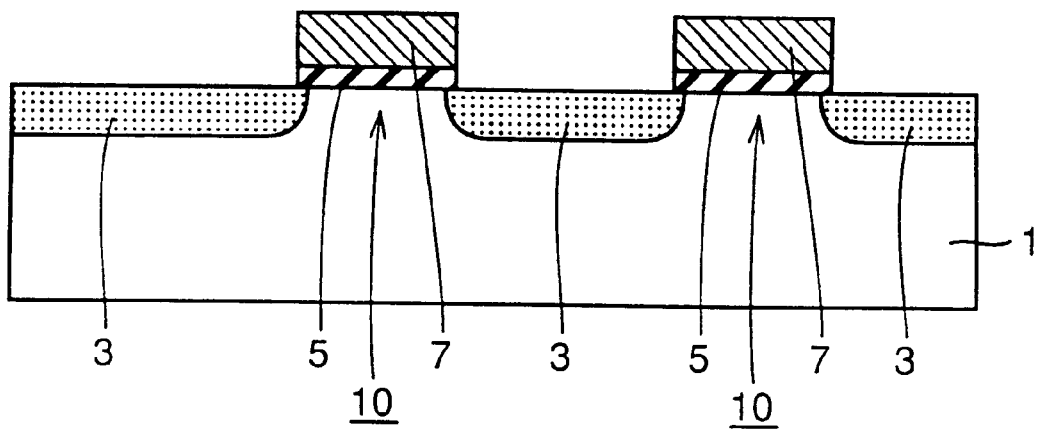
Figure 54:
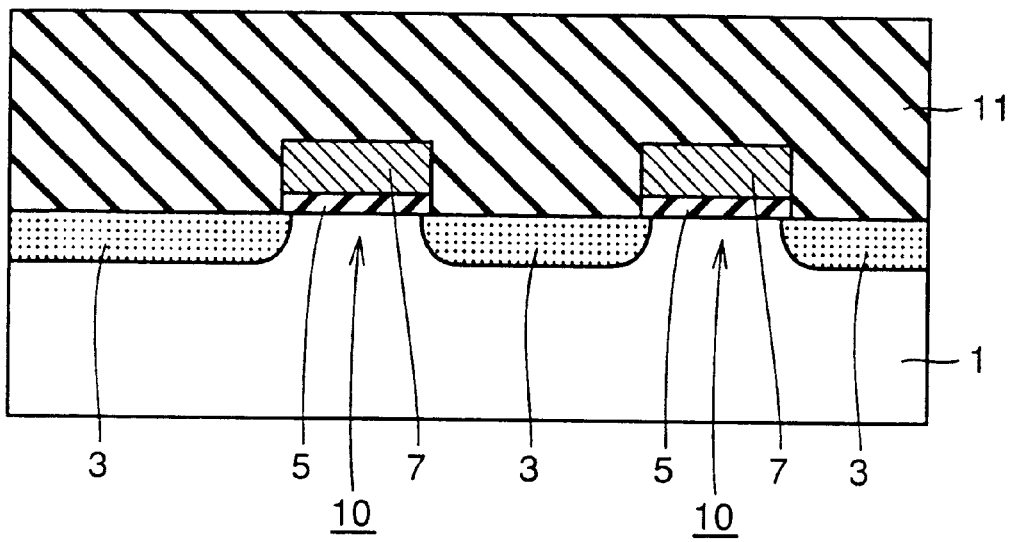
Figure 55:
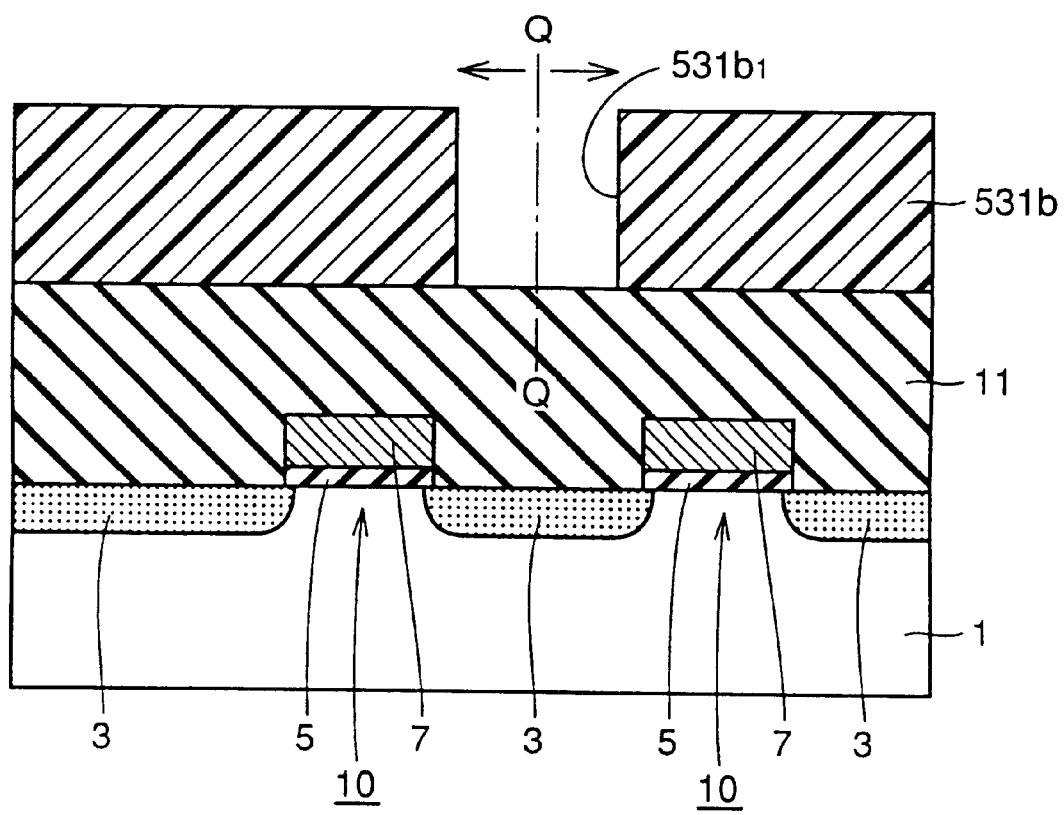
Figure 56:
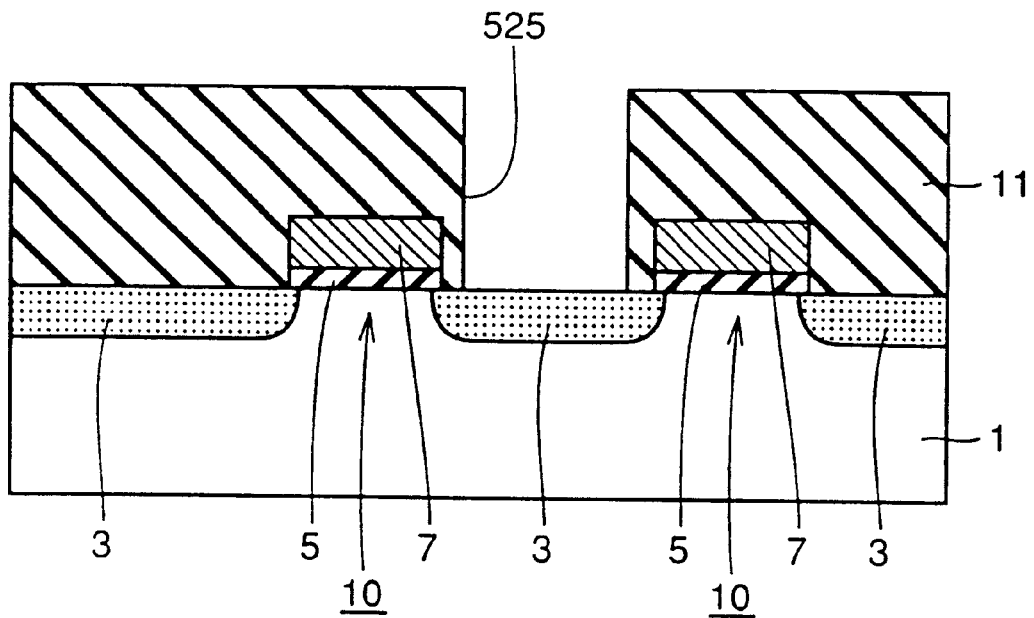
Figure 57:
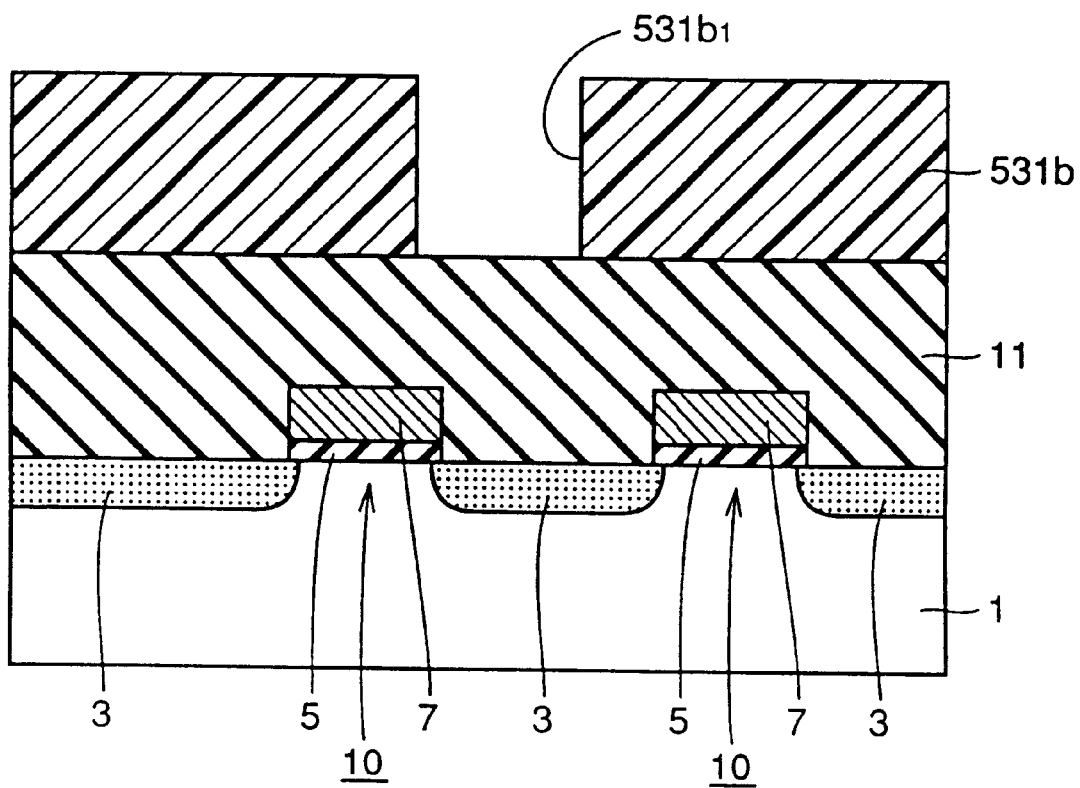
FIGS. 57 to 59 are illustrations showing how the gate electrode layer is short-circuited with the conductive layer.
Figure 58:
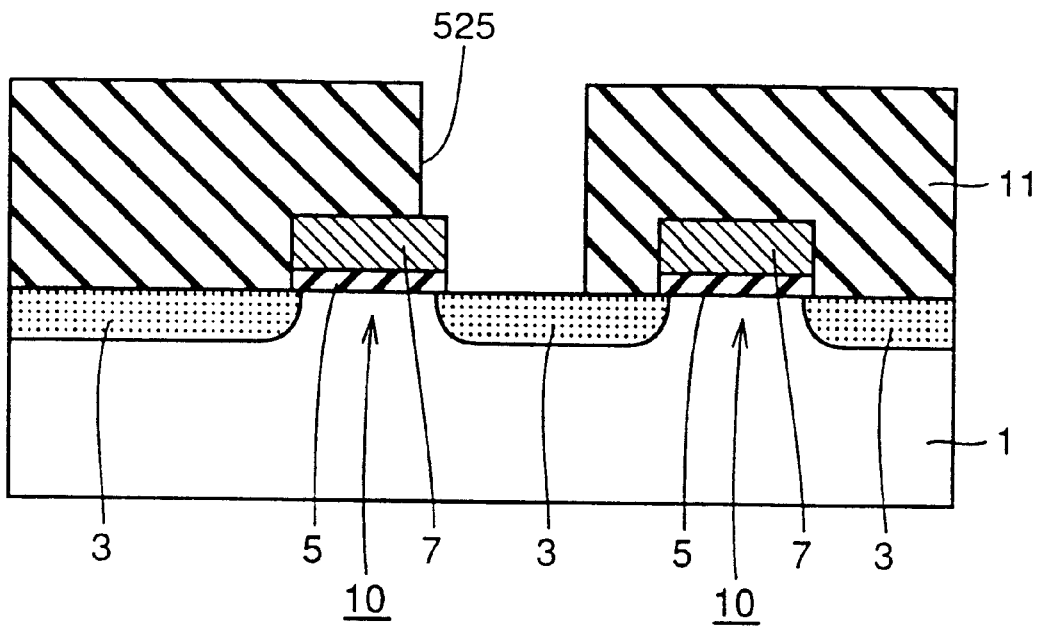
Figure 59:
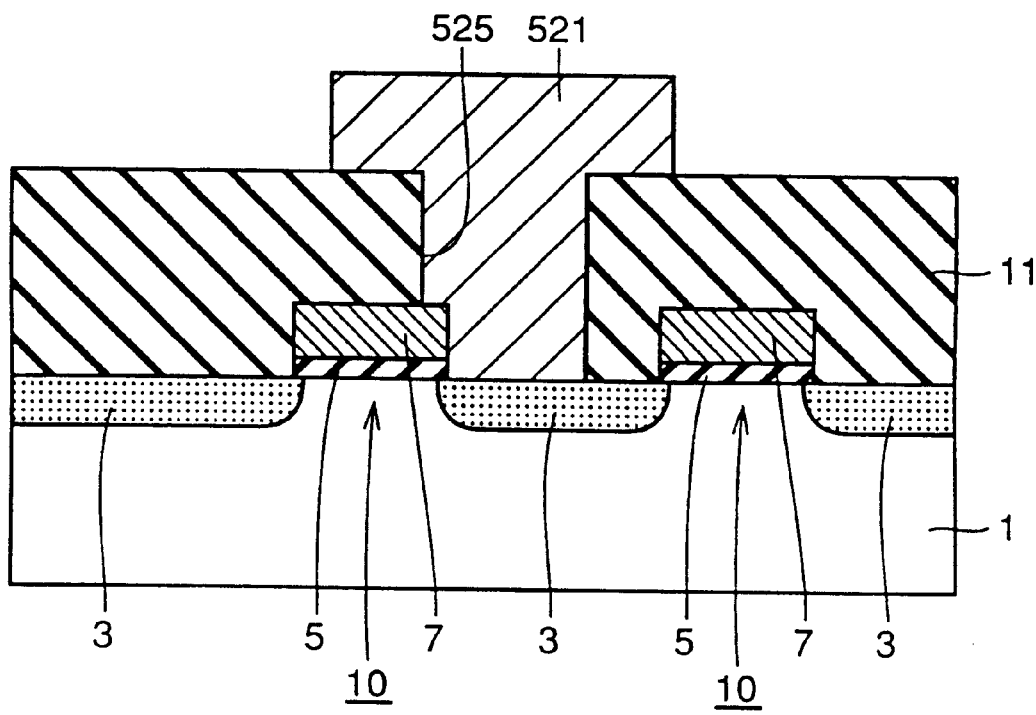
Figure 60:
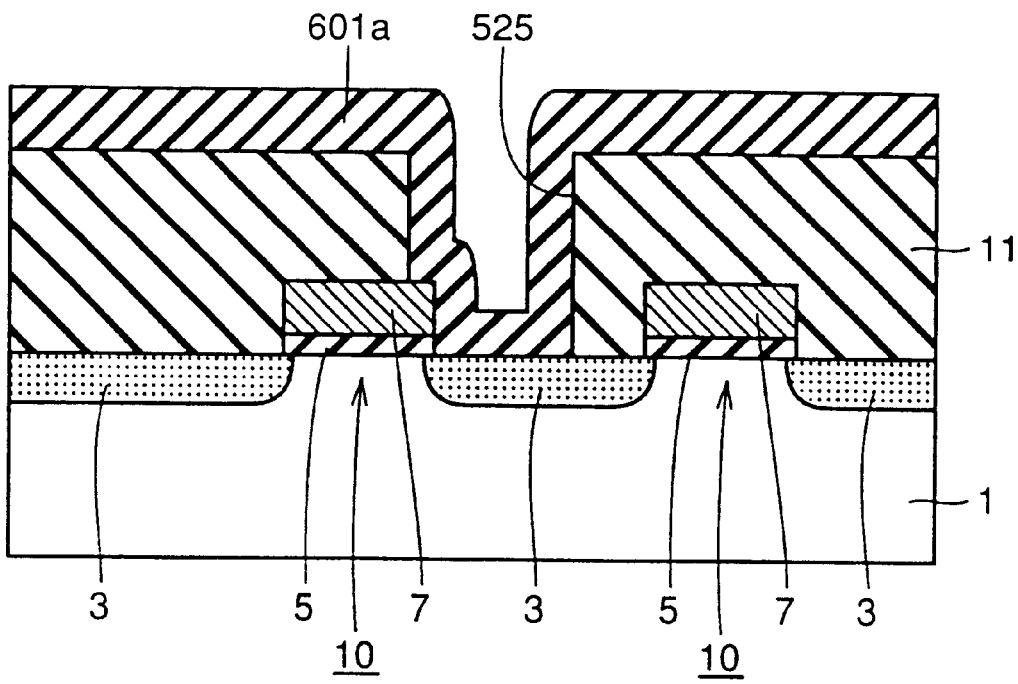
FIGS. 60 and 61 are illustrations of the method of manufacturing for preventing short-circuit between conductive layers.
Figure 61:
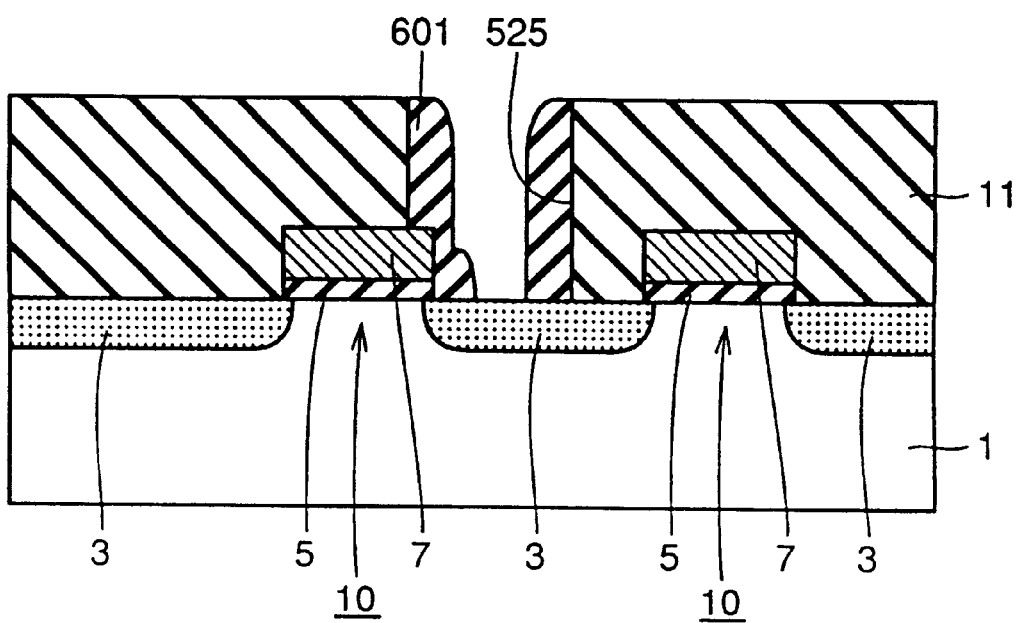
Figure 62:
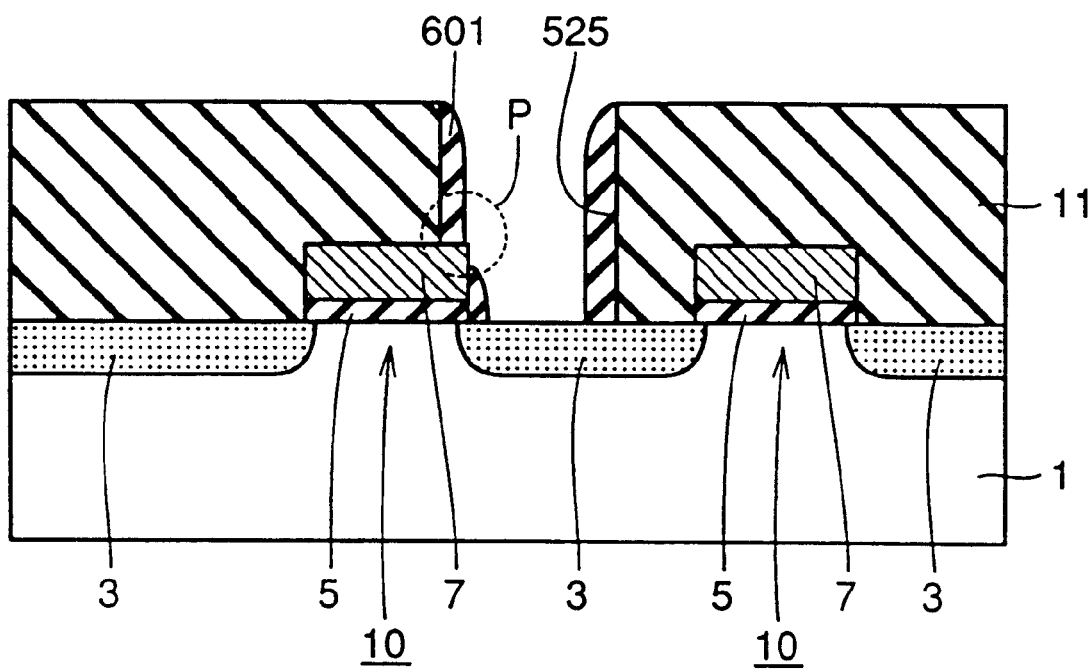
FIG. 62 is a schematic cross sectional view showing the gate electrode layer exposed in the method of manufacturing for preventing short-circuit between conductive layers.
Figure 63:
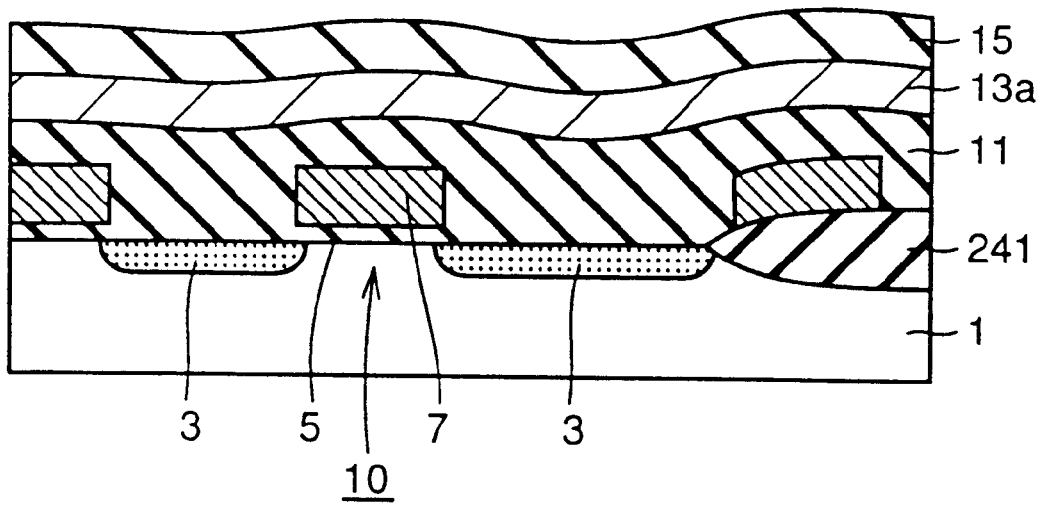
FIGS. 63 to 69 are schematic cross sections showing, in order, the steps of manufacturing the semiconductor device in accordance with a second prior art example.
Figure 64:
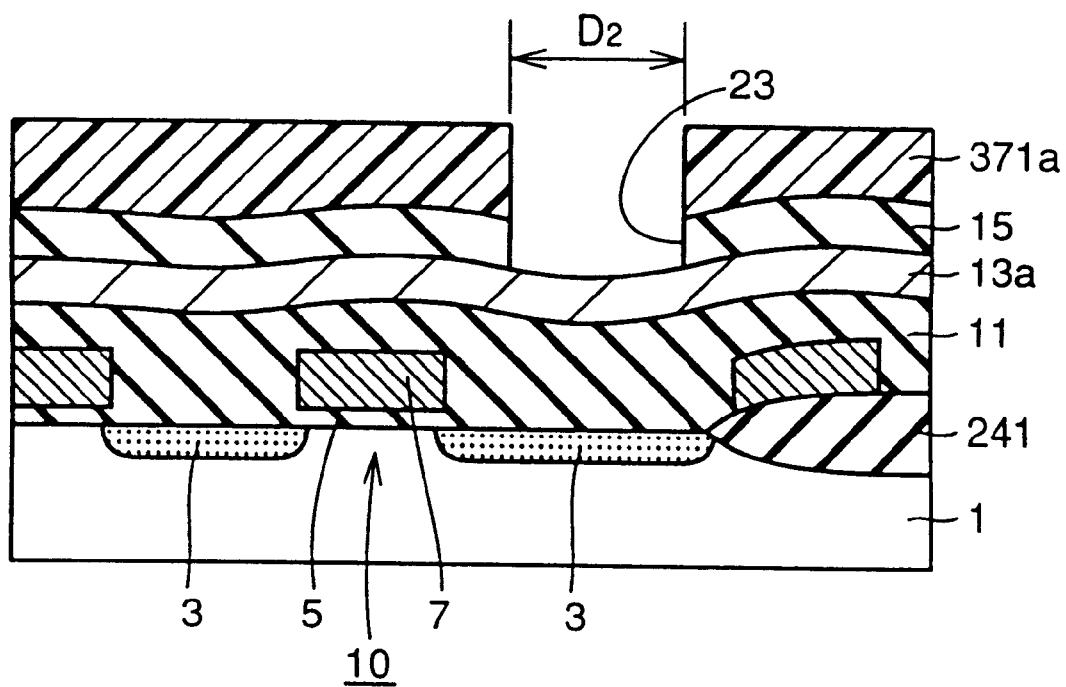
Figure 65:
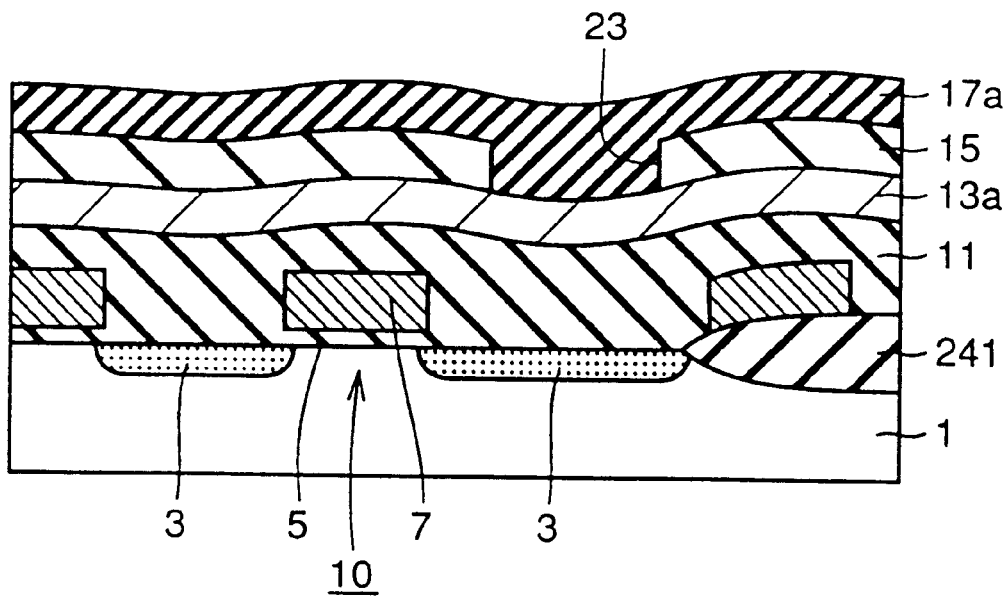
Figure 66:
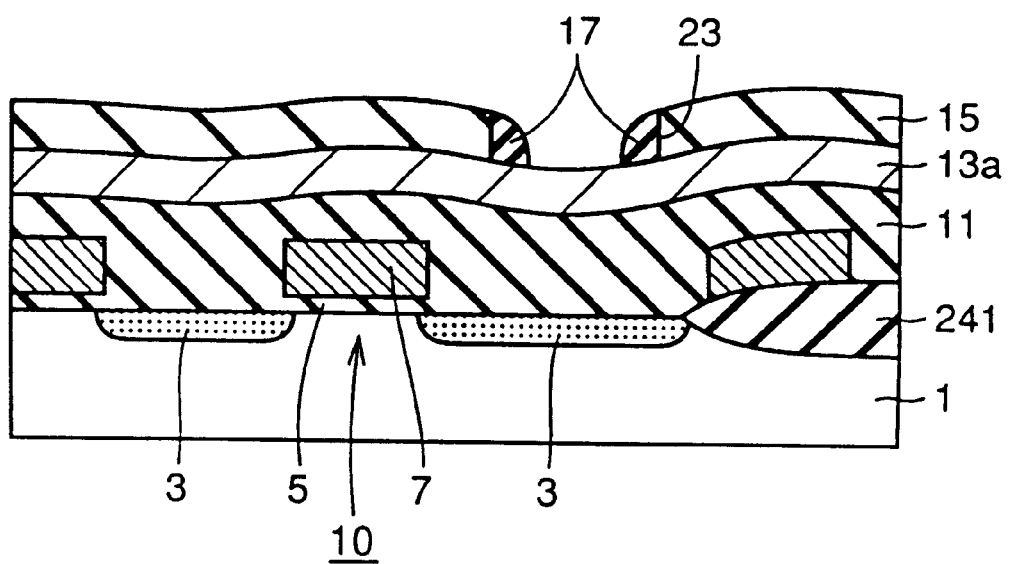
Figure 67:
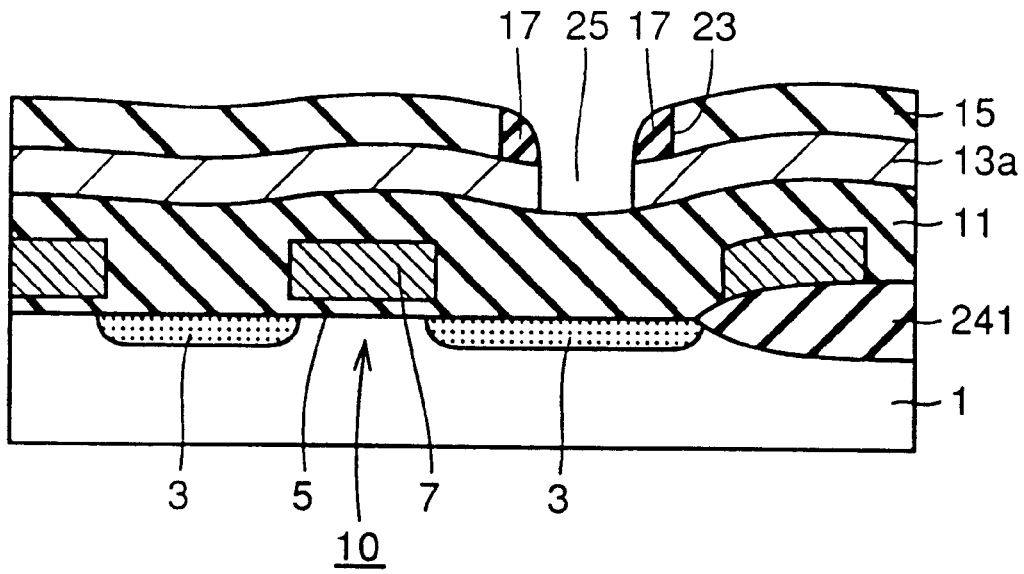
Figure 68:
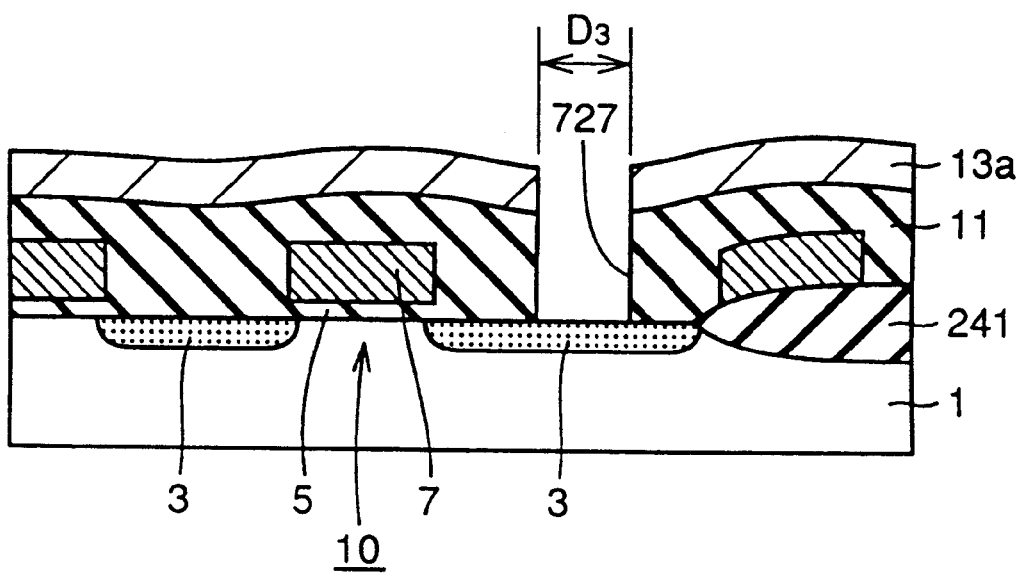
Figure 69:
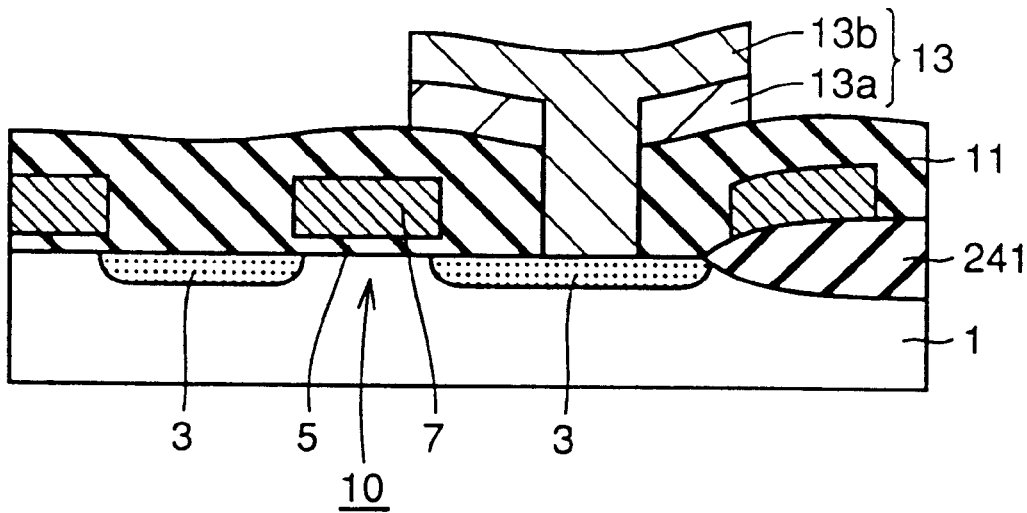
Figure 70:
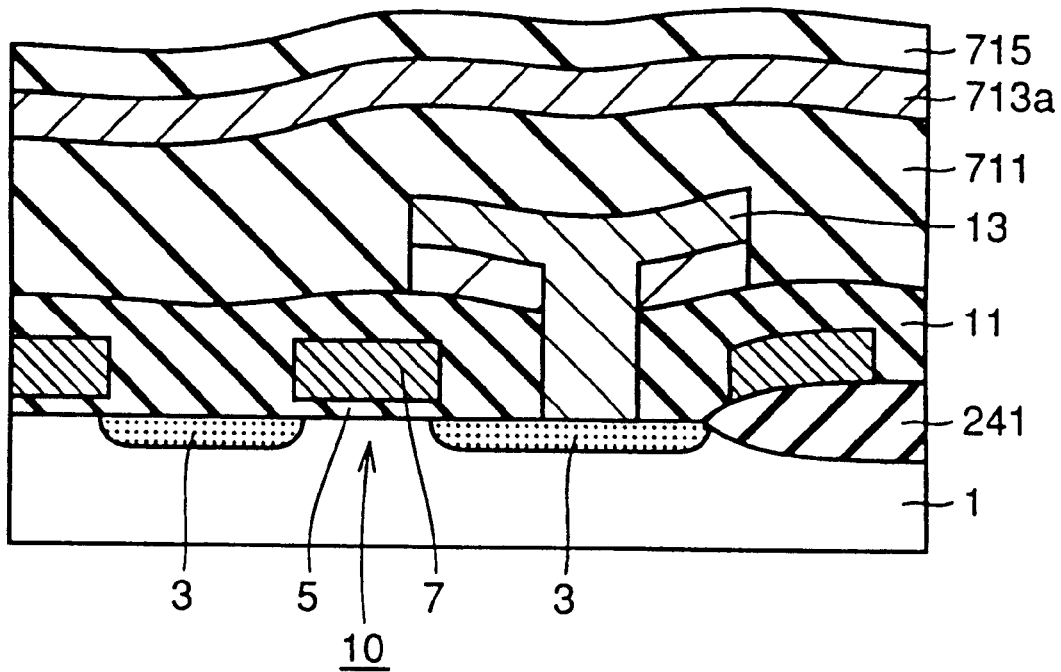
FIGS. 70 to 74 show steps for forming a storage node on a bit line.
Figure 71:
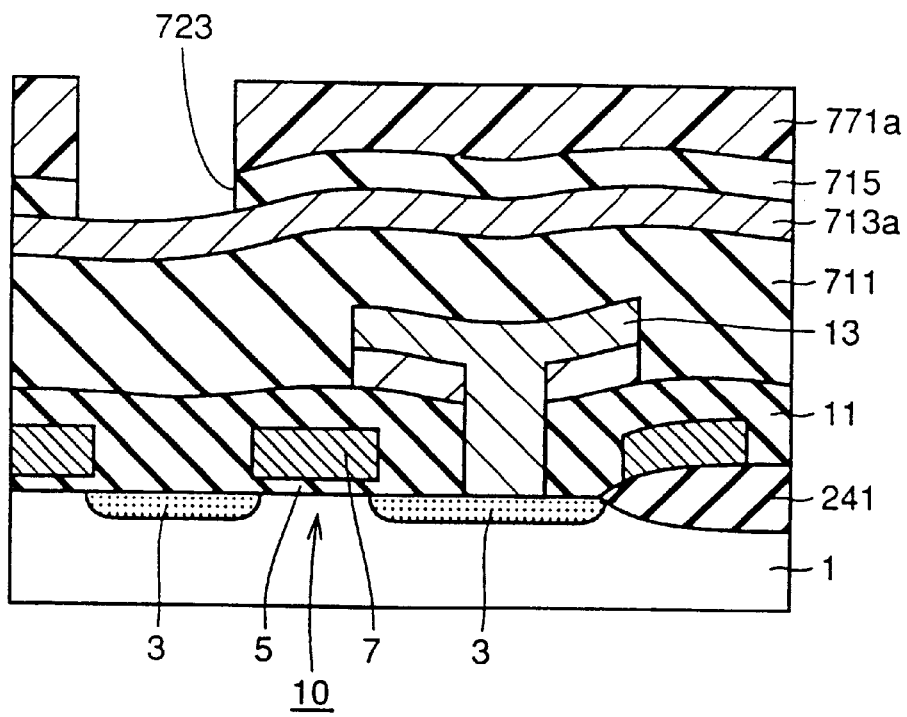
Figure 72:
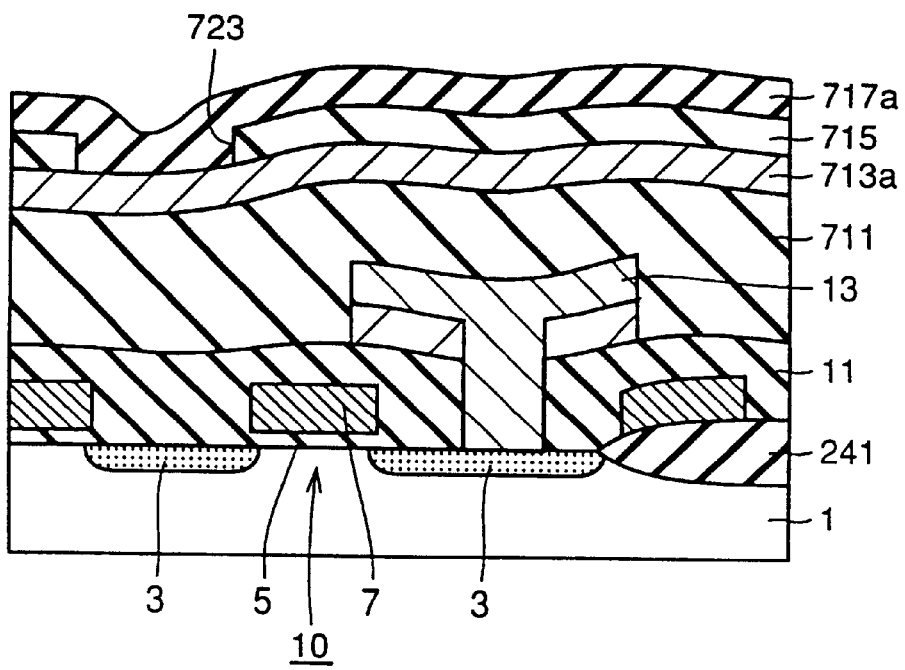
Figure 73:
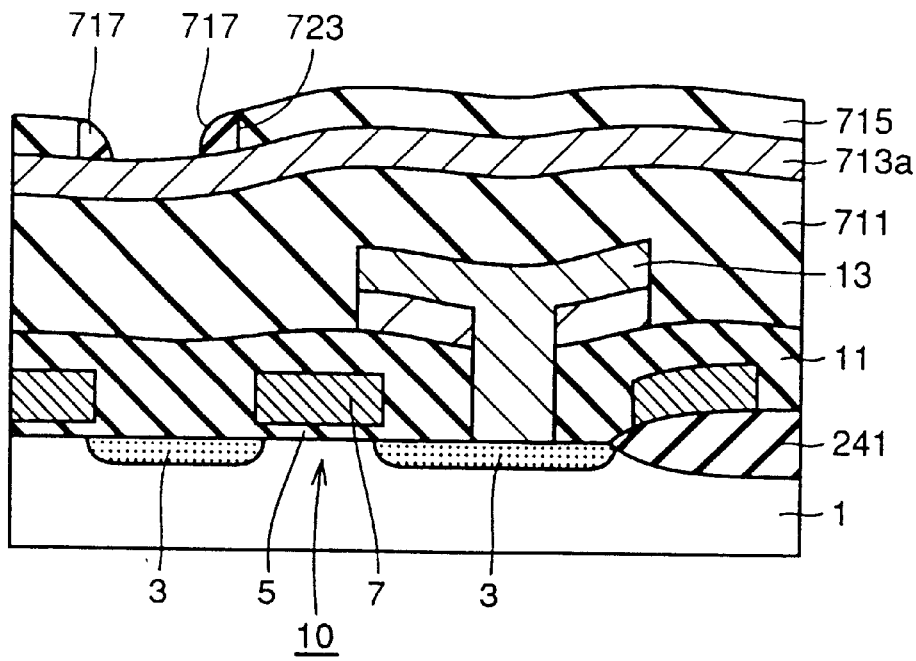
Figure 74:
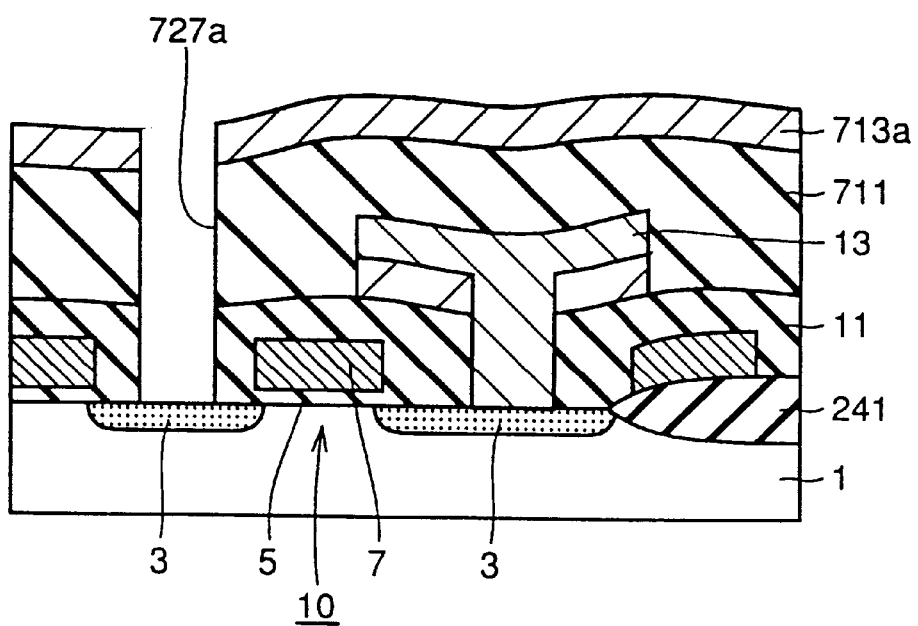

Referring to FIG. 50, by this etching, aluminum interconnection layer 213 having a desired shape is formed. Thereafter, passivation film is formed to cover aluminum interconnection layer 213, and thus semiconductor device shown in FIG. 37 is completed.

In the present embodiment, contact hole 327 is formed in the step shown in FIGS. 42 and 43. If bit line 21 should be exposed from the sidewall of contact hole 327, the storage node and bit line 21, which are to be formed subsequently, would be short-circuited.

In order to prevent this short-circuit, in the third embodiment, there is provided a margin for the dimensional error and registration error of the mask between bit line 21 and contact hole.

By contrast, in the present embodiment, insulating layer 301 and sidewall insulating layer 303 are formed to cover bit line 21. Insulating layer 301 and sidewall insulating layer 303 are formed, for example, of $Si_3N_4$, which have different etch rate than other insulating layers formed of $SiO_2$.

Therefore, during etching for forming contact hole 327, insulating layer 301 and sidewall insulating layer 303 are hardly etched. Namely, exposure of bit line 21 from the sidewall of contact hole 327 can be prevented. Therefore, electric short-circuit between bit line 21 and storage node can be prevented without the necessity to provide design margin.

The dimensions of each portion in the above described first to fourth embodiments are based on the rule device level of 0.25 μm. Therefore, dimension of each portion is not limited to the above described dimension and it may be arbitrarily set with respect to various rule device level.

In the above described first to fourth embodiments, the source/drain region 3 of the MOS transistor 10 has a single drain structure. However, it may have LDD (Lightly Doped Drain) structure or DDD (Double Diffused Drain) structure.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a semiconductor substrate having a main surface;
   a conductive region formed at the main surface of said semiconductor substrate;
   a first insulating layer formed on the main surface of said semiconductor substrate;
   a second insulating layer formed of a material having an etch rate different from that of said first insulating layer, formed on said first insulating layer;
   a third insulating layer formed of a material having approximately same etch rate as said first insulating layer, on said second insulating layer; and
   a fourth insulating layer formed of a material having approximately same etch rate as said first insulating layer, formed on said third insulating layer; wherein
   a hole opened by anisotropic etching is formed in said first, second, third and fourth insulating layers reaching said conductive region formed at the main surface of said semiconductor substrate through these insulating layers,
   said hole having a first opening diameter smaller than a minimum possible dimension formable by conventional photolithography in a portion formed in said first and second insulating layers and having a second opening diameter larger than said first opening diameter and substantially equal to a minimum possible dimension formable by conventional photolithography in a portion formed in said fourth insulating layer the second opening diameter being approximately constant in its depth direction;
   said device further comprising:
      a conductive layer electrically connected to said conductive region through said hole and extending over said fourth insulating layer.

2. The semiconductor device according to claim 1, wherein
   said fourth insulating layer has a planarized surface.

3. The semiconductor device according to claim 1, further comprising
   a sidewall insulating layer formed on a sidewall of said third insulating layer to define said second opening diameter of said hole.

4. The semiconductor device according to claim 3, wherein
   said sidewall insulating layer is formed of a material having an etch rate different from that of said first insulating layer.

5. The semiconductor device according to claim 1, further comprising
   a fifth insulating layer formed to cover an upper surface of said conductive layer and a second sidewall insulating layer formed on a sidewall of said fifth insulating layer and said conductive layer, wherein
   said fifth insulating layer and said sidewall insulating layer are formed of a material having an etch rate different from that of said first insulating layer.

6. The semiconductor device according to claim 1, wherein
   a memory cell of a DRAM having an MOS transistor and a capacitor is formed on said semiconductor substrate,
   said conductive region is a source/drain region of said MOS transistor, and
   said conductive layers is either a bit line or a storage node of said capacitor.

7. The semiconductor device according to claim 1, wherein
   said conductive region has first and second conductive regions formed spaced from each other;
   said second conductive layer is electrically connected to said first conductive region;
   said device further comprising
      a fifth insulating layer formed on said fourth insulating layer to cover said conductive layer and having approximately same etch rate as said first insulating layer; wherein
      a second hole is formed in said first, second, third, fourth and fifth insulating layers reaching said second conductive region formed at the main surface of said semiconductor substrate through these insulating layers,
      said second hole having a third opening diameter smaller than a minimum possible dimension formable by a conventional photolithography at a portion formed in said first and second insulating layers and having a fourth opening diameter larger than said third opening diameter at a portion formed in said fourth and fifth insulating layers;
   said device further comprising
      a second conductive layer electrically connected to said second conductive regions through said second hole.

8. The semiconductor device according to claim 7, further comprising:
   a sixth insulating layer formed on said fifth insulating layer and formed of a material having an etch rate different from said first insulating layer;
   a seventh insulating layer formed on said sixth insulating layer and formed of a material having approximately same etch rate as said first insulating layer; and
   an eighth insulating layer formed on said seventh insulating layer formed of a material having approximately same etch rate as said first insulating layer; wherein
   said second hole pierces through said sixth, seventh and eighth insulating layers and has said fourth opening diameter at a portion formed in said sixth insulating layer and has a fifth opening diameter larger than said fourth opening diameter at a portion formed in said eighth insulating layer; and said second conductive layer is formed to extend over said eighth insulating layer.

9. The semiconductor device according to claim 8, further comprising a second sidewall insulating layer formed on a sidewall of said seventh insulating layer to define said fifth opening diameter of said second hole.

* * * * *